(12) United States Patent
Liu et al.

(10) Patent No.: US 12,324,218 B2
(45) Date of Patent: Jun. 3, 2025

(54) SEMICONDUCTOR DEVICES WITH AIR GAPS AND THE METHOD THEREOF

(71) Applicant: Taiwan Semiconductor Manufacturing Company, Ltd., Hsin-Chu (TW)

(72) Inventors: Ko-Cheng Liu, Hsinchu (TW); Ming-Lung Cheng, Kaohsiung County (TW); Chang-Miao Liu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 466 days.

(21) Appl. No.: 17/380,422

(22) Filed: Jul. 20, 2021

(65) Prior Publication Data
US 2022/0328647 A1 Oct. 13, 2022

Related U.S. Application Data

(60) Provisional application No. 63/172,337, filed on Apr. 8, 2021.

(51) Int. Cl.
| | |
|---|---|
| *H10D 64/66* | (2025.01) |
| *H01L 21/02* | (2006.01) |
| *H01L 21/28* | (2025.01) |
| *H01L 21/764* | (2006.01) |
| *H10D 30/01* | (2025.01) |
| *H10D 30/67* | (2025.01) |

(Continued)

(52) U.S. Cl.
CPC ....... *H10D 64/679* (2025.01); *H01L 21/0259* (2013.01); *H01L 21/28123* (2013.01); *H01L 21/764* (2013.01); *H10D 30/031* (2025.01);
*H10D 30/6713* (2025.01); *H10D 30/6735* (2025.01); *H10D 30/6739* (2025.01); *H10D 30/6757* (2025.01); *H10D 62/118* (2025.01); *H10D 64/017* (2025.01); *H10D 64/018* (2025.01)

(58) Field of Classification Search
CPC ........... H01L 29/66545; H01L 21/7682; H01L 29/4991; H01L 21/764; H01L 21/76264
See application file for complete search history.

(56) References Cited

U.S. PATENT DOCUMENTS

| | | | |
|---|---|---|---|
| 2014/0087559 A1* | 3/2014 | Shen | H01L 21/31144 257/E21.586 |
| 2017/0053912 A1* | 2/2017 | Ching | H01L 29/785 |
| 2017/0110554 A1* | 4/2017 | Tak | H01L 29/42392 |

(Continued)

*Primary Examiner* — Nicholas J Tobergte
*Assistant Examiner* — Adin Hrnjic
(74) *Attorney, Agent, or Firm* — HAYNES AND BOONE, LLP

(57) ABSTRACT

A method includes providing a semiconductor structure including a device fin protruding from a substrate, forming a dummy gate stack over the device fin, forming a first spacer over the device fin and the dummy gate stack, forming a second spacer over the first spacer, forming a dielectric feature adjacent to the second spacer, and replacing the dummy gate stack with a metal gate stack. Thereafter, the method removes the second spacer, thereby forming an air gap between the first spacer and the dielectric feature and wrapping around the device fin. The method then forms a sealing layer over the first spacer and the dielectric feature, thereby sealing the air gap.

20 Claims, 54 Drawing Sheets

(51) Int. Cl.
*H10D 62/10* (2025.01)
*H10D 64/01* (2025.01)

(56) References Cited

U.S. PATENT DOCUMENTS

| | | | |
|---|---|---|---|
| 2019/0157414 A1* | 5/2019 | Ando | H01L 21/02603 |
| 2019/0165185 A1* | 5/2019 | Chang | H01L 29/0847 |
| 2020/0044045 A1* | 2/2020 | Wang | H01L 29/66439 |
| 2020/0075423 A1* | 3/2020 | Kwok | H01L 21/823481 |
| 2020/0091144 A1* | 3/2020 | Guler | H01L 29/0673 |
| 2020/0219989 A1* | 7/2020 | Cheng | H01L 29/6656 |
| 2022/0415878 A1 | 12/2022 | Wu et al. | |
| 2023/0011752 A1 | 1/2023 | Wu et al. | |

\* cited by examiner

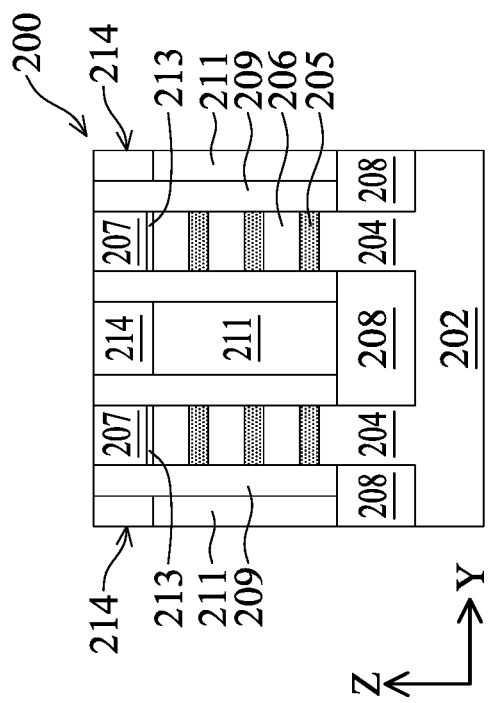
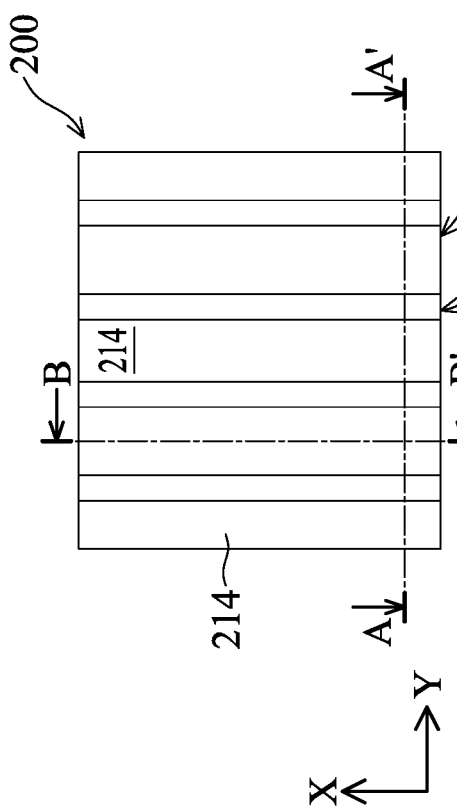
FIG. 9
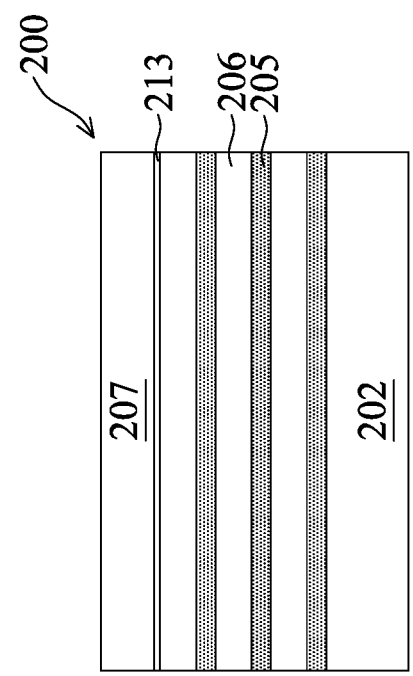
FIG. 9B
FIG. 9A

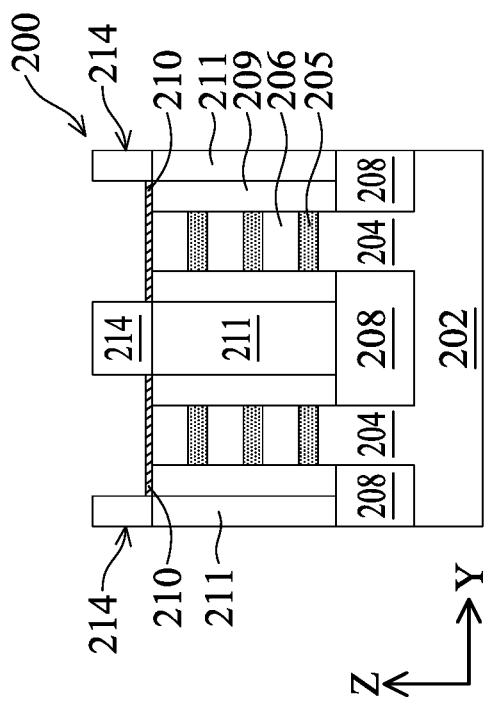
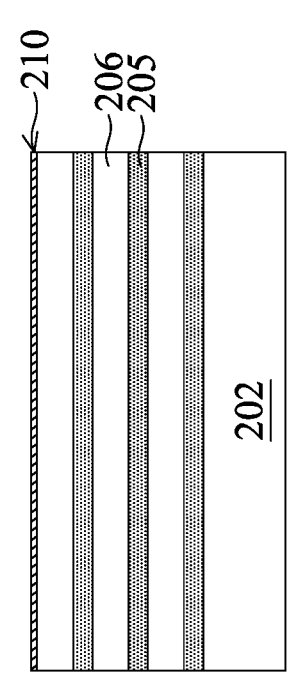
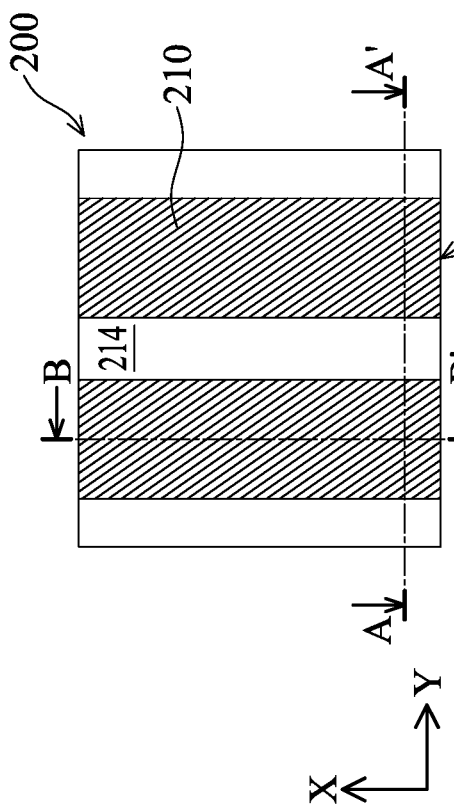
FIG. 10A
FIG. 10
FIG. 10B

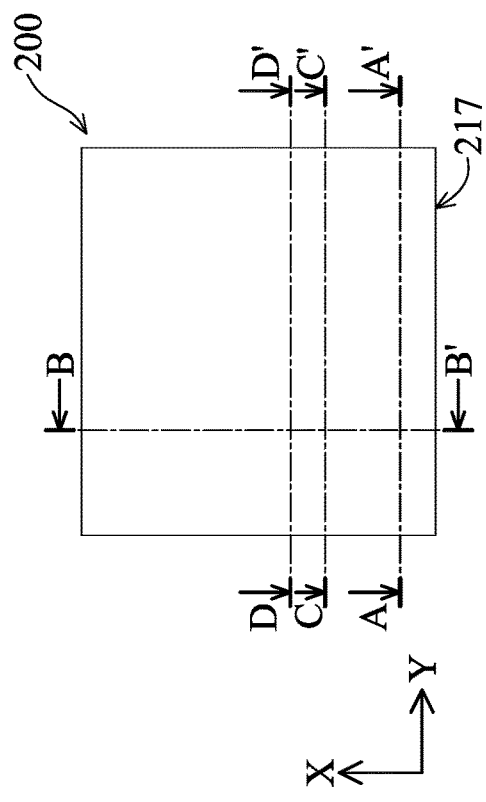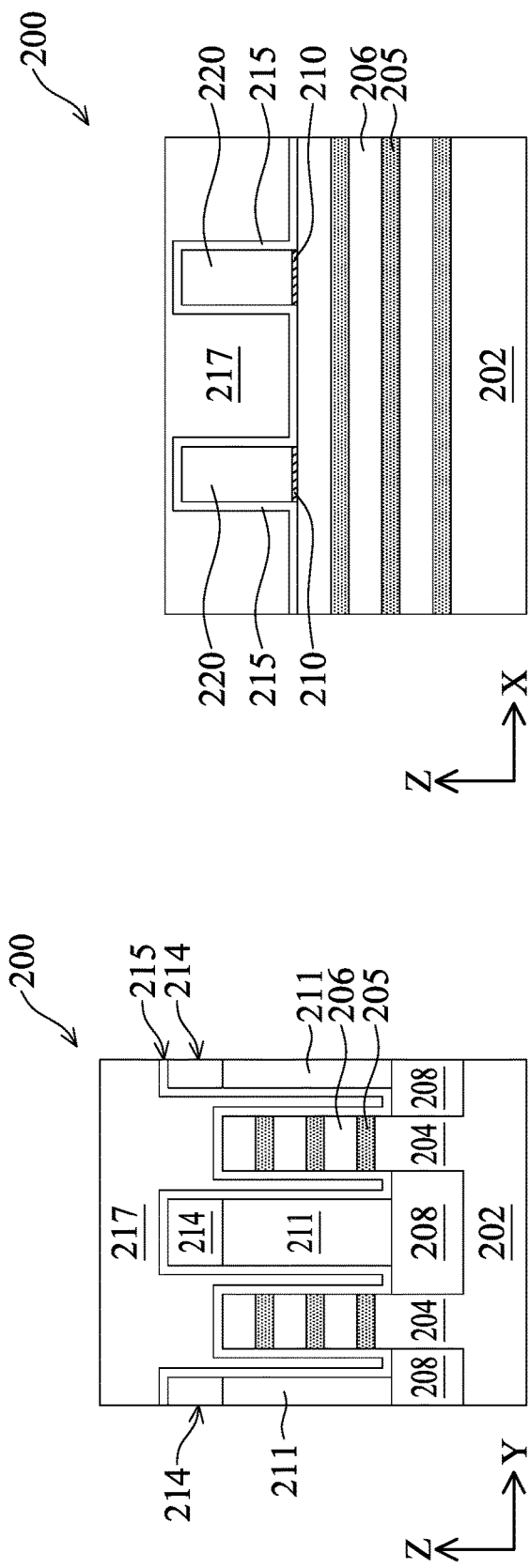
FIG. 14
FIG. 14A
FIG. 14B

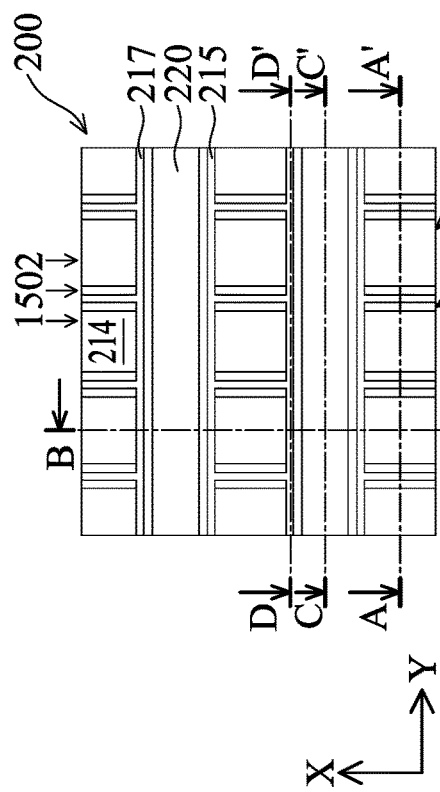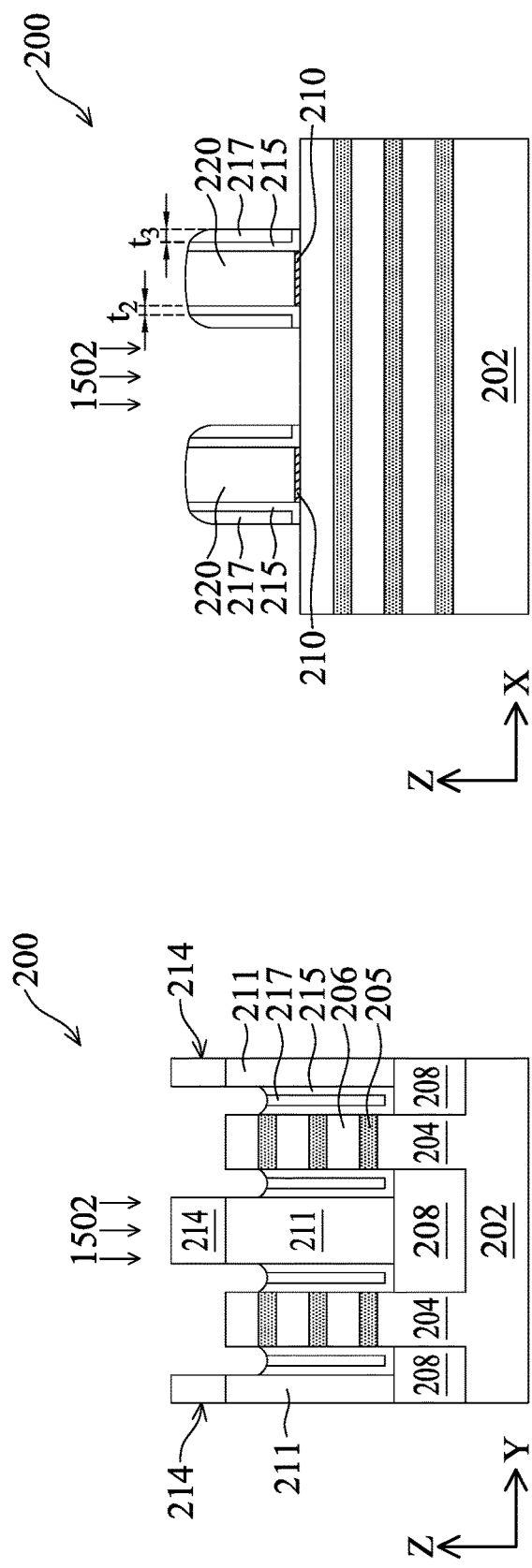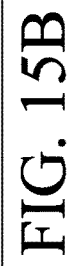
FIG. 15
FIG. 15A
FIG. 15B

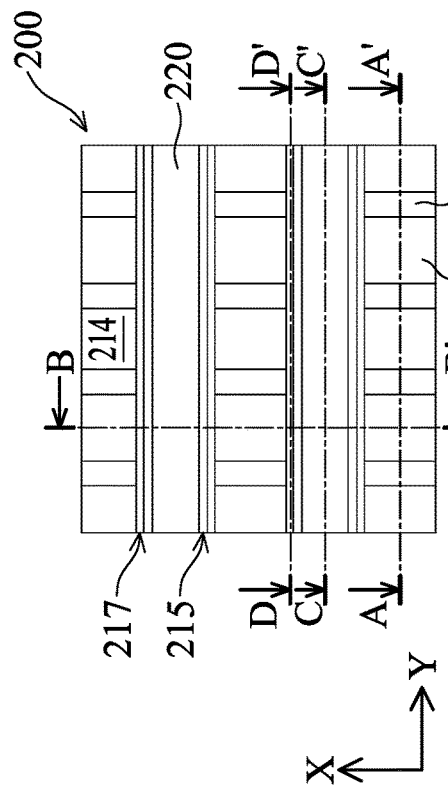
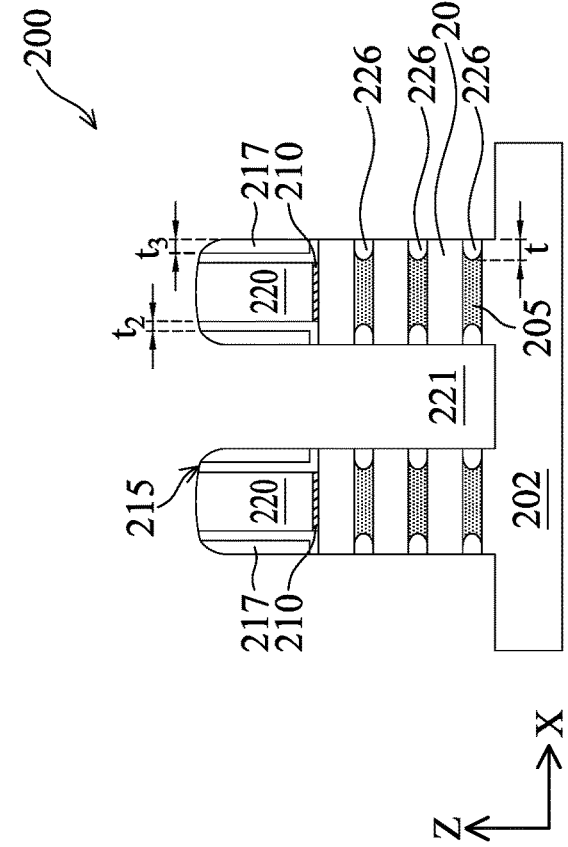
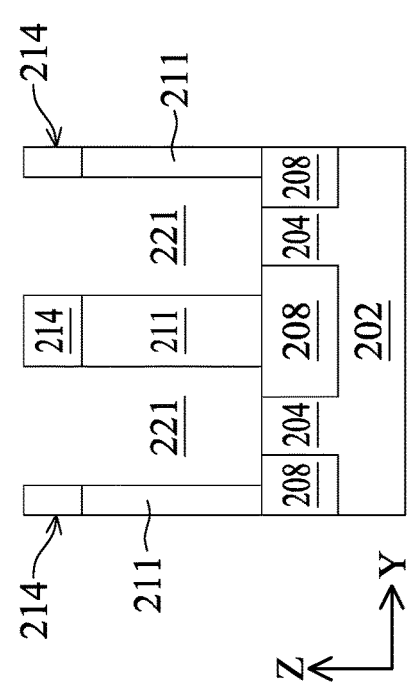
FIG. 16
FIG. 16A
FIG. 16B

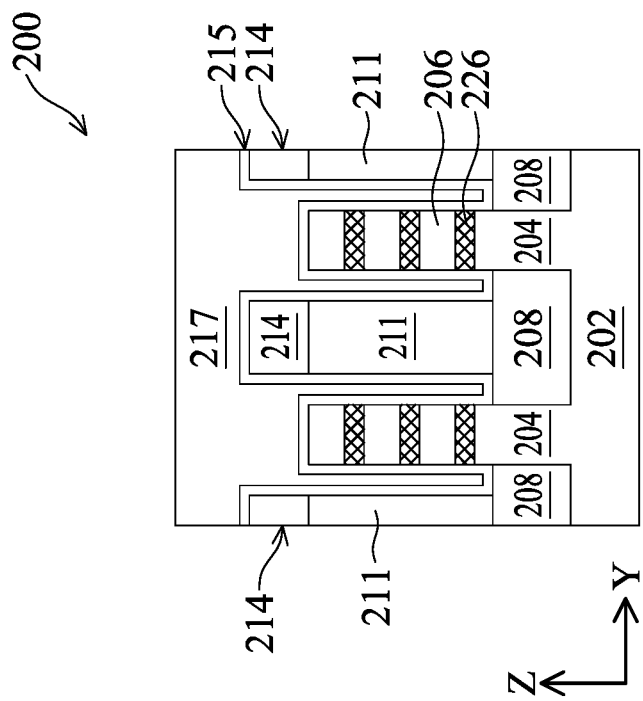
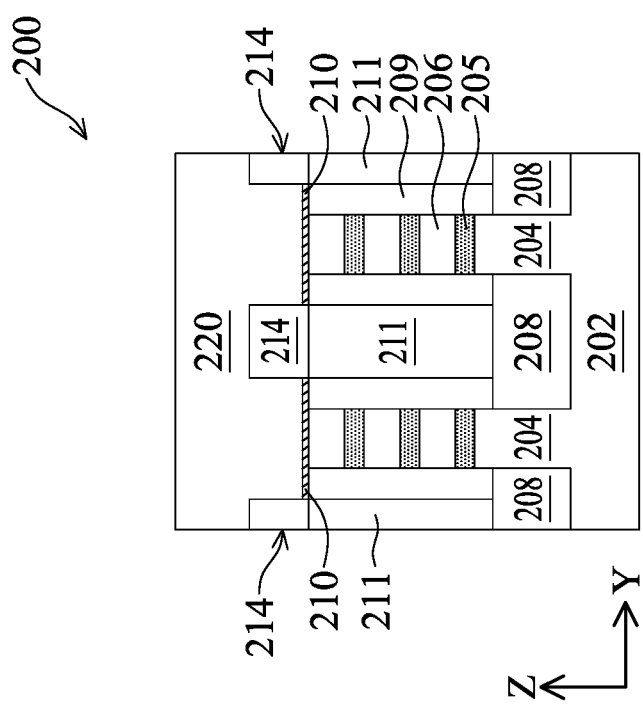

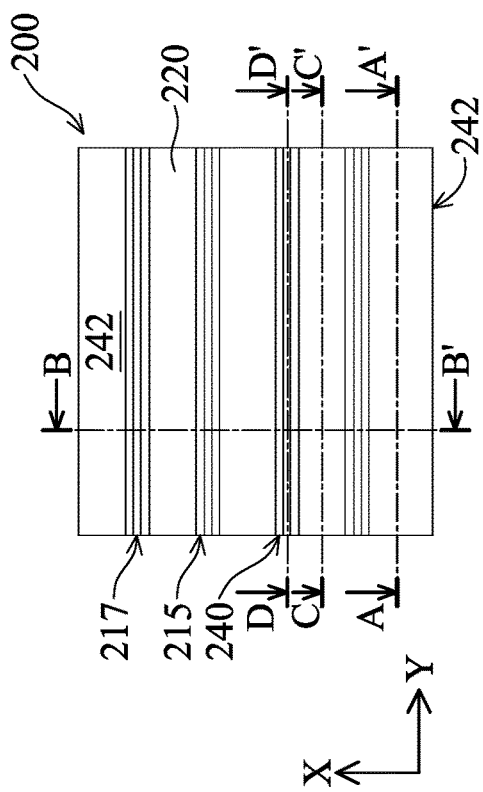
FIG. 18
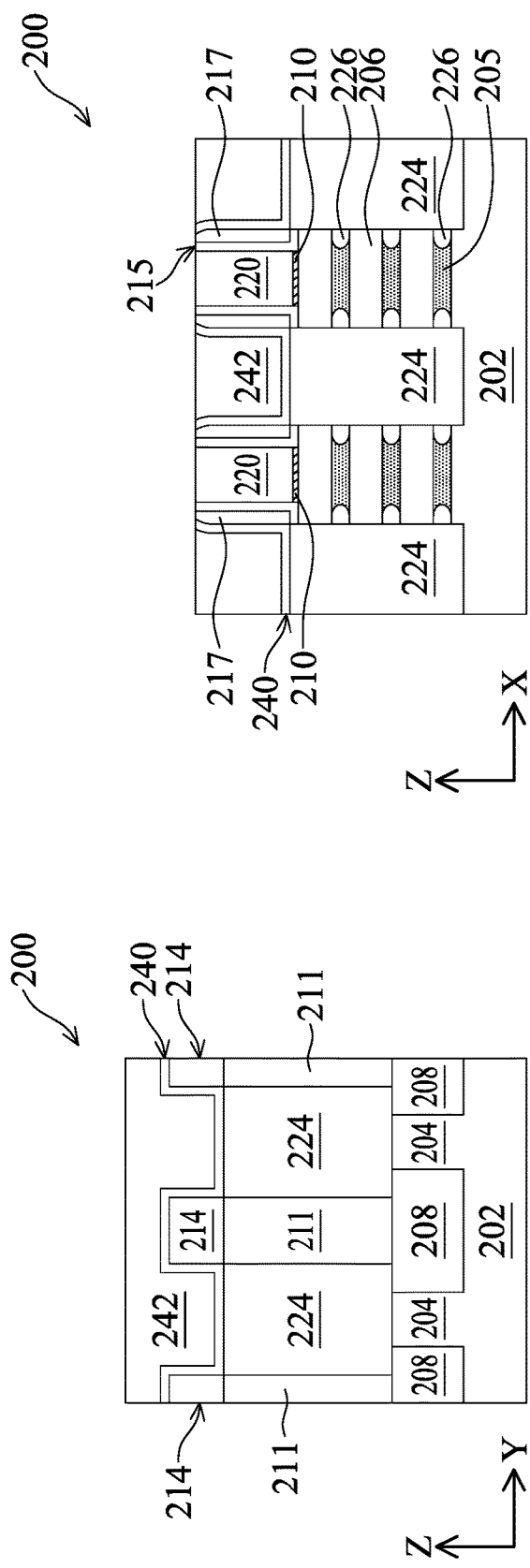
FIG. 18B
FIG. 18A

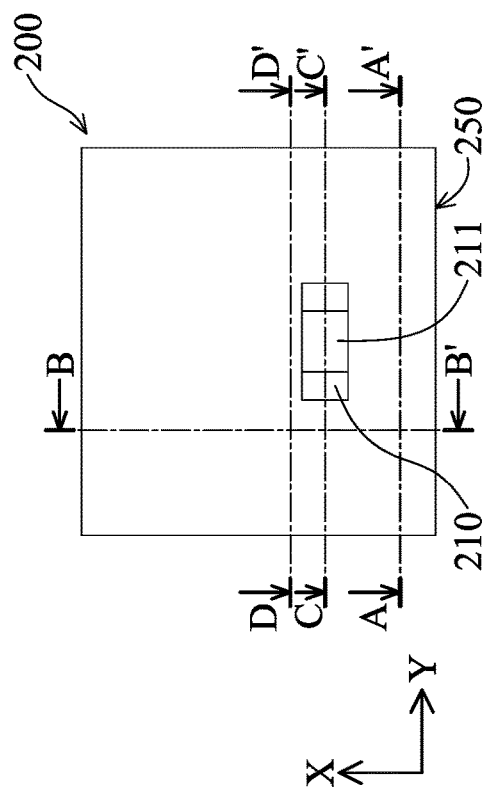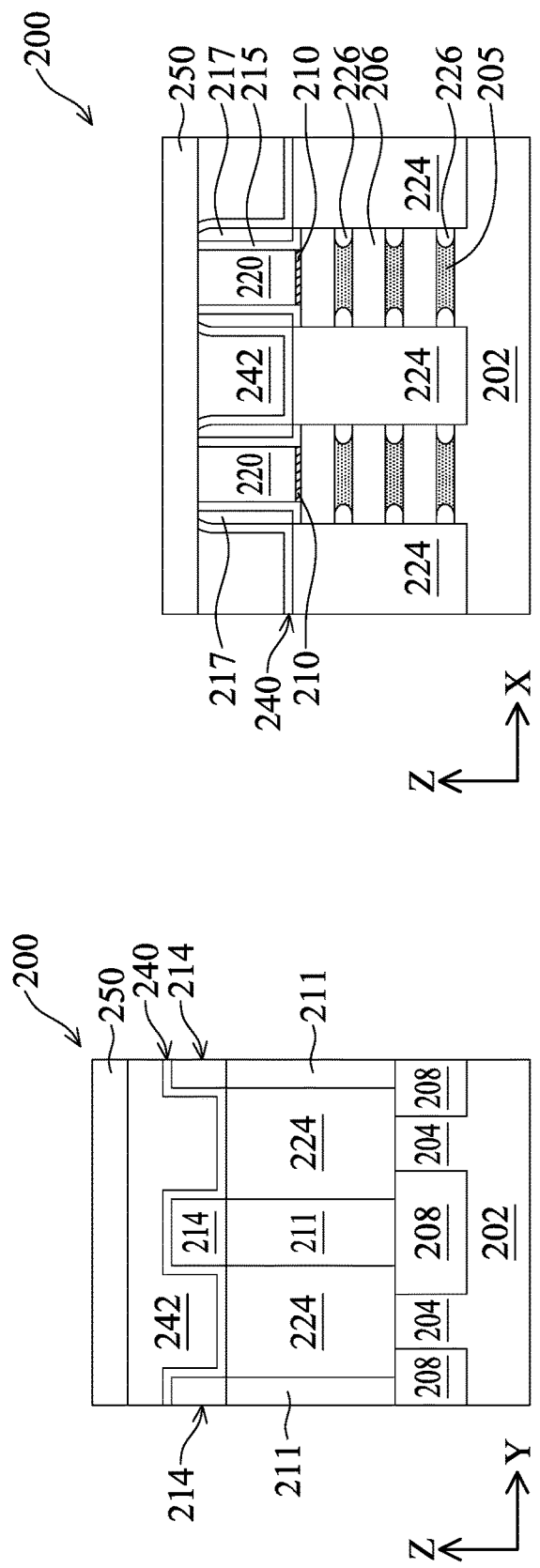
FIG. 19
FIG. 19A
FIG. 19B

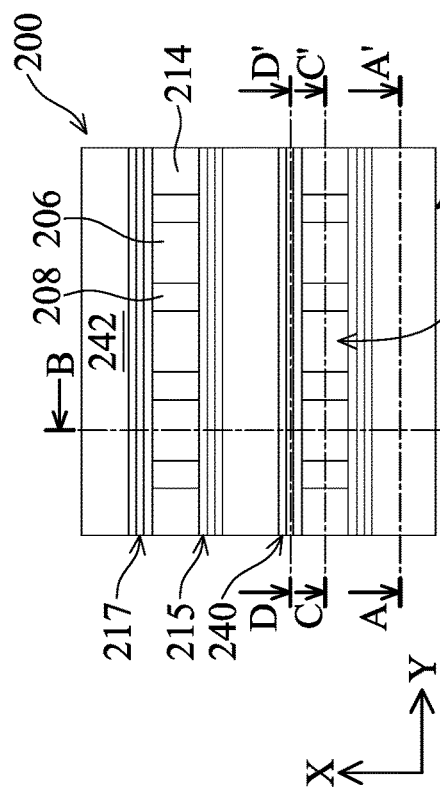
FIG. 20
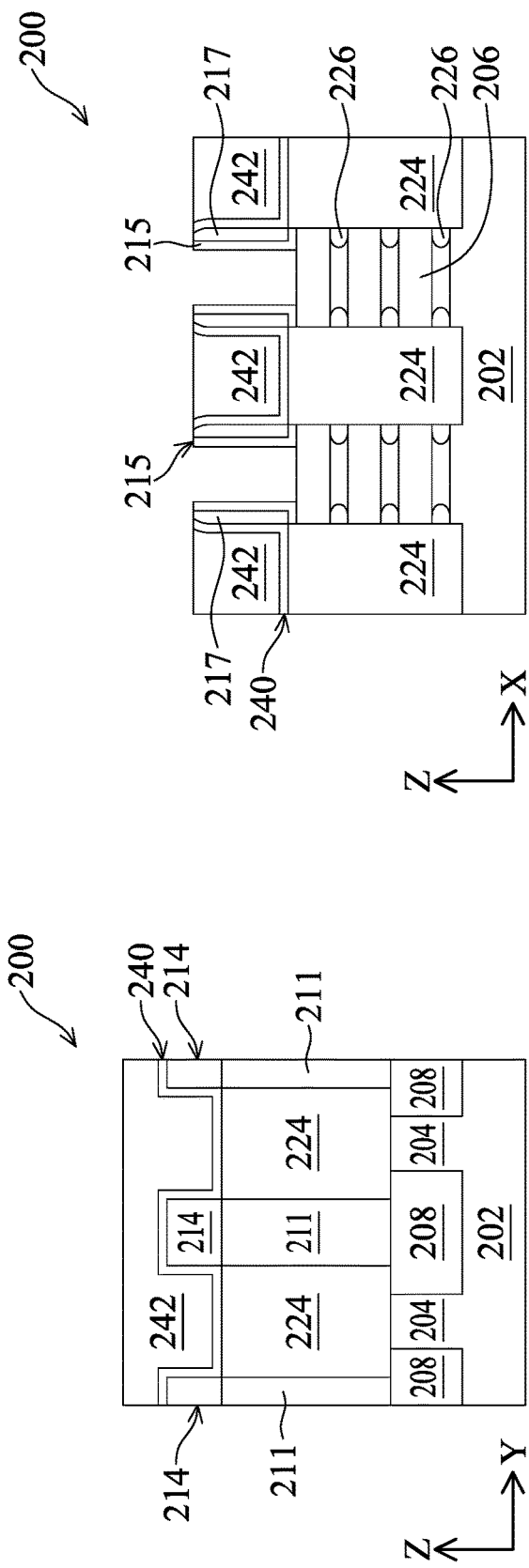
FIG. 20B
FIG. 20A

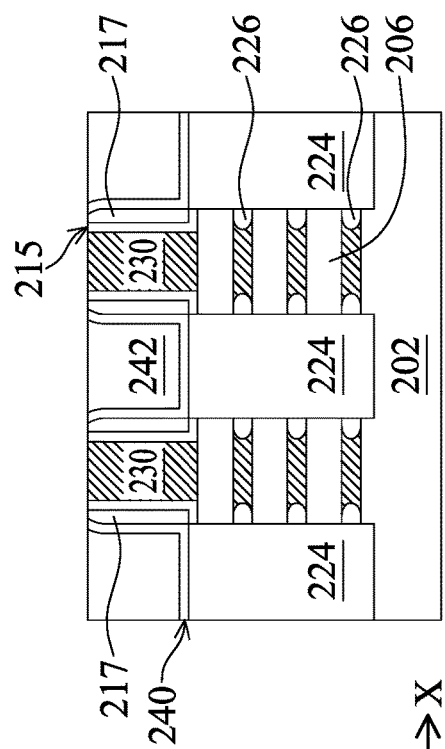
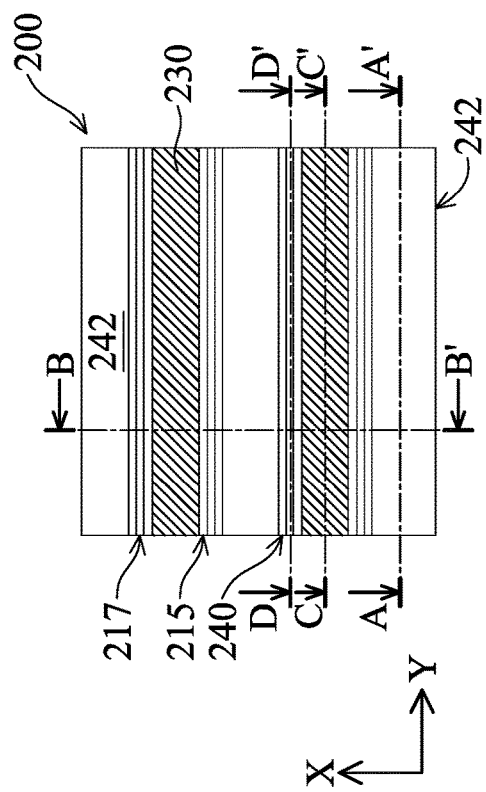
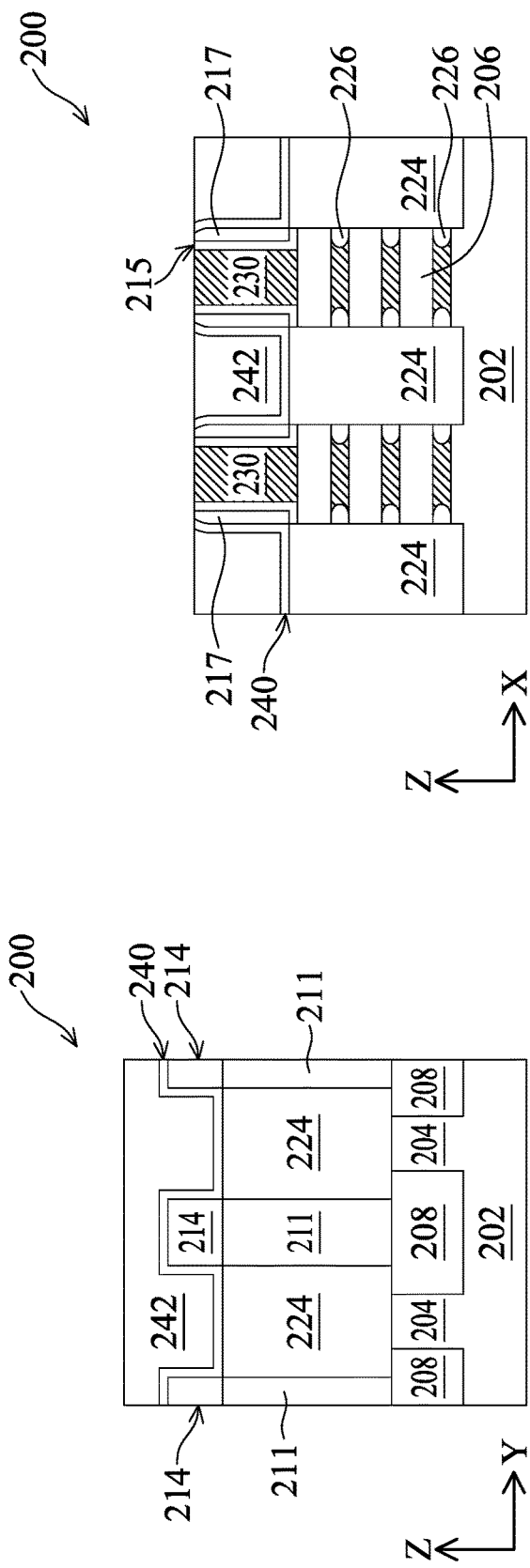
FIG. 21
FIG. 21B
FIG. 21A

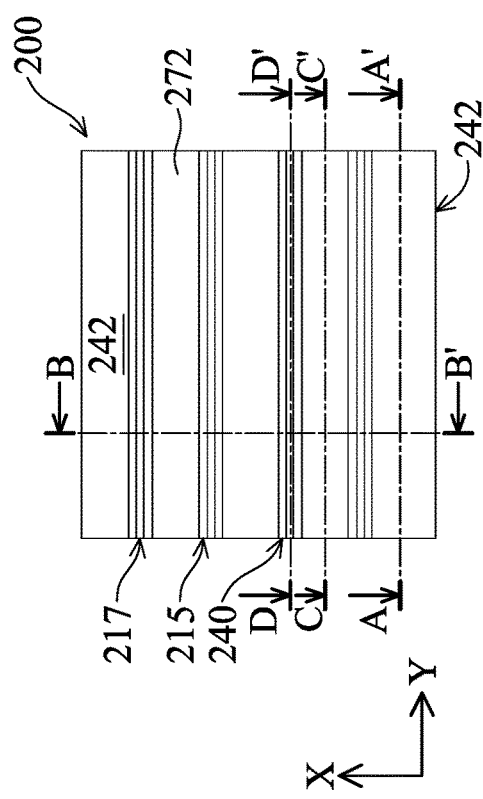
FIG. 22
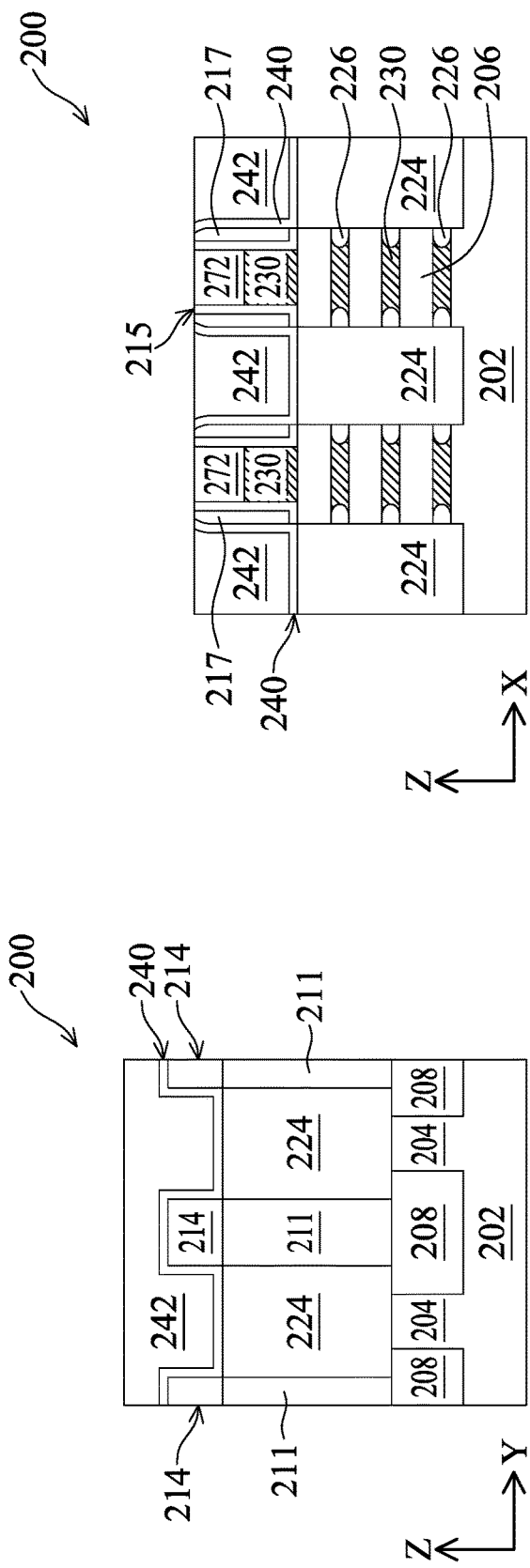
FIG. 22B
FIG. 22A

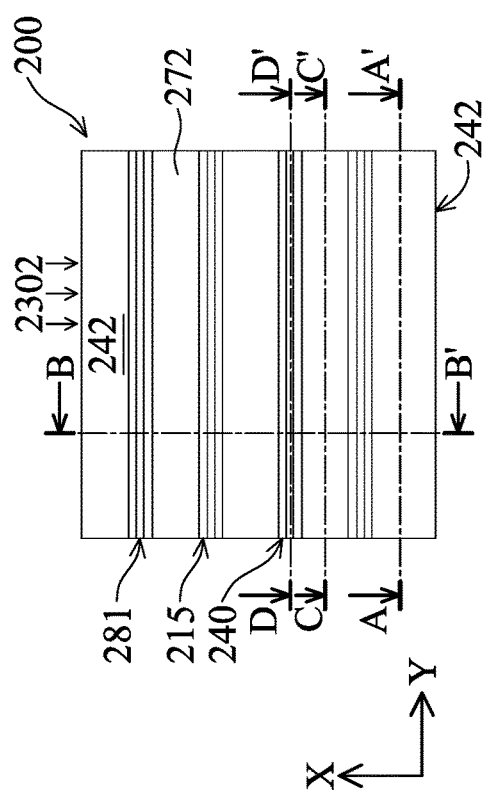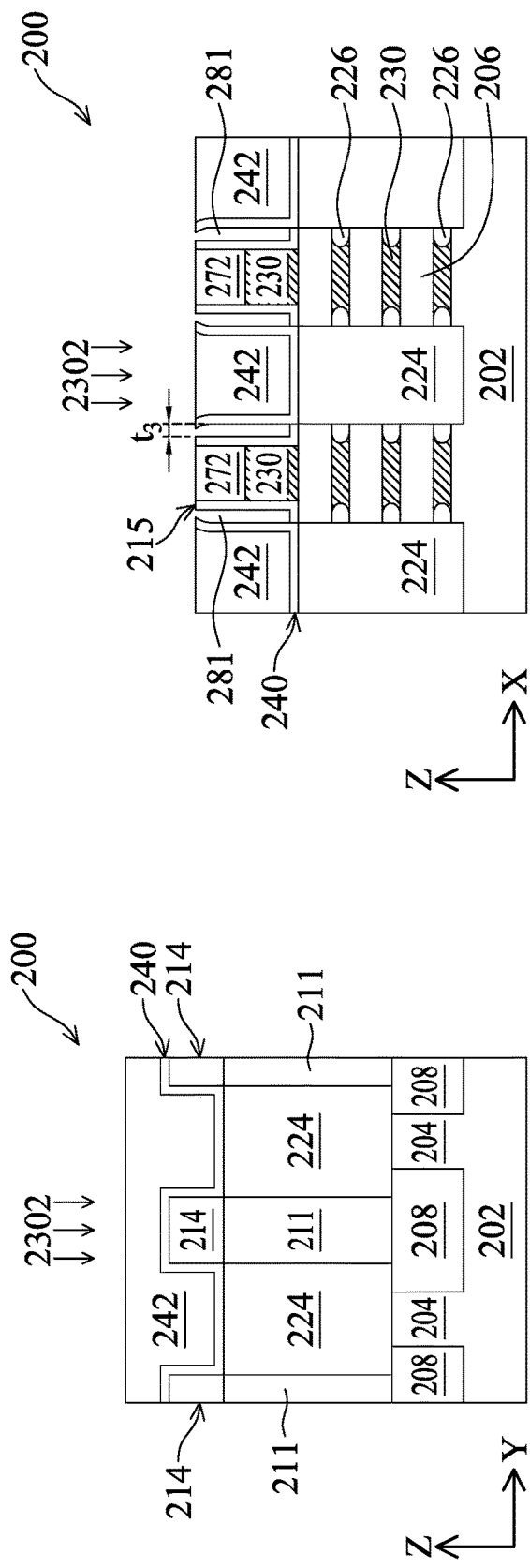
FIG. 23
FIG. 23A
FIG. 23B

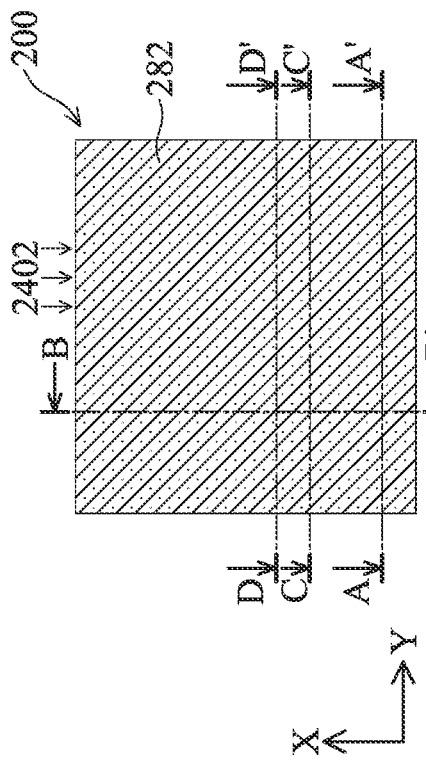
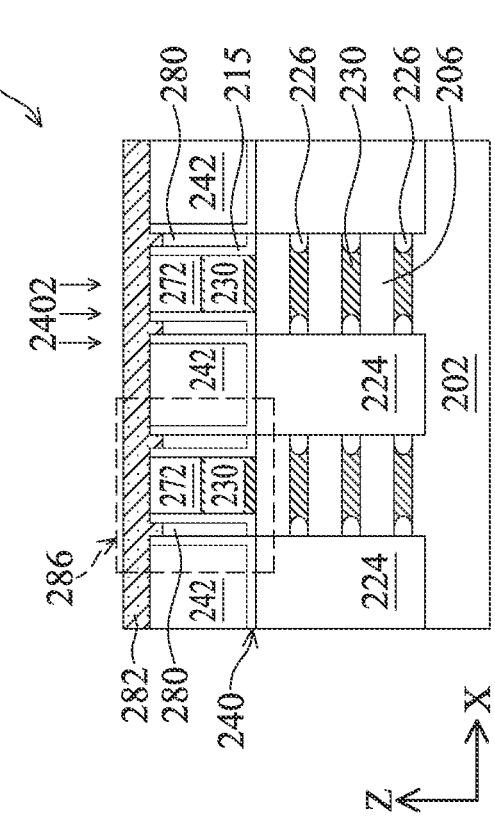
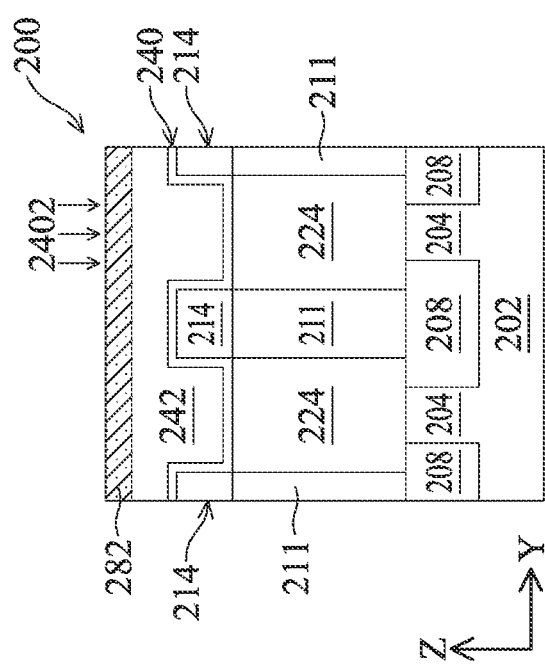
FIG. 24
FIG. 24A
FIG. 24B

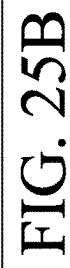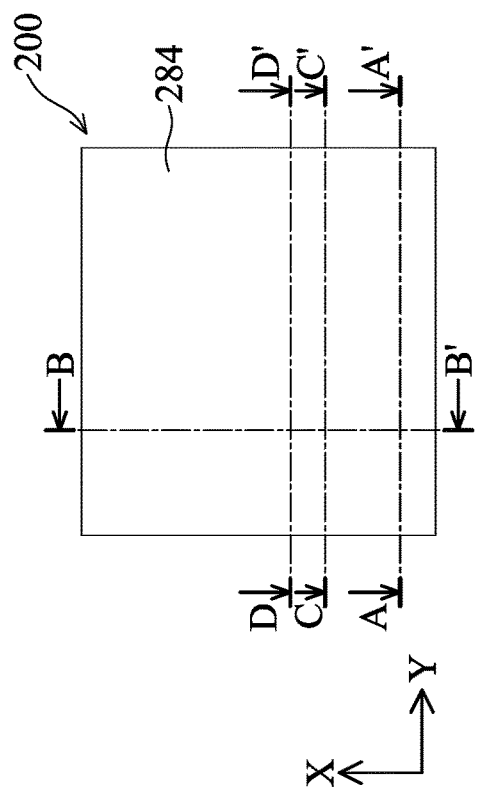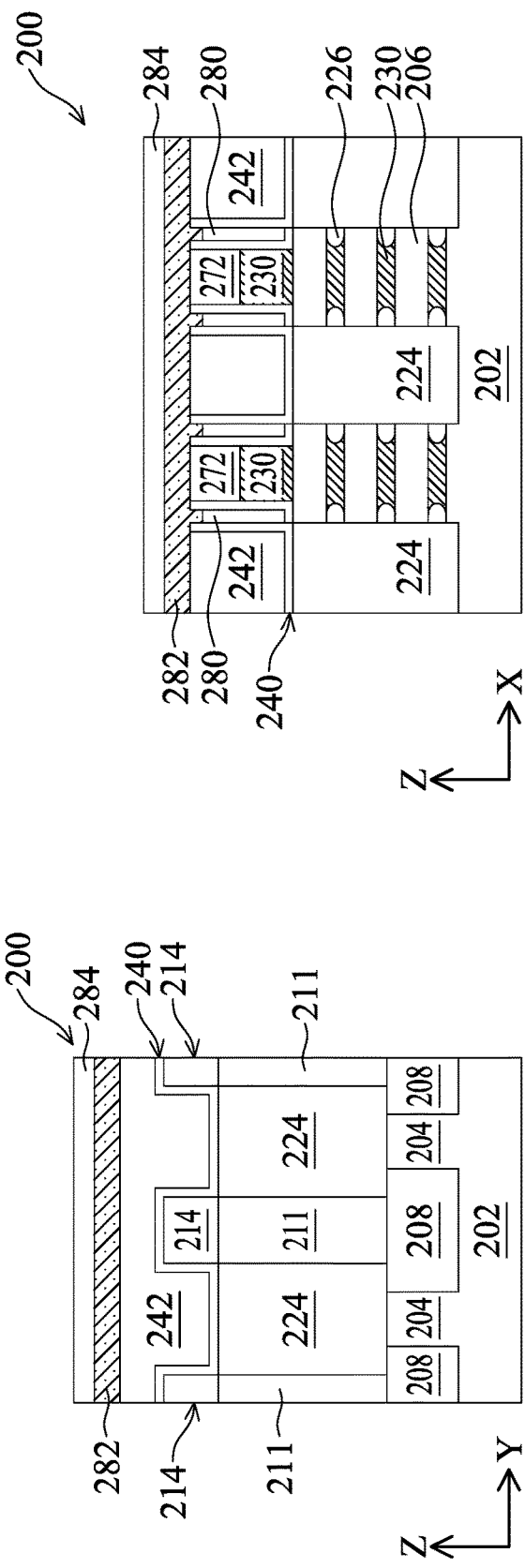

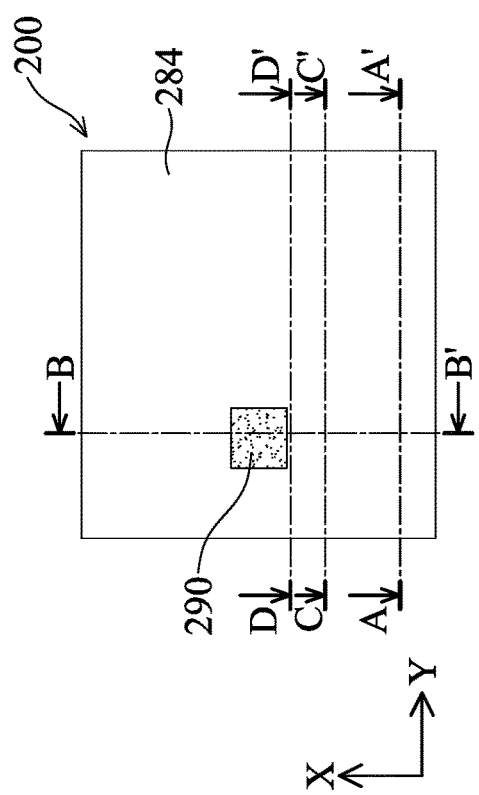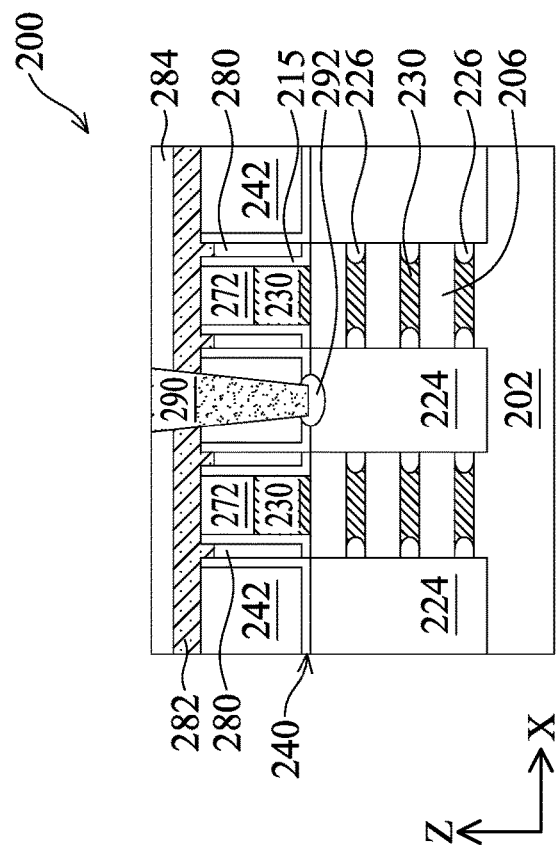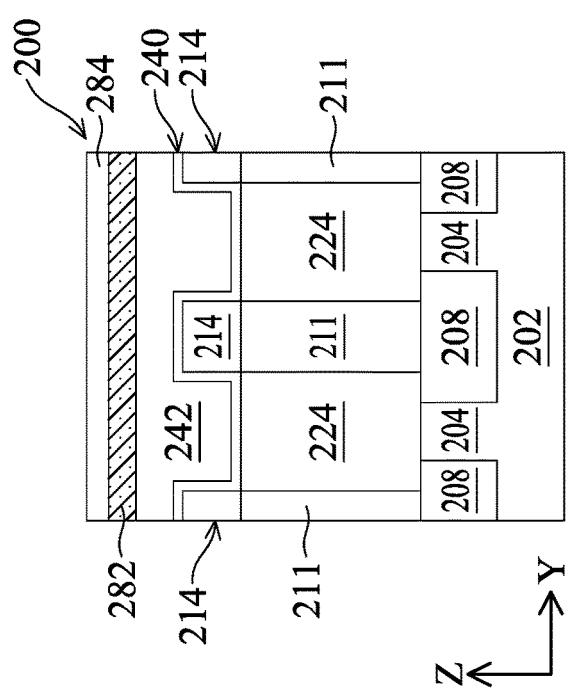

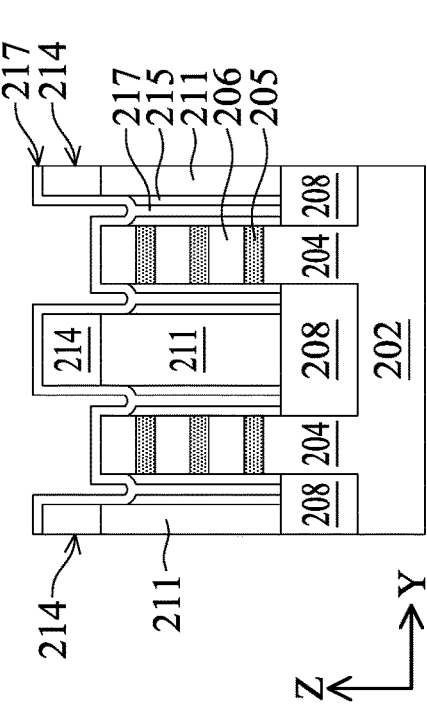
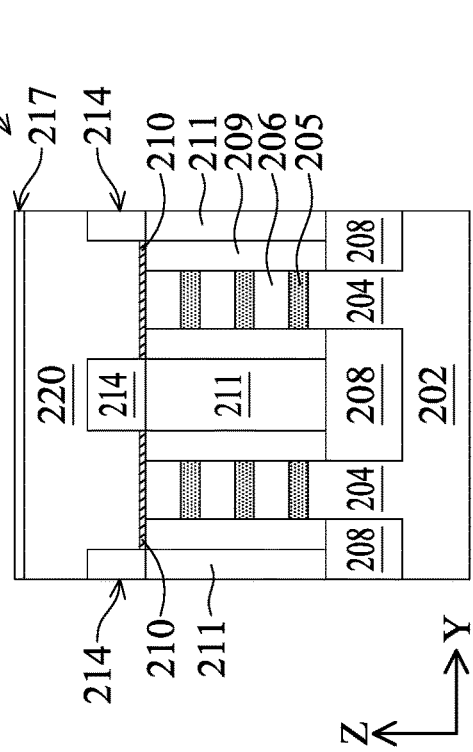
FIG. 29
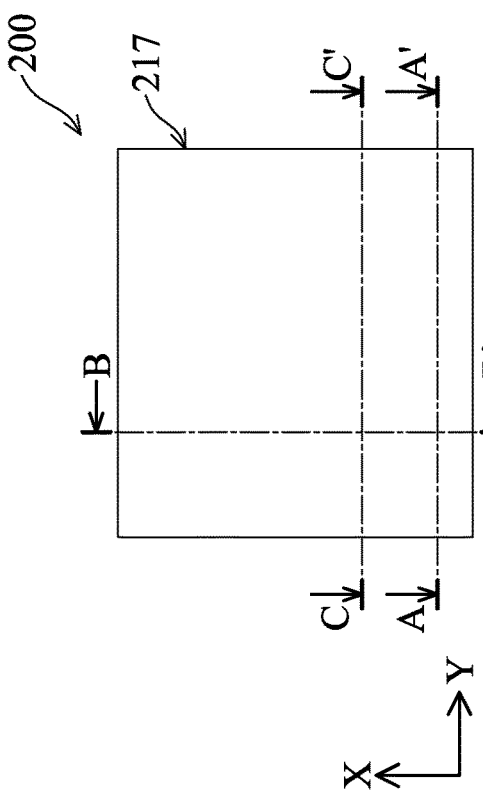
FIG. 29B
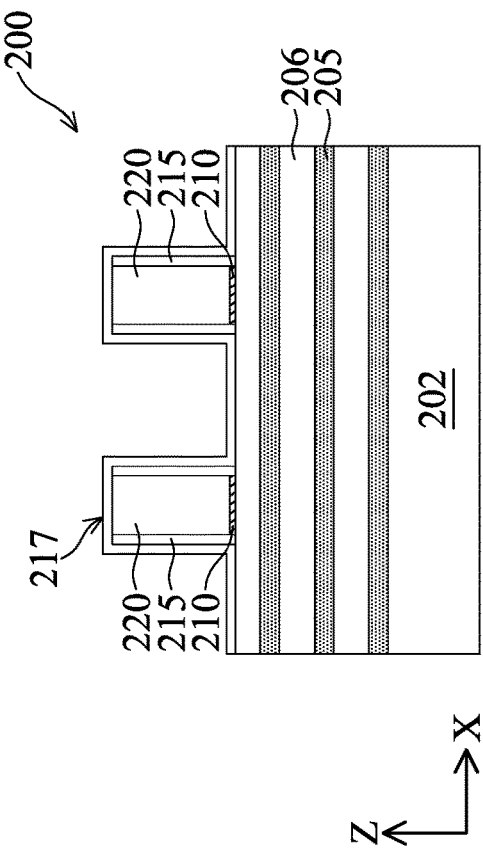
FIG. 29A
FIG. 29C

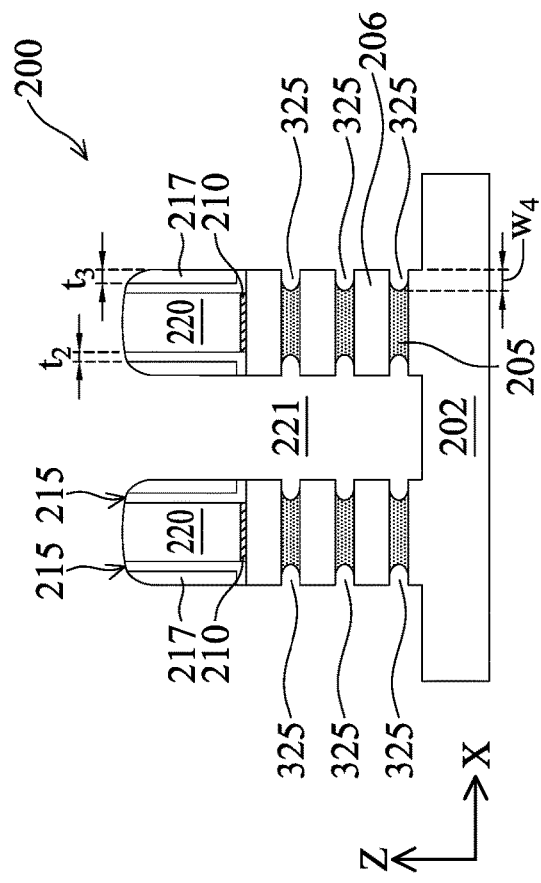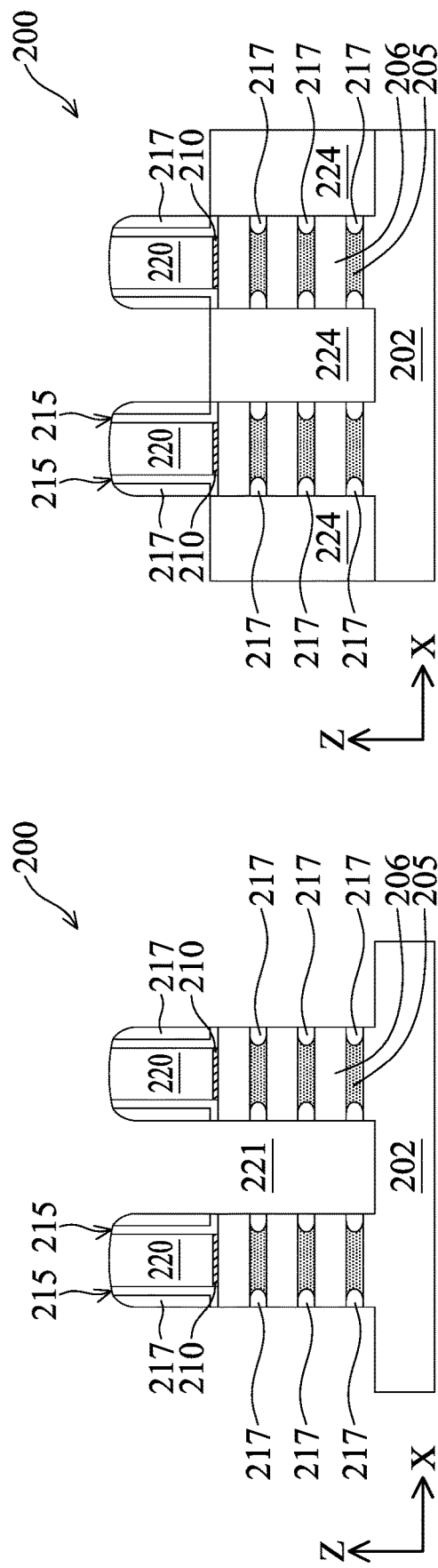

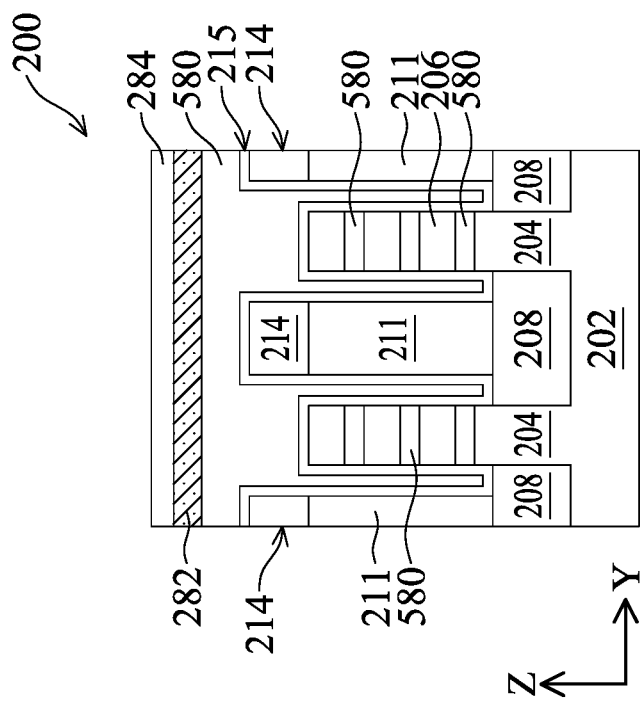
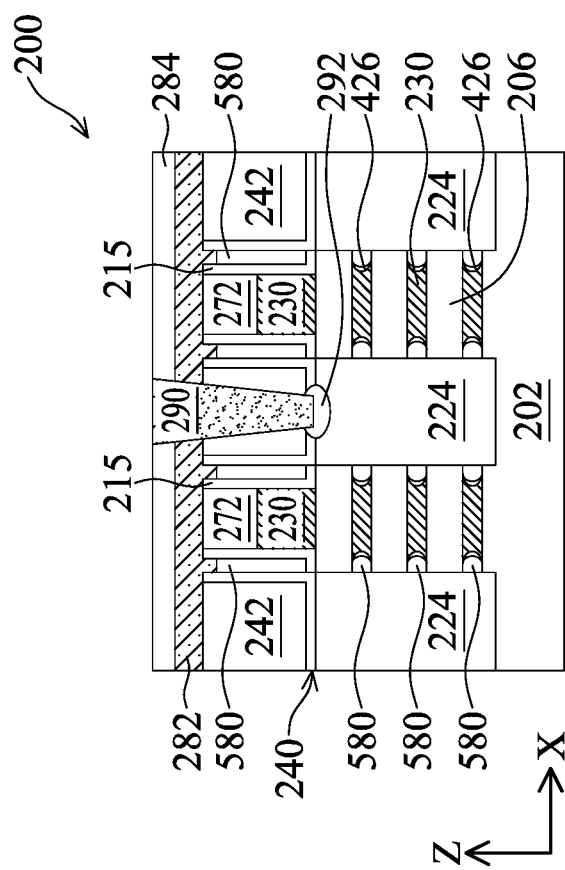
FIG. 44
FIG. 43

SEMICONDUCTOR DEVICES WITH AIR GAPS AND THE METHOD THEREOF

PRIORITY

This application claims priority to U.S. Provisional Patent Application Ser. No. 63/172,337 filed on Apr. 8, 2021, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

As integrated circuit (IC) technologies progress towards smaller technology nodes, parasitic capacitance of dielectric components disposed between active device regions may have serious bearings on the overall performance of an IC device. In some examples, higher parasitic capacitance may lead to lower device speed (e.g., RC delays) when separation distances between the active device regions are reduced to meet design requirements of smaller technology nodes. While methods of reducing parasitic capacitance in IC devices have been generally adequate for their intended purposes, they have not been entirely satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 4, 5, 6, 7, 8, 9, 10, 11, 12, 13, 14, 15, 16, 17, 18, 19, 20, 21, 22, 23, 24, 25, 26, 28, 29, and 30 are planar top views of the semiconductor device as shown in FIGS. 2A and/or 2B during intermediate stages of the method shown in FIGS. 1A and/or 1B according to various embodiments of the present disclosure.

FIGS. 4A, 5A, 6A, 7A, 8A, 9A, 10A, 11A, 12A, 13A, 14A, 15A, 16A, 17A, 18A, 19A, 20A, 21A, 22A, 23A, 24A, 25A, 26A, 28A, 29A, and 30A are cross-sectional views of the semiconductor device taken along line AA' as shown in FIGS. 2A and/or 2B during intermediate stages of the method shown in FIGS. 1A and/or 1B according to various embodiments of the present disclosure.

FIGS. 4B, 5B, 6B, 7B, 8B, 9B, 10B, 11B, 12B, 13B, 14B, 15B, 16B, 17B, 18B, 19B, 20B, 21B, 22B, 23B, 24B, 24B-1, 24B-2, 24B-3, 25B, 26B, 28B, 29B, 30B, 31, 33, 34, 35, 36, 39, 40, 41, 42, and 43 are cross-sectional views of the semiconductor device taken along line BB' as shown in FIGS. 2A and/or 2B during intermediate stages of the method shown in FIGS. 1A and/or 1B according to various embodiments of the present disclosure.

FIGS. 11C, 12C, 13C, 14C, 15C, 16C, 17C, 18C, 19C, 20C, 21C, 22C, 23C, 24C, 25C, 26C, 28C, 29C, and 30C are cross-sectional views of the semiconductor device taken along line CC' as shown in FIGS. 2A and/or 2B during intermediate stages of the method shown in FIGS. 1A and/or 1B according to various embodiments of the present disclosure.

FIGS. 14D, 15D, 16D, 17D, 18D, 19D, 20D, 21D, 22D, 23D, 24D, 24D-1, 24D-2, 24D-3, 24D-4, 25D, 26D, 37, and 44 are cross-sectional views of the semiconductor device taken along line DD' as shown in FIG. 14 during intermediate stages of the method shown in FIGS. 1A and/or 1B according to various embodiments of the present disclosure.

DETAILED DESCRIPTION

Figure 1A:
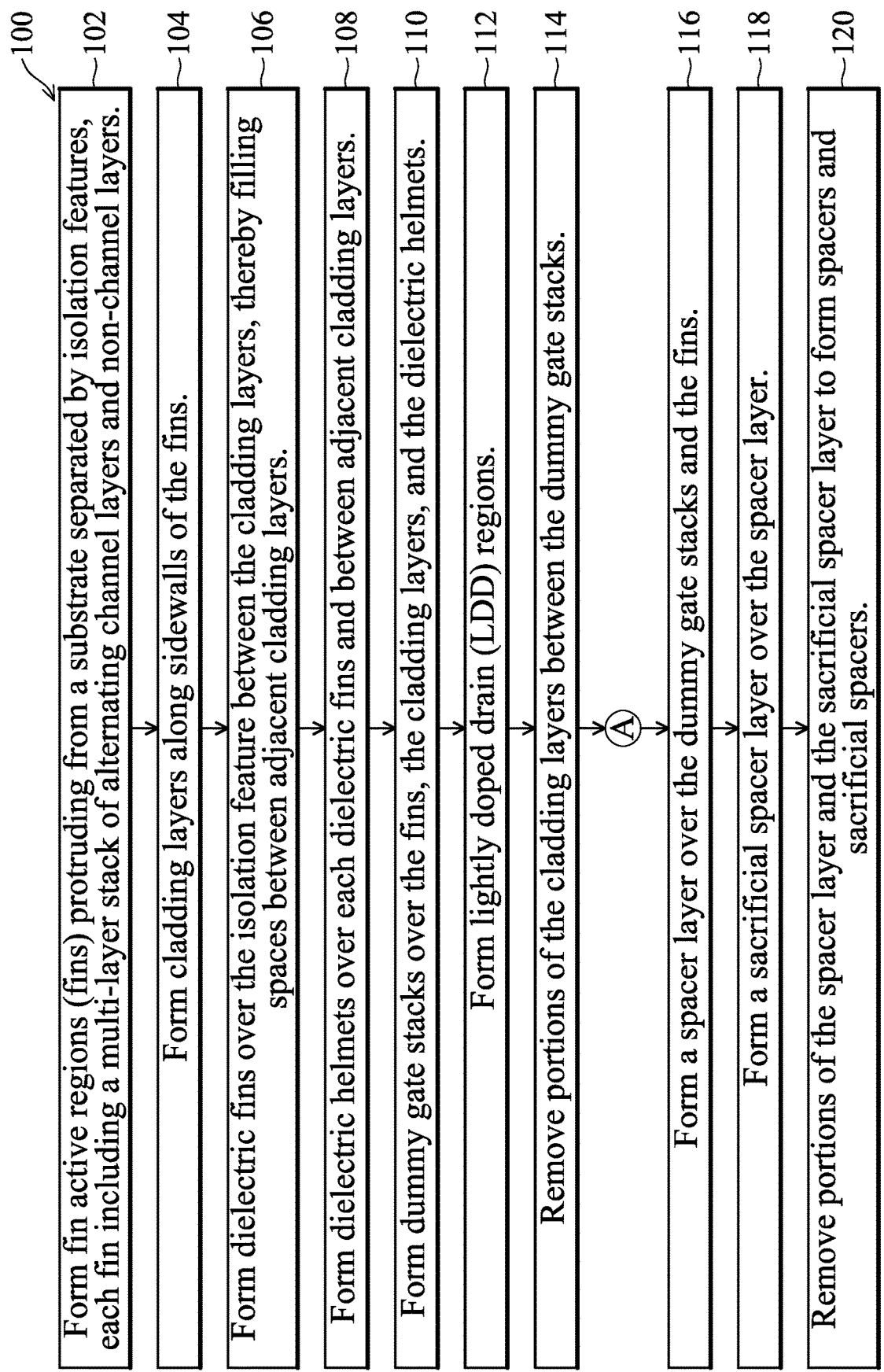
FIGS. 1A, 1B, 27, 32, and 38 illustrate flowcharts of example methods for fabricating a semiconductor device according to various embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Furthermore, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nanometers" encompasses the dimension range from 4.5 nanometers to 5.5 nanometers. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to semiconductor devices, and more particularly to field-effect transistors (FETs), such as three-dimensional nanostructure (NS) FETs (alternatively referred to as gate-all-around, or GAA, FETs), in memory and/or standard logic cells of an integrated circuit (IC) structure. Generally, an NS FET includes a plurality of vertically stacked sheets (e.g., nanosheets), wires (e.g., nanowires), or rods (e.g., nanorods) in a channel region of the FET, thereby allowing better gate control, lowering leakage current, and improving scaling capability for various IC applications. NS FETs have demonstrated attractive qualities over single-gate devices in terms of control over short-channel effects (SCEs) and driving ability. However, in some instances, NS FETs may suffer parasitic capacitances existing between its dielectric components disposed between active regions. While many design choices have been utilized to reduce the parasitic capacitance, they are not entirely satisfactory in all aspects. In this regard, improvements in methods of forming NS FETs with reduced parasitic capacitance are desired. The present embodiments are directed to methods of forming an air gap along gate spacers and around the fins to reduce the parasitic capacitance of the IC structure without compromising other aspects of the design requirements. The present disclosure includes multiple embodiments. Different embodiments may have different advantages, and no particular advantage is necessarily required of any embodiment. The following disclosure will continue with one or more GAA FETs as example multi-gate transistors to illustrate various embodiments of the present disclosure. It is understood, however, that the application should not be limited to a particular type of device and may be applicable to other multi-gate transistors, such as FinFETs.

Figure 1B:
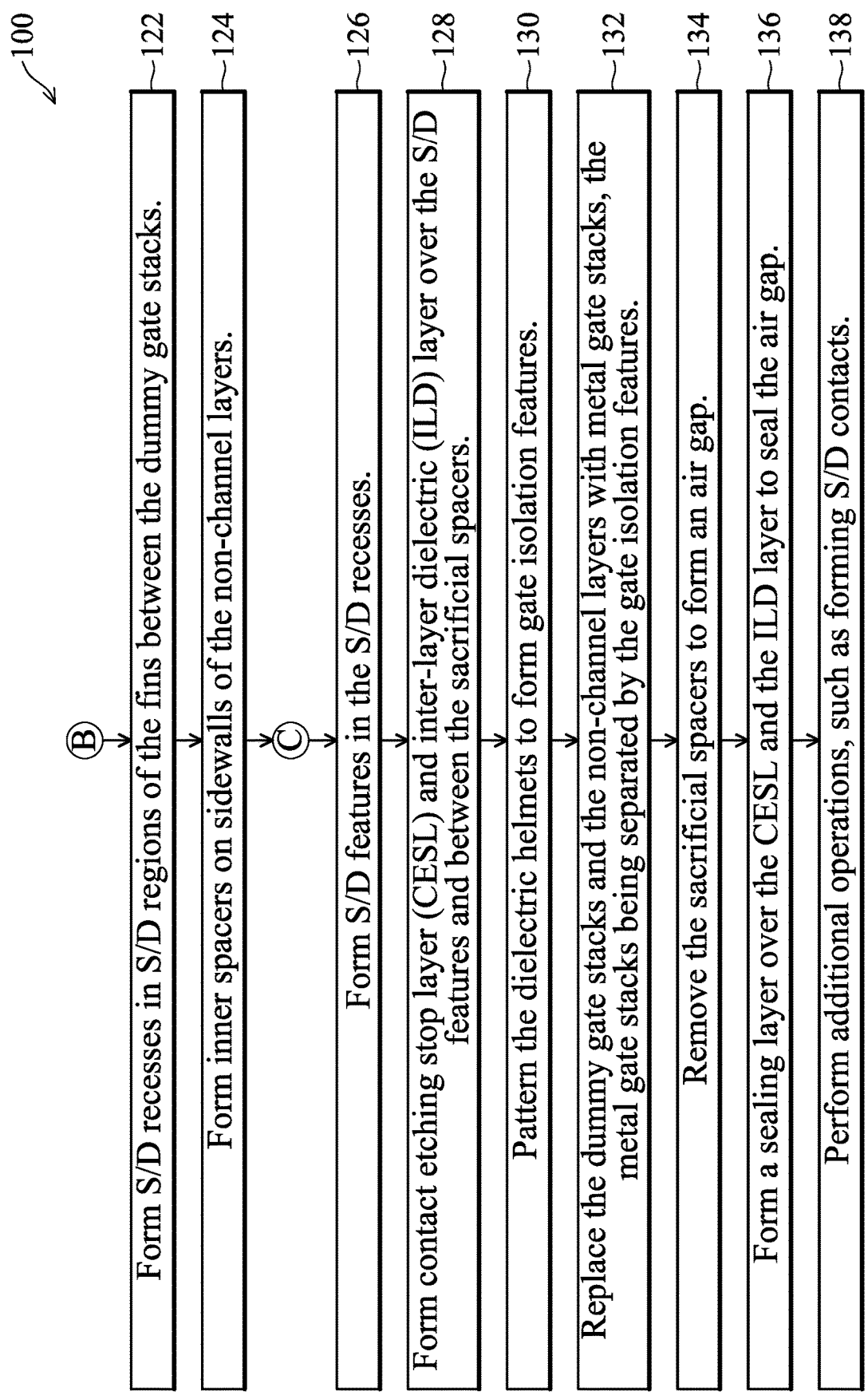
Figure 2B:
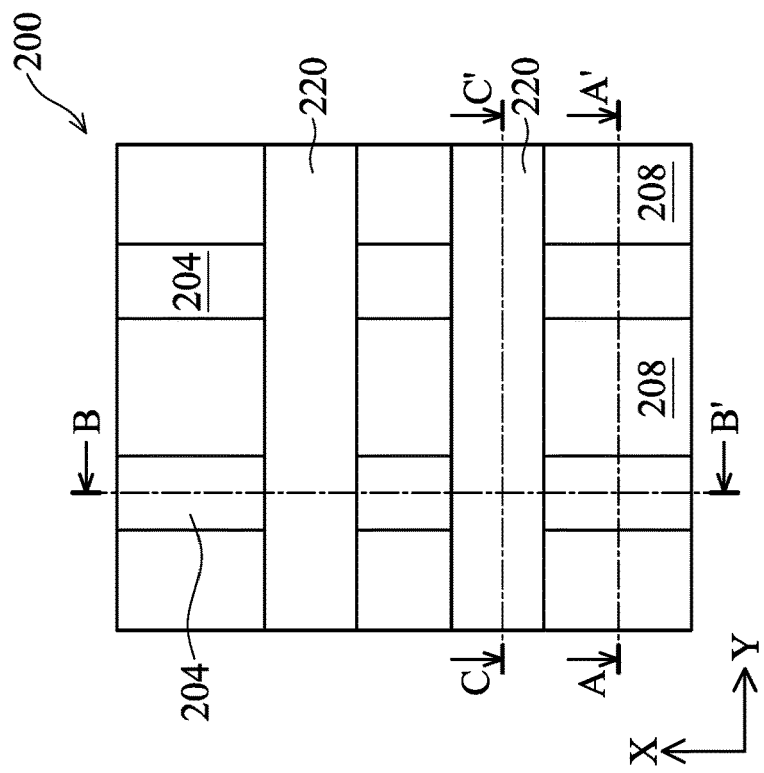
FIG. 2B is a planar top view of the semiconductor device shown in FIG. 2A according to various embodiments of the present disclosure.
Figure 2A:
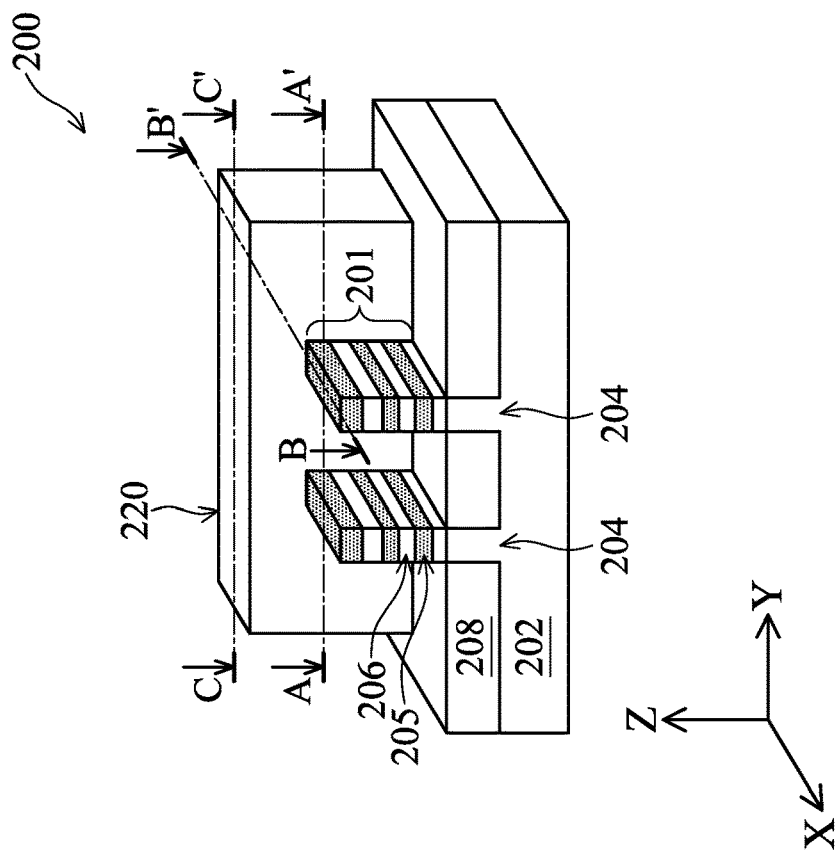
FIG. 2A is a three-dimensional perspective view of a portion of an example semiconductor device according to various embodiments of the present disclosure.
Figure 3:
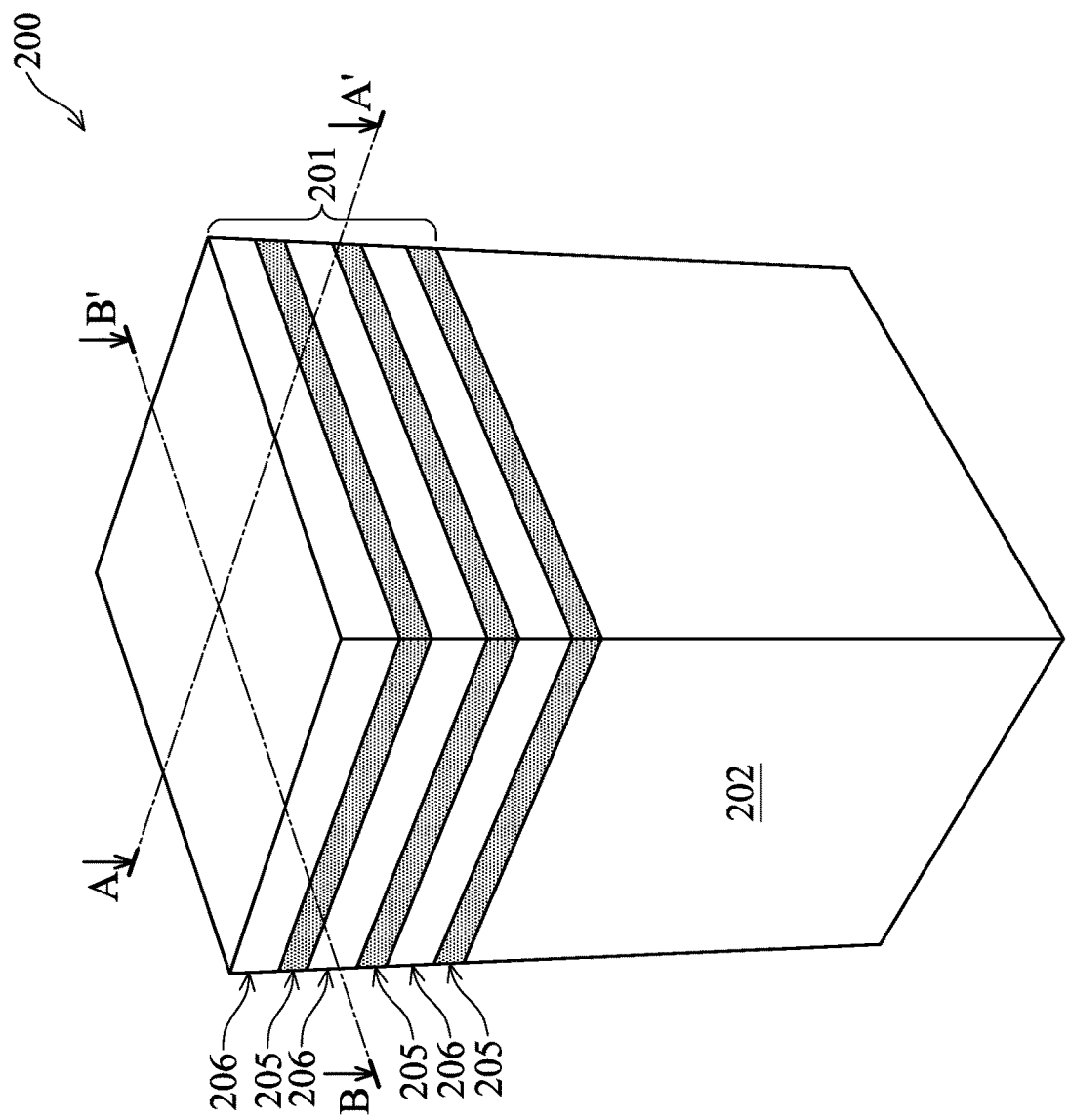
FIG. 3 illustrates a three-dimensional perspective view of the semiconductor device during an intermediate stage of the method shown in FIGS. 1A and/or 1B according to one or more aspects of the present disclosure.
Figure 14D:
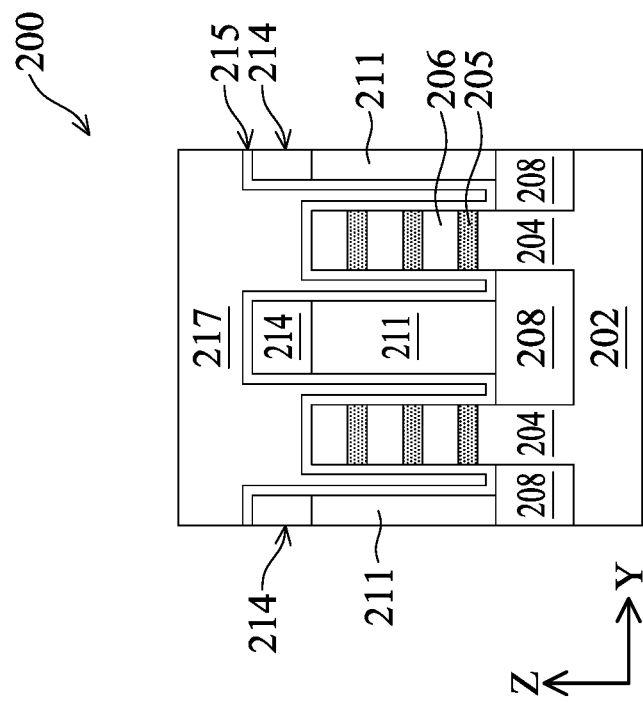
Figure 14C:
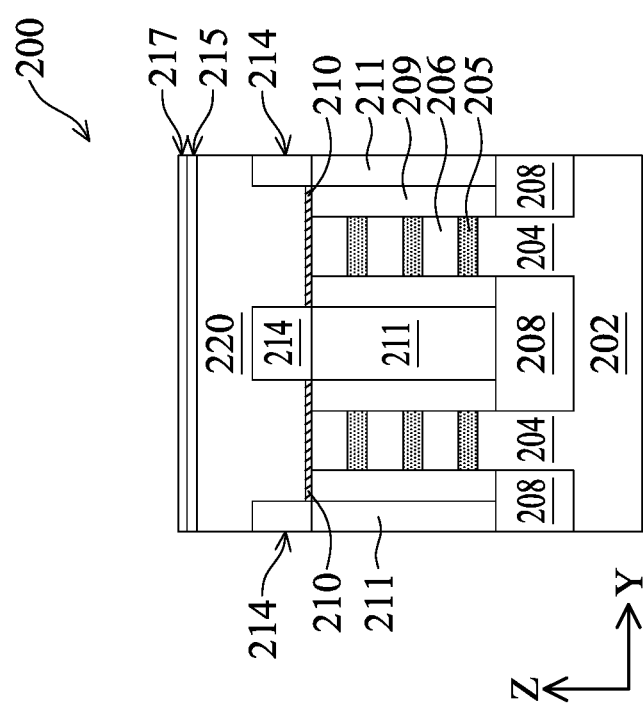

Referring now to FIGS. 1A and 1B collectively, a flowchart of a method 100 of forming a semiconductor device 200 (hereafter simply referred to as the device 200) is illustrated according to various aspects of the present disclosure. The methods 100 is merely an example and are not intended to limit the present disclosure beyond what is explicitly recited in the claims. Additional operations can be provided before, during, and after the method 100, and some operations described can be replaced, eliminated, or moved around for additional embodiments of the method. The method 100 is described below in conjunction with FIGS. 4-44, which are top planar views and various cross-sectional views of the device 200 as shown in FIGS. 2A, 2B, and 3 at intermediate steps of the method 100. For examples, FIGS. 4, 5, 6, 7, 8, 9, 10, 11, 12, 13, 14, 15, 16, 17, 18, 19, 20, 21, 22, 23, 24, 25, 26, 28, 29, and 30 are planar top views of the device 200 as shown in FIGS. 2A and/or 2B; FIGS. 4A, 5A, 6A, 7A, 8A, 9A, 10A, 11A, 12A, 13A, 14A, 15A, 16A, 17A, 18A, 19A, 20A, 21A, 22A, 23A, 24A, 25A, 26A, 28A, 29A, and 30A are cross-sectional views of the device 200 taken along line AA' as shown in FIGS. 2A and/or 2B; FIGS. 4B, 5B, 6B, 7B, 8B, 9B, 10B, 11B, 12B, 13B, 14B, 15B, 16B, 17B, 18B, 19B, 20B, 21B, 22B, 23B, 24B, 24B-1, 24B-2, 24B-3, 25B, 26B, 28B, 29B, 30B, 31, 33, 34, 35, 36, 39, 40, 41, 42, and 43 are cross-sectional views of the device 200 taken along line BB' as shown in FIGS. 2A and/or 2B; FIGS. 11C, 12C, 13C, 14C, 15C, 16C, 17C, 18C, 19C, 20C, 21C, 22C, 23C, 24C, 25C, 26C, 28C, 29C, and 30C, are cross-sectional views of the device 200 taken along line CC' as shown in FIGS. 2A and/or 2B; FIGS. 14D, 15D, 16D, 17D, 18D, 19D, 20D, 21D, 22D, 23D, 24D, 24D-1, 24D-2, 24D-3, 24D-4, 25D, 26D, 37, and 44 are cross-sectional views of the device 200 taken along line DD' as shown in FIG. 14.

The device 200 may be an intermediate device fabricated during processing of an IC, or a portion thereof, that may comprise static random-access memory (SRAM) and/or other logic circuits, passive components such as resistors, capacitors, and inductors, and active components such as NS FETs, FinFETs, metal-oxide semiconductor field effect transistors (MOSFETs), complementary metal-oxide semiconductor (CMOS) transistors, bipolar transistors, high voltage transistors, high frequency transistors, and/or other transistors. In the present embodiments, the device 200 includes one or more NS FETs. The present disclosure is not limited to any particular number of devices or device regions, or to any particular device configurations. Additional features can be added to the device 200, and some of the features described below can be replaced, modified, or eliminated in other embodiments of the device 200.

At operation 102, referring to FIGS. 1A-4B, the method 100 forms the device 200 that includes multiple three-dimensional fin active regions (hereafter referred to as fins) 204 protruding from a semiconductor substrate (hereafter referred to as the substrate) 202, where the fins 204 are separated by isolation features 208. The fins 204 are alternatively referred to as device fins or semiconductor device fins.

The substrate 202 may include an elemental (single element) semiconductor, such as silicon (Si), germanium (Ge), and/or other suitable materials; a compound semiconductor, such as silicon carbide, gallium arsenic, gallium phosphide, indium phosphide, indium arsenide, indium antimonide, and/or other suitable materials; an alloy semiconductor, such as SiGe, GaAsP, AlInAs, AlGaAs, GaInAs, GaInP, GaInAsP, and/or other suitable materials. The substrate 202 may be a single-layer material having a uniform composition. Alternatively, the substrate 202 may include multiple material layers having similar or different compositions suitable for IC device manufacturing.

In some embodiments where the substrate 202 includes FETs, various doped regions, such as source/drain (S/D) regions, are disposed in or on the substrate 202. The doped regions may be doped with n-type dopants, such as phosphorus or arsenic, and/or p-type dopants, such as boron or $BF_2$, depending on design requirements. The doped regions may be formed directly on the substrate 202, in a p-well structure, in an n-well structure, in a dual-well structure, or using a raised structure. Doped regions may be formed by implantation of dopant atoms, in-situ doped epitaxial growth, and/or other suitable techniques.

In the present embodiments, referring to FIGS. 2A-4B, each fin 204 includes a multi-layer stack 201 of alternating non-channel layers (or sacrificial layers) 205 and channel layers 206 stacked vertically over protruding portions of the substrate 202, as well as a hard mask 207 over the multi-layer stack 201. In some embodiments, the hard mask layer 207 has a composition the same as or similar to the non-channel layer 205. In some embodiments, a top oxide layer 213 may be optionally formed between the hard mask 207 and the topmost channel layer 206.

In the present embodiments, the non-channel layers 205 are sacrificial layers configured to be removed at a subsequent processing step, thereby providing openings between the channel layers 206 for forming a metal gate stack therein. Each channel layer 206 may include a semiconductor material such as, for example, Si, Ge, SiC, SiGe, GeSn, SiGeSn, SiGeCSn, other suitable semiconductor materials, or combinations thereof, while each non-channel layer 205 has a composition different from that of the channel layer 206. In one such example, the channel layer 206 may include elemental Si and the non-channel layer 205 may include SiGe. In another example, the channel layers 206 may include elemental Si and the non-channel layers 205 may include elemental Ge. In the present embodiments, the channel layers 206 includes elemental Si and the non-channel layers 205 include SiGe. In some examples, each fin 204 may include a total of two to ten pairs of alternating non-channel layers 205 and channel layers 206; of course, other configurations may also be applicable depending upon specific design requirements.

In the present embodiments, forming the multi-layer stack 201 includes alternatingly growing the non-channel layers 205 and the channel layers 206 in a series of epitaxy processes vertically (e.g., along the z-direction) as shown in FIG. 3. The epitaxy processes may be implemented by chemical vapor deposition (CVD) techniques (for example, vapor-phase epitaxy (VPE), ultra-high vacuum CVD (UHV-CVD), low-pressure (LP-CVD), and/or plasma-enhanced CVD (PE-CVD)), molecular beam epitaxy, other suitable selective epitaxial growth (SEG) processes, or combinations thereof. The epitaxy process may use gaseous and/or liquid precursors containing a suitable material (e.g., Ge for the non-channel layers 205), which interact with the composition of the underlying substrate, e.g., the substrate 202. In some examples, the non-channel layers 205 and the channel layers 206 may be formed into nanosheets, nanowires, or nanorods. A sheet (or wire) release process may then be implemented to remove the non-channel layers 205 to form openings between the channel layers 206, and a metal gate stack is subsequently formed in the openings, thereby providing an NS FET.

Figure 4A:
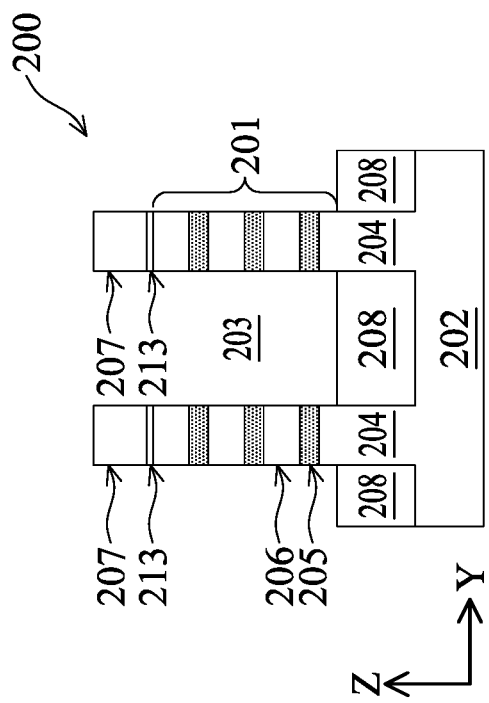

In the present embodiments, the fins 204 are fabricated from the multi-layer stack 201 using a series of photolithography and etching processes. For example, the photolithography process may include forming a photoresist layer overlying the multi-layer stack 201, exposing the photoresist layer to a pattern, performing post-exposure bake processes, and developing the exposed photoresist layer to form a patterned masking element (not depicted). The multi-layer stack 201 is then etched using the patterned masking element as an etch mask, thereby leaving the fins 204 protruding the substrate 202 and separated by trenches 203 as shown in FIG. 4A. The etching process may include dry etching, wet etching, reactive ion etching (RIE), other suitable processes, or combinations thereof. The patterned masking element is subsequently removed from the multi-layer stack 201 using any suitable process, such as ashing and/or resist stripping.

In some embodiments, the hard mask 207 is configured to protect the fins 204 during subsequent processing steps and is later removed from the device 200. In some embodiments, the hard mask 207 has a composition similar to or the same as that of the non-channel layers 205 and includes, for example, SiGe. In some embodiments, the optional top oxide layer 213 includes any suitable materials, such as silicon oxide ($SiO_x$, $1 \leq x \leq 2$). In some embodiments, the hard mask 207 and the top oxide layer 213 are collectively patterned with the multi-layer stack 201 during the fin fabrication process.

The isolation features 208 may include silicon oxide ($SiO_x$, $1 \leq x \leq 2$), tetraethylorthosilicate (TEOS), doped silicon oxide (e.g., borophosphosilicate glass (BPSG), fluoride-doped silicate glass (FSG), phosphosilicate glass (PSG), boron-doped silicate glass (BSG), etc.), a low-k dielectric material (having a dielectric constant less than that of silicon oxide, which is about 3.9), other suitable materials, or combinations thereof. In one embodiment, the isolation features 208 are formed by filling trenches 203 between the fins 204 with a dielectric material described above by any suitable method, such as CVD, flowable CVD (FCVD), spin-on-glass (SOG), other suitable methods, or combinations thereof. The dielectric material may subsequently be planarized by a chemical-mechanical planarization/polishing (CMP) process and selectively etched back to form the isolation features 208. In some embodiments, the isolation features 208 include shallow trench isolation (STI) features. In some embodiments, the isolation features 208 include a single-layer structure or a multi-layer structure.

Figure 5A:
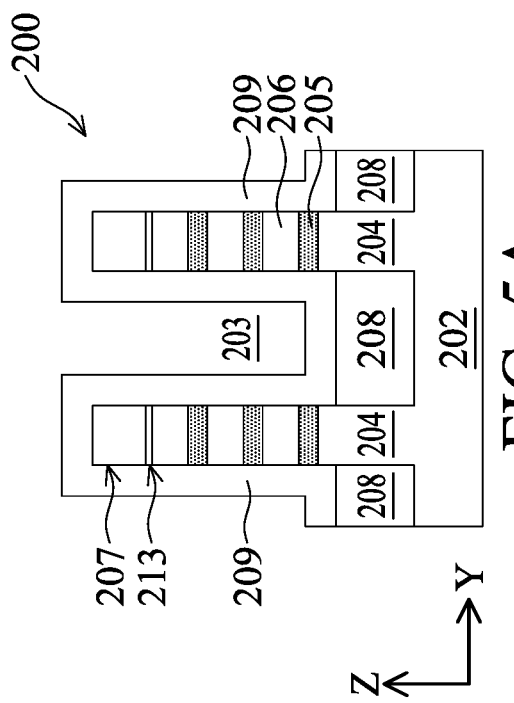
Figure 5:
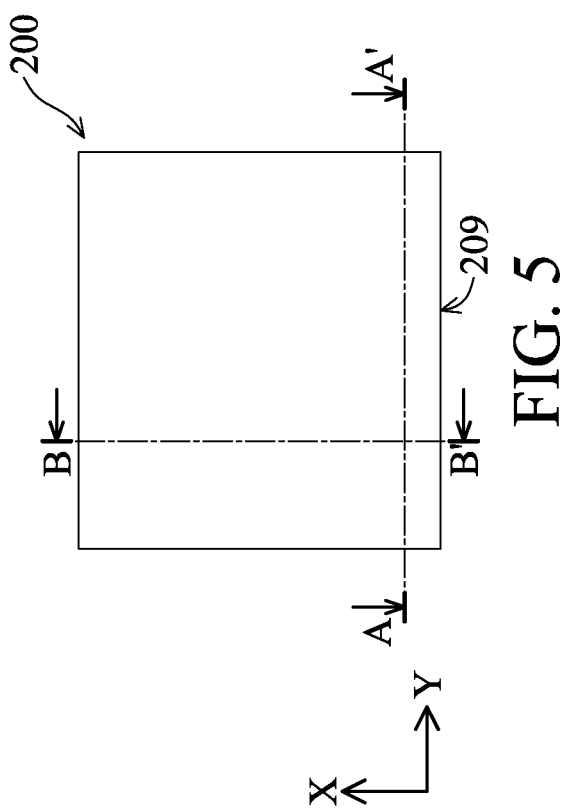
Figure 5B:
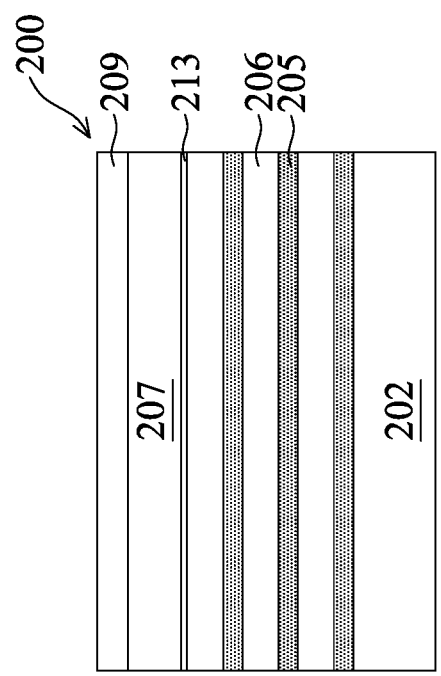
Figure 6:
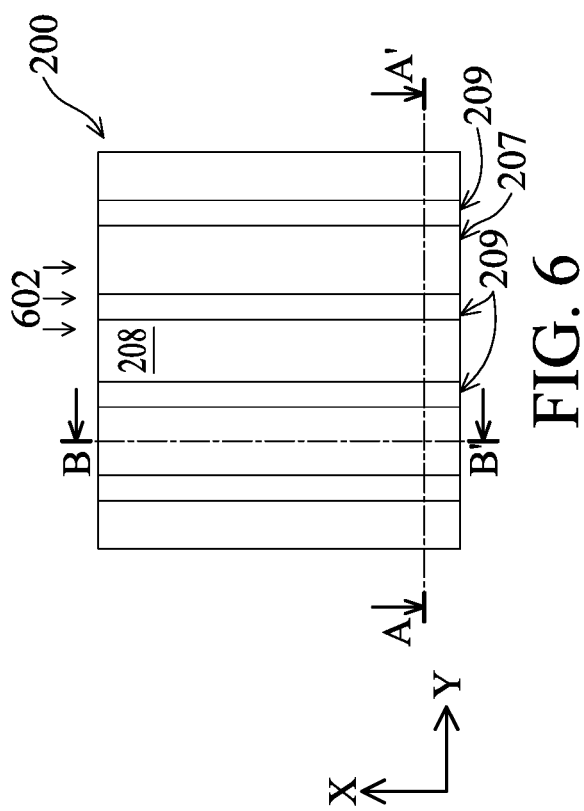
Figure 6A:
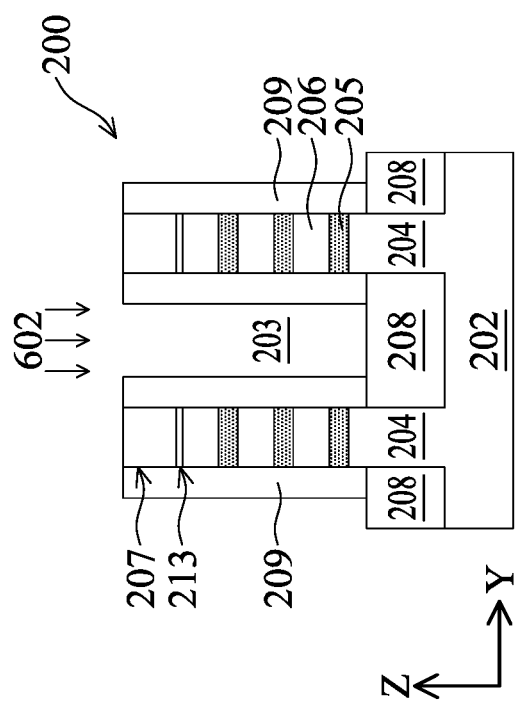
Figure 6B:
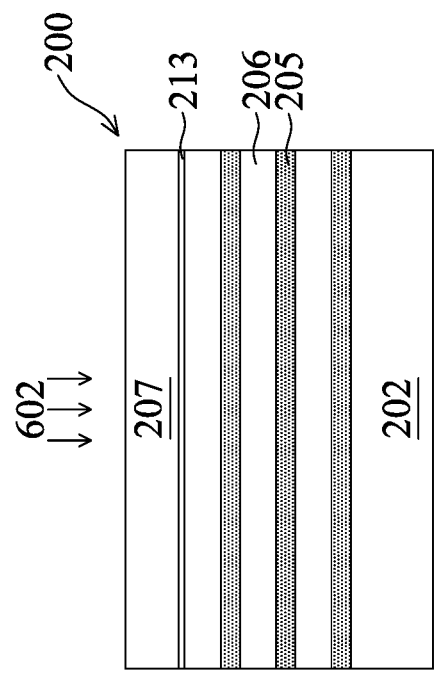

At operation 104, referring to FIGS. 5-6B, the method 100 forms cladding layer 209 along sidewalls of the fins 204 and over the isolation features 208. In some embodiments, the cladding layer 209 has a composition that is similar to but different from that of the non-channel layers 205. In other words, the difference in composition may be within a suitable range to allow the cladding layer 209 and the non-channel layers 205 to be removed together in some instances using one type of etchant or removed separately in other instances by applying a different etchant. The difference in composition may be related to a difference in amount of Ge (Ge %) present (both the cladding layer 209 and the non-channel layers 205 include SiGe as discussed above) and/or degree of crystallinity (i.e., the amount of crystalline SiGe present). In some embodiments, both the cladding layer 209 and the non-channel layers 205 include the same Ge %, but depending on the method by which the cladding layer 209 is formed (see discussion below), the degree of crystallinity in cladding layer 209 is different from that of the non-channel layers 205, thereby presenting etching selectivity between the layers. In some embodiments, the cladding layer 209 includes more amorphous SiGe than the non-channel layers 205. In some embodiments, the cladding layer 209 is formed such that it consists entirely of amorphous SiGe.

In some embodiments, the cladding layer 209 is deposited epitaxially by a suitable method discussed above with respect to forming the multi-layer stack 201. In some embodiments, referring to FIGS. 5, 5A and 5B, the cladding layer 209 is deposited conformally, rather than grown epitaxially, over surfaces of the device 200 as an amorphous layer, such that the cladding layer 209 is also formed over the isolation features 208. In the present embodiments, portions of the cladding layer 209 partially fill the trenches 203. In some examples, the cladding layer 209 may be formed to a thickness of about 5 nanometers to about 10 nanometers. Subsequently, referring to FIGS. 6, 6A and 6B, the method 100 performs an etching process 602 to selectively remove portions of the cladding layer 209, thereby exposing portions of the isolation features 208 in the trenches 203 and a top surface of the hard mask 207. The etching process 602 may include a dry etching process, an RIE process, or combinations thereof. In the present embodiments, the etching process 602 selectively removes horizontal portions of the cladding layer 209 without removing, or substantially removing the isolation features 208 or vertical portions of the cladding layer 209.

Figure 7A:
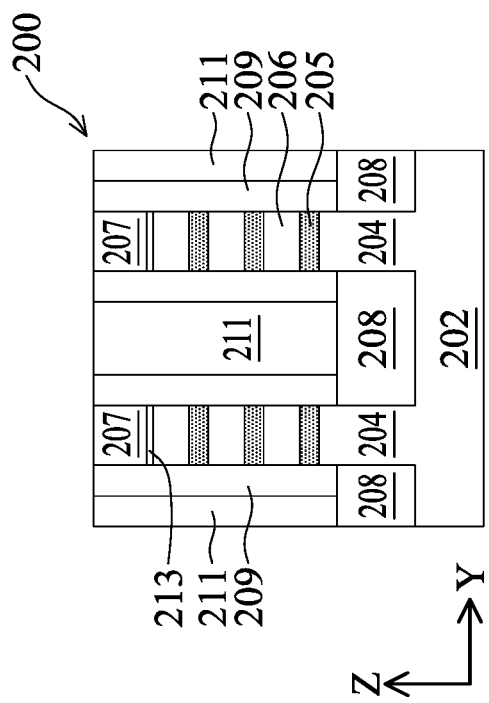
Figure 7:
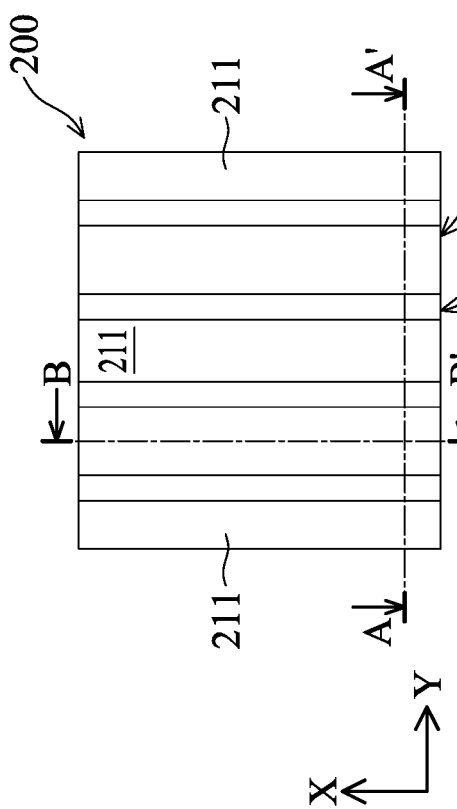
Figure 7B:
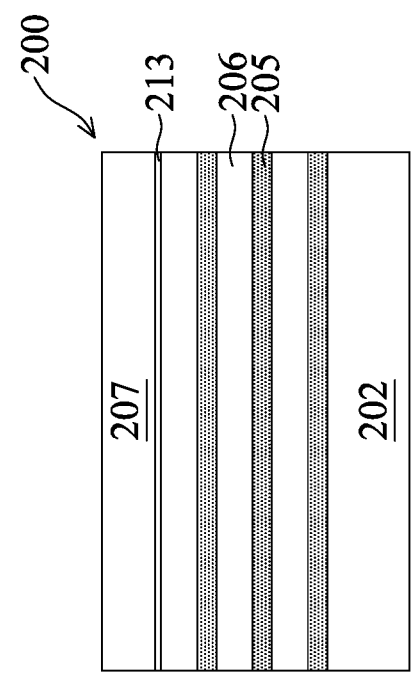

At operation 106, referring to FIGS. 7, 7A, and 7B, the method 100 forms dielectric fins (or dummy fins) 211 over the isolation features 208 and between portions of the cladding layer 209, thereby completely filling the trenches 203. The dielectric fins 211 are configured to isolate adjacent fins 204 and to provide a substrate over which dielectric helmets 214 are formed before forming any gate stacks as explained in detail below. The dielectric fins 211 may include any suitable material, such as silicon oxide ($SiO_x$, $1 \leq x \leq 2$), silicon nitride (SiN), silicon carbide (SiC), oxygen-containing silicon nitride (SiON), oxygen-containing silicon carbide (SiOC), carbon-containing silicon nitride (SiCN), aluminum oxide ($Al_2O_3$), tetraethylorthosilicate (TEOS), doped silicon oxide (e.g., borophosphosilicate glass (BPSG), FSG, phosphosilicate glass (PSG), boron-doped silicate glass (BSG), etc.), a high-k dielectric material (having a k value greater than that of silicon oxide, which is about 3.9), other suitable materials, or combinations thereof. The high-k dielectric material may include oxygen, lanthanum, aluminum, titanium, zirconium, tantalum, other suitable materials, or combinations thereof. For example, the high-k dielectric material may include hafnium oxide ($HfO_2$), lanthanum oxide ($La_2O_3$), other high-k oxide materials, or combinations thereof. The dielectric fins 211 may be single-layered or multi-layered. In some embodiments, the dielectric fins 211 may each include a lining layer (not shown) and a filling layer (not shown) different from the lining layer in composition. In some embodiments, the lining layer has a higher density than that of the filling layer. In some embodiments, the filing layer has a lower dielectric constant than the lining layer. In some embodiments, the lining layer is formed conformally along sidewalls of the cladding layer 209 and over the isolation features 208 prior to the deposition of the filling layer. The lining layer may be formed by any suitable method, such as atomic layer deposition (ALD), CVD, other suitable methods, or combinations thereof. The filling layer is subsequently formed over the lining layer by any suitable method, such as CVD, FCVD, other suitable methods, or combinations thereof. In some embodiments, the device 200 is subsequently planarized by one or more CMP process to expose a top surface of the hard mask 207. As depicted herein, the dielectric fins 211 are separated from each sidewall of the fins 204 by the cladding layer 209.

Figure 8A:
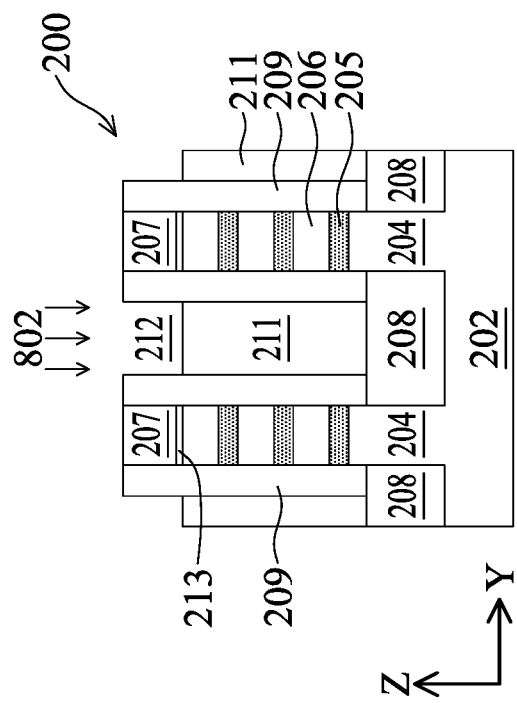
Figure 8:
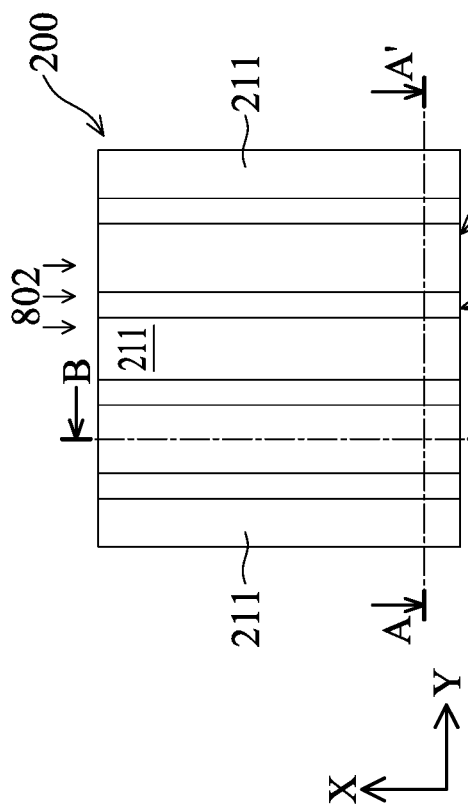
Figure 8B:
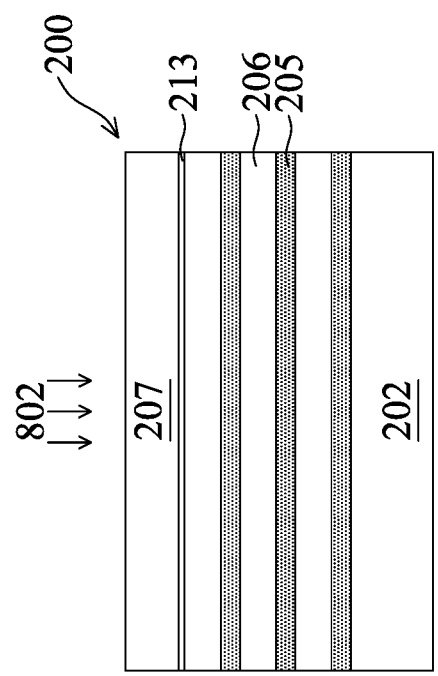
Figure 11A:
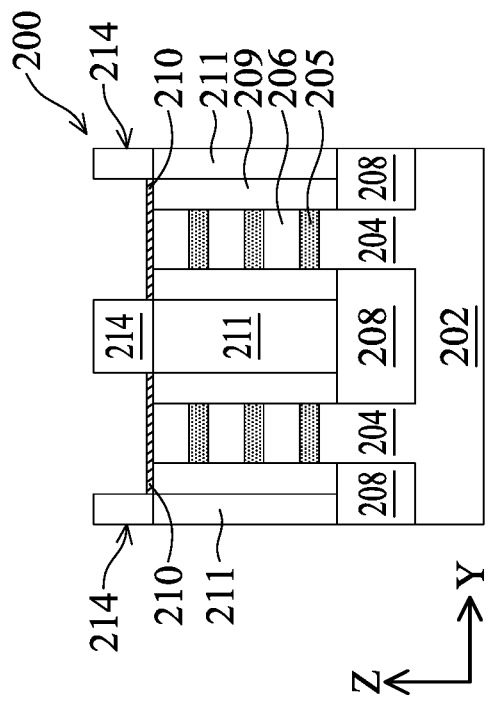
Figure 11C:
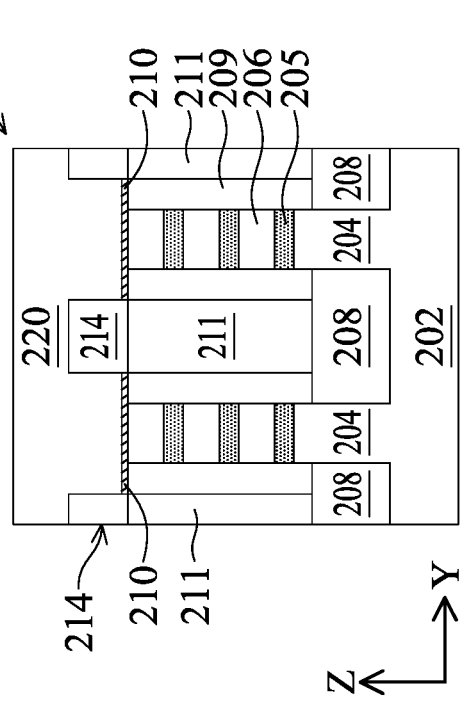
Figure 11:
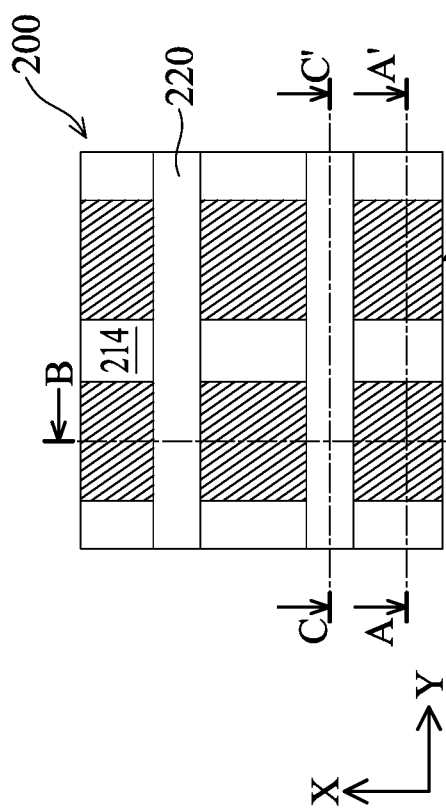
Figure 11B:
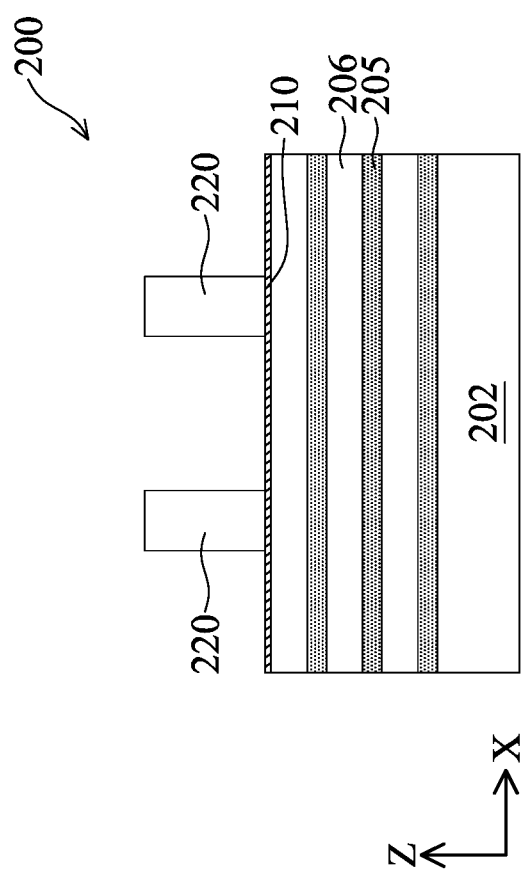

Referring to FIGS. 8, 8A and 8B, the method 100 recesses a top portion of the dielectric fins 211 in an etching process 802 to form trenches 212. The etching process 802 may include any suitable process, such as a dry etching process, a wet etching process, an RIE process, other suitable processes, or combinations thereof.

Referring to FIGS. 9, 9A and 9B, the method 100 forms the dielectric helmets 214 over the dielectric fins 211 at operation 108, thereby filling the trenches 212. In the present embodiments, at least a portion of the dielectric helmets 214 is configured to provide isolation for a subsequently-formed metal gate stack over the fins 204. In other words, at least a portion of the dielectric helmets 214 is configured to truncate (or cut) the metal gate stack into multiple portions. In some embodiments, while portions of the dielectric helmets 214 are removed (by etching, for example) before forming the metal gate stacks, remaining portions of the dielectric helmets 214 are kept intact in the device 200 and serve as isolation features for the later formed metal gate stack. The remaining portions of the dielectric helmets 214 are referred to as gate isolation features (or gate cut features).

In the present embodiments, the dielectric helmets 214 have an etching selectivity with respect to the dielectric fins 211 and the cladding layer 209. In some embodiments, the dielectric helmets 214 include silicon nitride (SiN), silicon carbide (SiC), oxygen-containing silicon nitride (SiON), oxygen-containing silicon carbide (SiOC), carbon-containing silicon nitride (SiCN), aluminum oxide ($Al_2O_3$), tetraethylorthosilicate (TEOS), doped silicon oxide (e.g., borophosphosilicate glass (BPSG), FSG, phosphosilicate glass (PSG), boron-doped silicate glass (BSG), etc.), a high-k dielectric material (having a k value greater than that of silicon oxide, which is about 3.9), other suitable materials, or combinations thereof. The high-k dielectric material may include oxygen, lanthanum, aluminum, titanium, zirconium, tantalum, other suitable materials, or combinations thereof. For example, the high-k dielectric material may include hafnium oxide ($HfO_2$), lanthanum oxide ($La_2O_3$), other high-k oxide materials, or combinations thereof. The dielectric helmets 214 can be single layered or multi-layered. In the present embodiments, the dielectric helmets 214 are each a single layer structure with uniform composition. Furthermore, referring to FIG. 9, the dielectric helmets 214 are oriented lengthwise parallel to the lengthwise direction of the fins 204 and are separated from the sidewalls of the fins 204 by the cladding layer 209.

Referring to FIGS. 10, 10A, and 10B, the method 100 removes a portion of the cladding layer 209, the hard mask 207 and the top oxide layer 213 over the fins 204 to expose the topmost channel layer 206. The remaining portions of the cladding layer has a top surface coplanar with a top surface of the exposed top channel layer 206. In some embodiments, the removing of the portion of the cladding layer 209, the hard mask 207, and the top oxide layer 210 may include one or more etching processes, such as a dry etching process, an RIE process, or combinations thereof. Thereafter, the method 100 forms a top oxide layer 210 over the exposed topmost channel layer 206 and the remaining portions of the cladding layer 209. The top oxide layer (also referred to as the fin top oxide layer) 210 protects the fins 204 underneath during subsequent processes. In some embodiments, the top oxide layer 210 includes silicon oxide ($SiO_x$, $1 \leq x \leq 2$). In some embodiments, the top oxide layer 210 is formed by a suitable method, such as thermal oxidation, chemical oxidation, and/or other suitable methods.

Referring to FIGS. 11, 11A-11C, the method 100 forms one or more dummy gate stacks (or replacement gate stacks) 220 at operation 110, over the top oxide layer 210 and the dielectric helmets 214. In the present embodiments, the dummy gate stacks 220 are replaced with metal gate stacks, which are truncated (or cut) by one or more of the dielectric helmets 214. The dummy gate stacks 220 may be formed by a series of deposition and patterning processes. For example, the dummy gate stacks 220 may be formed by depositing a polysilicon (poly-Si) layer over the substrate 202, and subsequently patterning the poly-Si layer via a series of photolithography and etching processes. To accommodate the patterning process and protect the dummy gate stacks 220 during subsequent fabrication processes, one or more hard mask layers (not depicted) may be formed over the dummy gate stacks 220 and later removed before removing the dummy gate stacks 220 to form the metal gate stacks. A region of the fins underneath the dummy gate stacks (and the gate spacers if present) are referred to as a channel region, while a remaining region of the fins 204 between the dummy gate stacks are referred to as an S/D region, as S/D features will be formed later in this region.

Figure 12A:
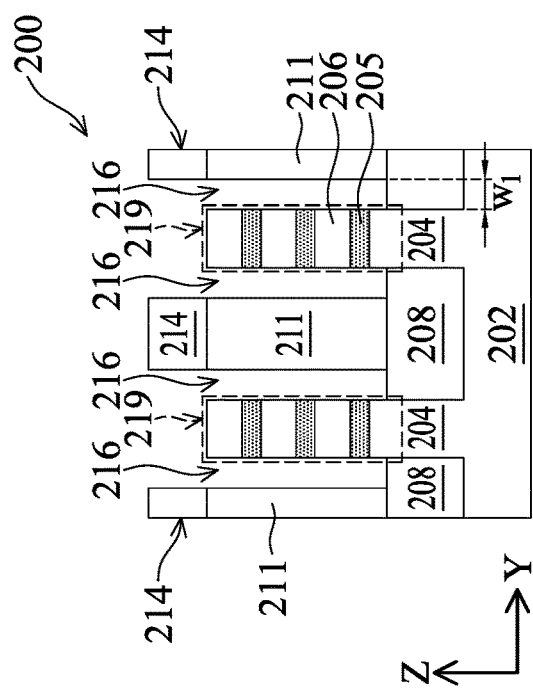
Figure 12C:
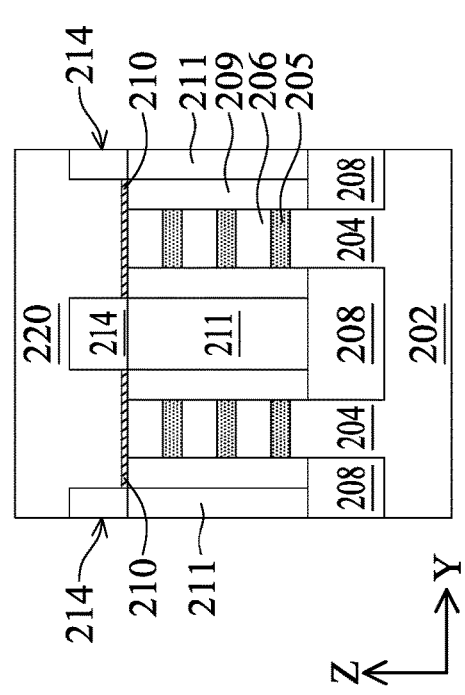
Figure 12:
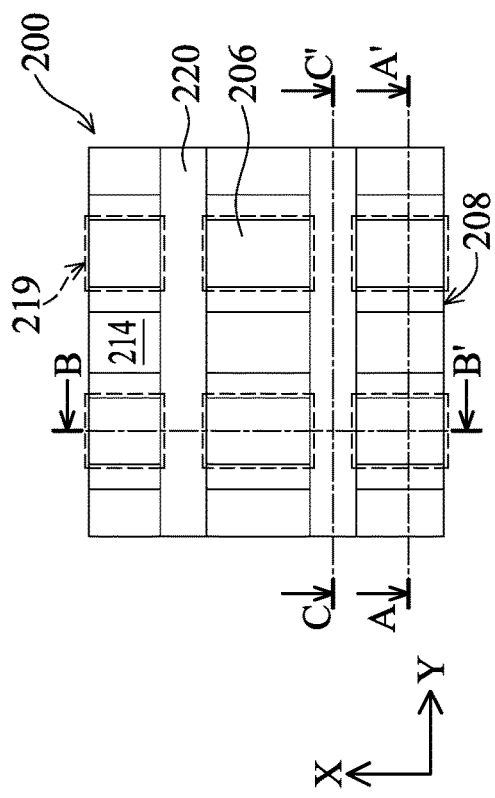
Figure 12B:
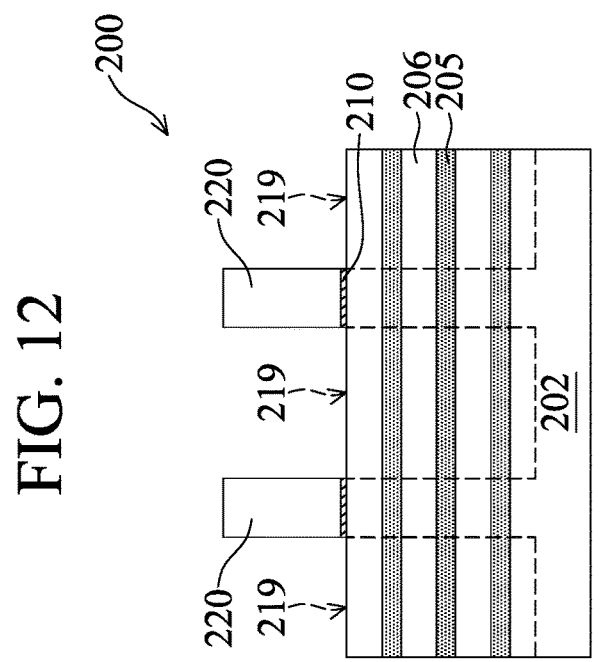
Figure 13A:
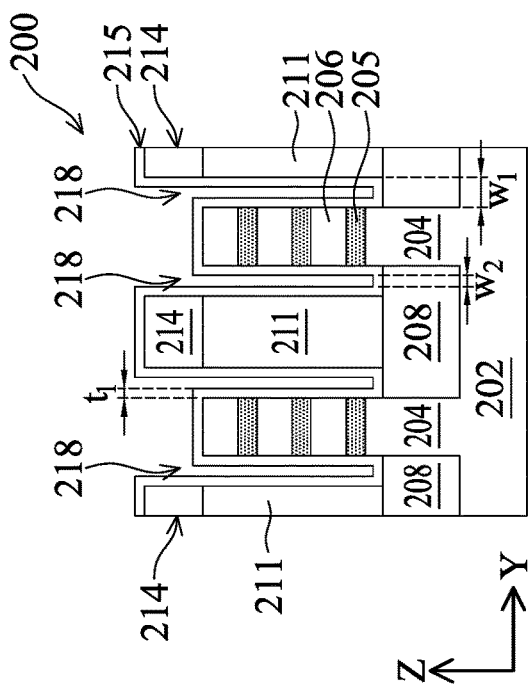
Figure 13C:
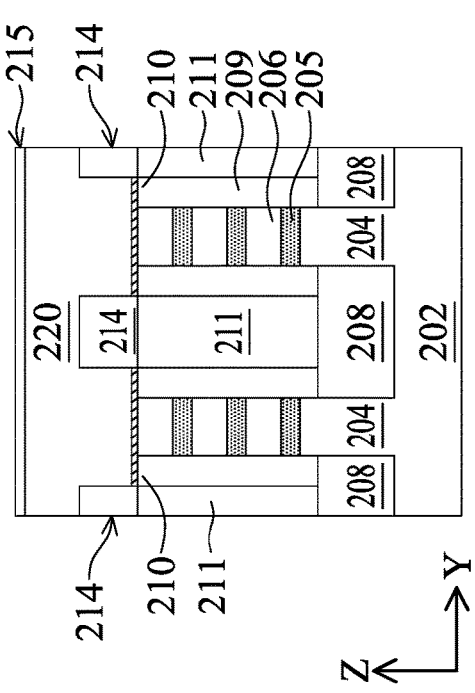
Figure 13:
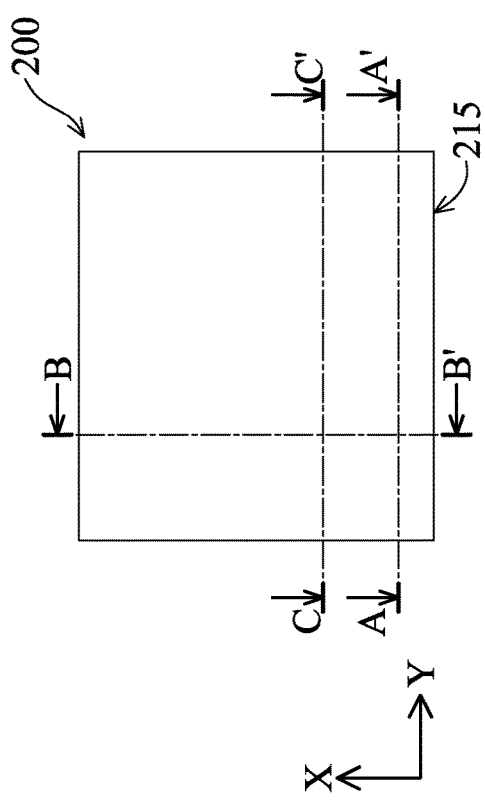
Figure 13B:
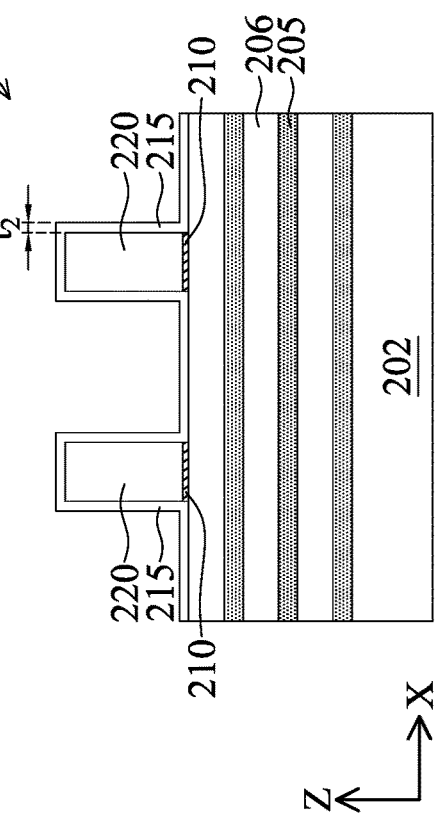

Referring to FIGS. 12 and 12A-12C, the method 100 forms lightly doped drain (LDD) features 219 in the fins 204 by implanting dopants at operation 112. The LDD features 219 are outlined by dotted rectangles as shown in FIGS. 12, 12A, and 12B. The LDD features are formed by utilizing the dummy gate stacks 220 as masks by a suitable process, such as ion implantation. In some embodiments, The LDD features 219 are configured to overcome hot-electron effect, especially at high operation voltage, by increasing the depletion width at the drain-channel junction. The LDD features 219 are doped with the same type of dopant as that of later formed S/D features 224 but with less dopant concentration.

The dopant type in the LDD features 219 is opposite to that of the channel region of the fins 204. For example, the LDD features 219 in an nFET is n-type doped while the channel region is p-type doped. In another example, the LDD features 219 in a pFET is p-type doped while the channel region is n-type doped. In some embodiments, the LDD features are formed on both nFET and pFET. It is understood, however, that the disclosure should not be limited to such configuration and may be applicable to other configurations. For example, the LDD features may be only formed on nFETs and not formed on pFETs, since the pFETs are less affected by the hot-electron effect due to the slower channel mobility of holes compared to electrons. In some embodiments, the LDD features may be formed in the drain region only by masking the source region. Alternatively, the source region can be doped at the same time to minimize the process complexity. The method 100 may further include an annealing process (e.g., rapid thermal annealing (RTA) and/or laser annealing) at an elevated temperature to activate the dopants and/or remove implantation damage to the fins 204 after the LDD implantation. In other embodiments, the LDD features 219 are optional and may be eliminated from the device 200.

Still referring to FIGS. 12, 12A-12C, the method 100 removes portions of the top oxide layer 210 and portions of the cladding layer 209 along the S/D regions of the fins 204 at operation 114, thereby forming trenches 216 along the sidewalls of the fins 204 and expose the isolation feature 208 and top surfaces of the fins 204. In the present embodiments, the portions of the cladding layer 209 in the S/D regions are removed as shown in FIG. 12A, while the portions of the cladding layer 209 under the dummy gate stacks 220 remain intact as shown in FIG. 12C. In some embodiments, the portions of the cladding layer 209 is removed by a selective etching process, in which the selected portions of the cladding layer 209 are removed without removing, or substantially removing, the surrounding components, such as the dielectric fins 211, the dielectric helmets 214, the channel layers 206, and the non-channel layers 205. In some embodiments, the etchant utilized to remove cladding layer 209 provides sufficient selectivity between the cladding layer 209, the hard mask 207, and the non-channel layers 205. In some embodiments, the trenches 216 each has a width $w_1$ ranging from about 10 nanometers to about 15 nanometers.

Referring to FIGS. 13 and 13A-13C, the method 100 forms a spacer layer 215 over the dummy gate stacks and the fins at operation 116, where the spacer layer 215 is formed conformally over the dummy gate stacks 220, the dielectric fins 211, and the dielectric helmets 214, thereby filling a portion of the trenches 216. The remaining portions of the trenches 216 after depositing the spacer layer 215 is referred to as trenches 218 hereafter. In the present embodiments, the spacer layer 215 is configured to have a thickness $t_1$ along the sidewalls of the fin and a thickness $t_2$ around the dummy gate stacks by manipulating the operation parameters of the formation process. In some embodiments, the thickness $t_2$ may be the same as the thickness $t_1$. Alternatively, in the present embodiments, the thickness $t_2$ is different from the thickness $t_1$. Specifically, the thickness $t_1$ is less than the thickness $t_2$ in the present embodiments. The narrower thickness $t_1$ allows wider width $w_2$ of the trenches 218, thereby wider airgaps in subsequent process. The thicker thickness $t_2$ provides robust device reliabilities. In the present embodiments, the thickness $t_1$ is about 35% to about 65% of the thickness $t_2$. In one example, thickness $t_1$ is about 3 nm to about 5 nm. In a different example, the thickness $t_2$ is about 3 nm to about 8 nm. In some embodiments, the thickness $t_1$ is over about 20% but less than about 50% of the width $w_1$, leaving the width $w_2$ being less than about 60% of the width $w_1$. In some embodiments, the spacer layer 215 is formed by performing a conformal deposition process, such as ALD and/or CVD. In the present embodiments, the spacer layer 215 is formed conformally over the device 200 using ALD. In some embodiments, the spacer layer 215 includes $SiO_x$ (1≤x≤2), SiN, SiC, SiON, SiOC, SiCN other suitable materials, or combinations thereof.

Referring to FIGS. 14 and 14A-14D, the method 100 forms a sacrificial spacer layer 217 over the spacer layer 215 at operation 118, thereby filling the trenches 218. In the present embodiments, the sacrificial spacer layer 217 includes a material different from that included in the spacer layer 215. In the present embodiments, the sacrificial spacer layer 217 includes a material that is easy to fill the trenches 218 and is more flowable than the spacer layer 215. In some embodiments, the sacrificial spacer layer 217 exhibits high etching selectivity, e.g., about 5 to about 20, with respect to the spacer layer 215. In the present embodiments, the sacrificial spacer layer 217 includes an oxide, a low-k material, other suitable materials, or combinations thereof. In some examples, the oxide includes $SiO_x$ (where 1≤x≤2) or flowable oxides (e.g., tetraethylorthosilicate (TEOS), doped silicon oxide (e.g., borophosphosilicate glass (BPSG), fluoride-doped silicate glass (FSG), phosphosilicate glass (PSG), boron-doped silicate glass (BSG), etc.). In some embodiments, the sacrificial spacer layer 217 includes an oxide and the spacer layer 215 includes SiN. In some embodiments, the sacrificial spacer layer 217 is formed by a method the same as or similar to that of forming of the spacer layer 215. In some embodiments, the sacrificial spacer layer 217 is formed by ALD, CVD, FCVD, SOG, other suitable methods, or combinations thereof.

Figure 15D:
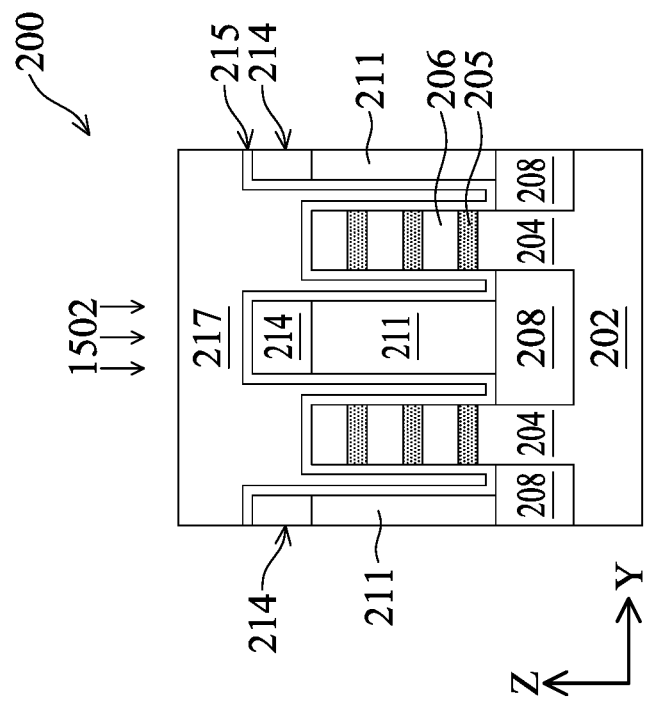
Figure 15C:
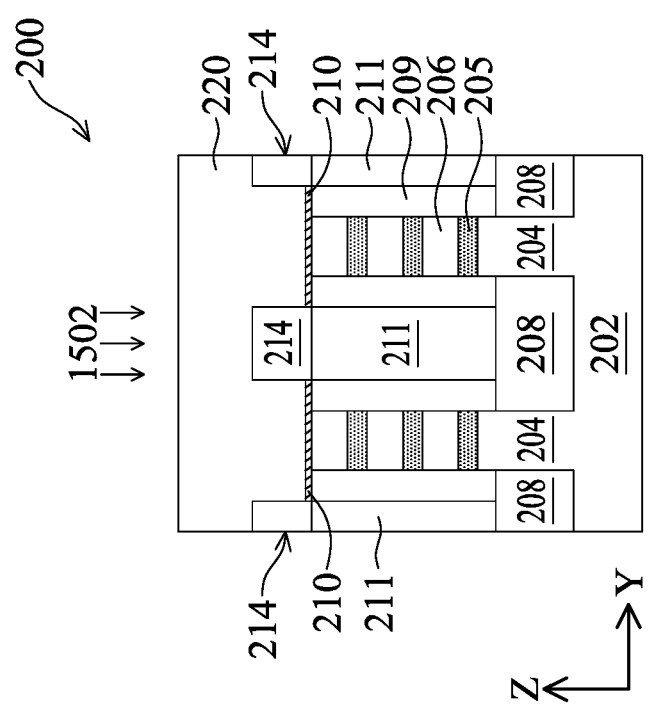
Figure 17:
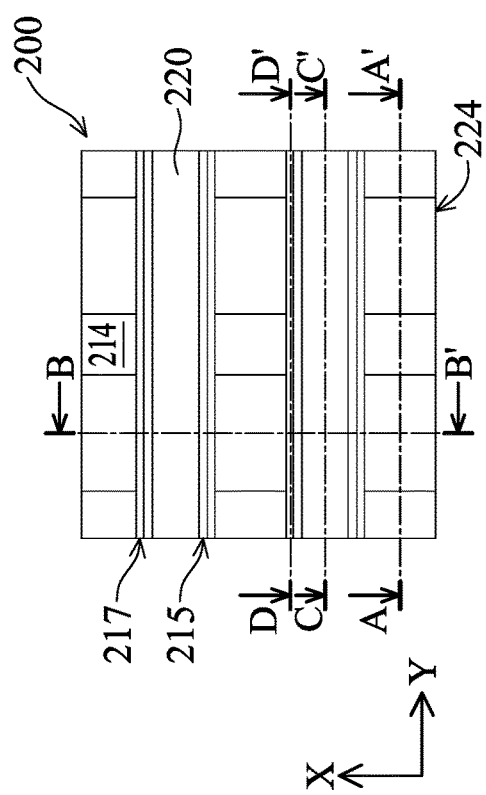
Figure 17B:
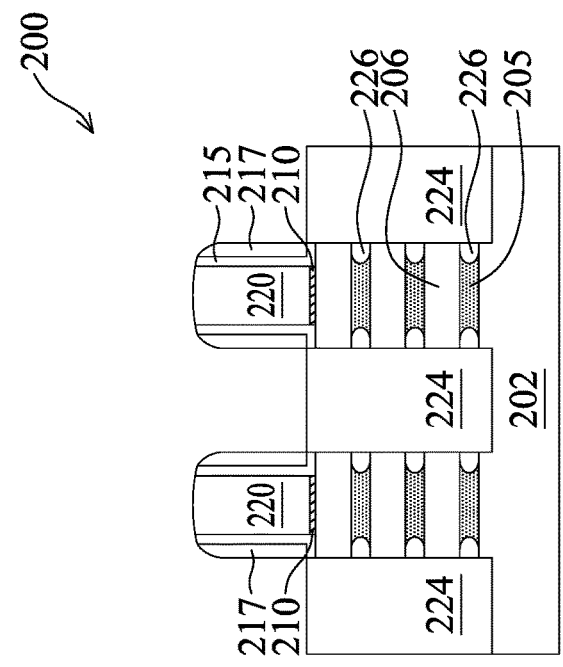
Figure 17A:
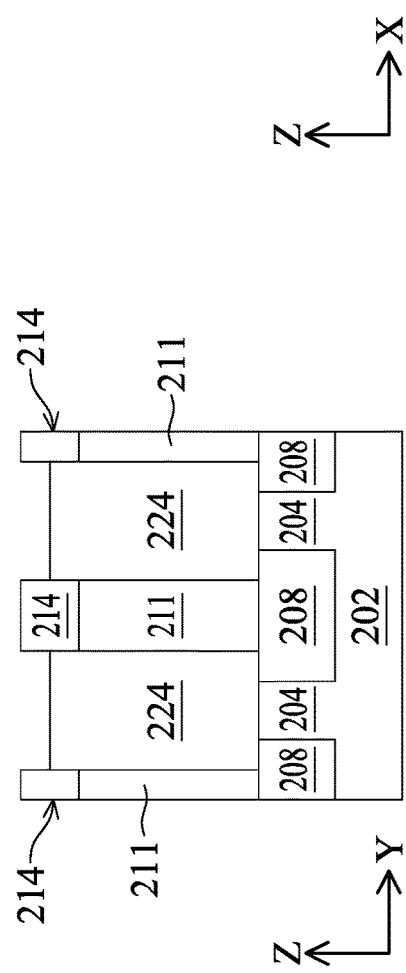
Figure 17D:
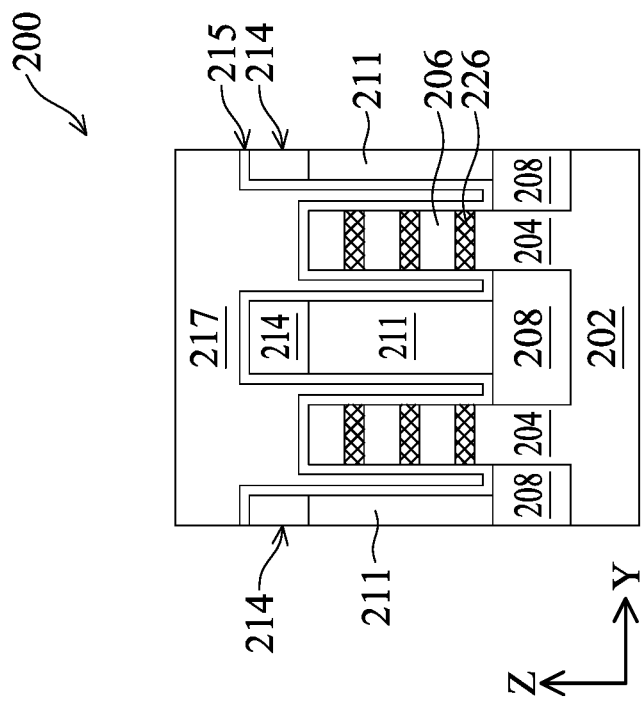
Figure 17C:
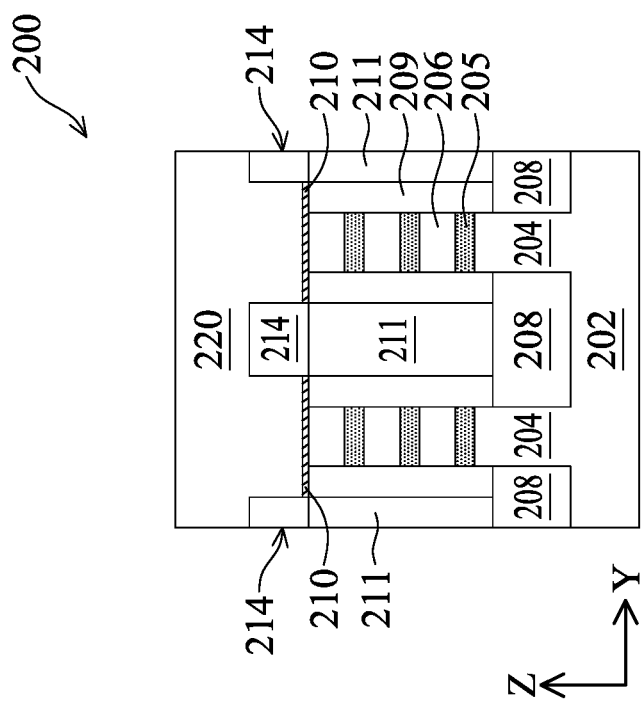
Figure 18D:
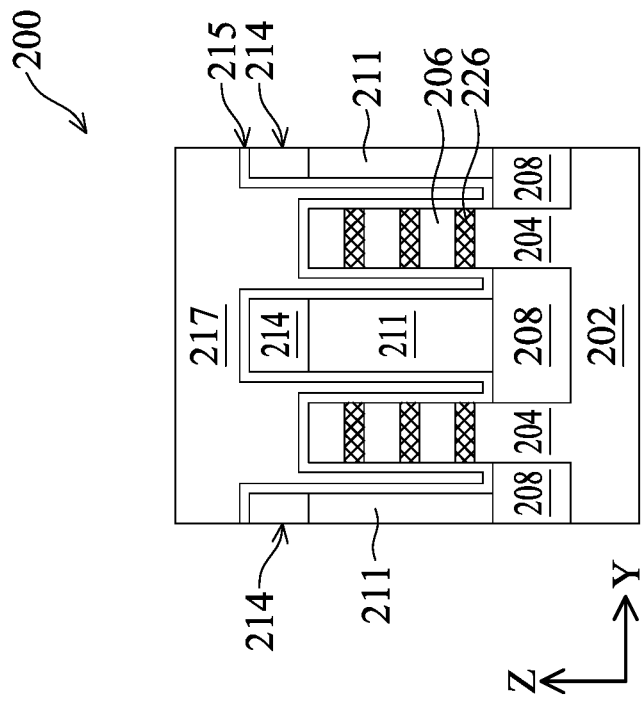
Figure 18C:
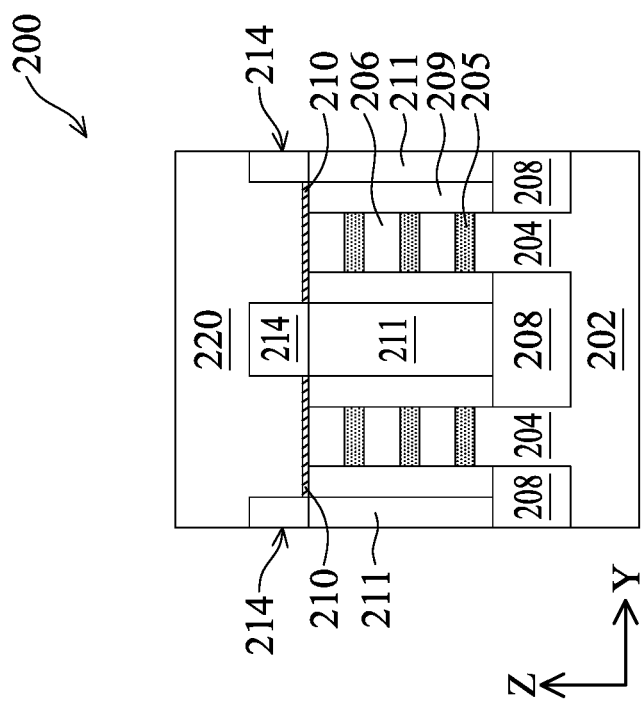

Referring to FIGS. 15 and 15A-15D, the method 100 removes portions of the spacer layer 215 and portions of the sacrificial spacer layer 217 at operation 120 utilizing an etching process 1502. The etching process 1502 removes the portions of the spacer layer 215 and the portions of the sacrificial spacer layer 217 over the dummy gate stacks 220, the fins 204, and the dielectric helmets 214, thereby exposing top surfaces of the dummy gate stacks 220, the dielectric helmets 214, and the fins 204. The remaining portions of the spacer layer 215 and the remaining portions of the sacrificial spacer layer 217 along sidewalls of the dummy gate stacks 220 and along the fins 204 remains intact, or substantially intact. In the present embodiments, the etching selectivity of each of the spacer layer 215 and the sacrificial spacer layer 217 with respect to the surrounding components (e.g., the dielectric helmets 214, the fins 204, and the dielectric fins 211) is about 5 to about 20. In some embodiments, the etching process 1502 includes wet etching, dry etching, or a combination thereof. In some embodiments, the etching process 1502 includes plasma bombardment. In the present embodiments, the etching process 1502 includes an anisotropic dry etching process. In the present embodiments, a thickness $t_3$ of the sacrificial spacer layer 217 over sidewalls of the dummy gate stacks 220 (with the spacer layer 215 therebetween) is about 35% to about 100% of the thickness $t_2$ as depicted in FIG. 15B. In one example, the thickness $t_3$ is about 3 nm to about 5 nm.

Referring to FIGS. 16 and 16A-16D, the method 100 forms S/D recesses 221 in the fins 204 adjacent to the dummy gate stacks 220 at operation 122. In the present embodiments, the method 100 implements an etching process that selectively recess (or removes) portions of the fins 204 in the S/D regions without removing, or substantially removing the surrounding components (e.g., the dummy gate stacks 220, the dielectric helmets 214, and the dielectric fin 211). In the present embodiments, as depicted in FIGS. 16 and 16A, the portions of the spacer layer 215 and the portions of the sacrificial spacer layer 217 in the S/D region was removed together with adjacent portions of the fins 204, while a remaining portion of the spacer layer 215 and the sacrificial spacer layer 217 over sidewalls of the dummy gate stack 220 remain intact, or substantially intact as depicted in FIGS. 16 and 16B. The remaining portions of the spacer layer 215 and the remaining portions of the sacrificial spacer layer 217 extend to the isolation feature 208 and wraps around the fins 204, the dielectric fins 211, and the dielectric helmets 214 as depicted in FIG. 16D. In some embodiments, the etching process is a dry or wet etching process employing a suitable etchant capable of removing Si (i.e., the channel layers 206) and SiGe (i.e., the non-channel layers 205) of the multi-layer stacks 201. In some non-limiting examples, a dry etchant may be a chlorine-containing etchant including $Cl_2$, $SiCl_4$, $BCl_3$, other chlorine-containing gas, or combinations thereof. In some embodiments, methods the same as or similar to these utilized in the etching process 1502 may be utilized to remove the portions of the spacer layer 215 and the portions of the sacrificial spacer layer 217 in the S/D region. A cleaning process may subsequently be performed to clean the S/D recesses with a hydrofluoric acid (HF) solution or other suitable solution.

Thereafter, still referring to FIGS. 16 and 16A-16D, the method 100 forms inner spacers (or referred to as inner gate spacer) 226 on sidewalls of the non-channel layers 205 that are exposed in the S/D recesses 221 at operation 124. The inner spacers 226 may be a single-layer structure or a multi-layer structure and may include silicon oxide, SiN, SiCN, SiOC, SION, SiOCN, a low-k dielectric material, air, a high-k dielectric material, hafnium oxide ($HfO_2$), lanthanum oxide ($La_2O_3$), other suitable dielectric material, or combination thereof. In some embodiments, the inner spacers 226 have a composition different from that of the spacer layer 215. Forming the inner spacers 226 includes performing a series of etching and deposition processes. For example, forming the inner spacers 226 may begin with selectively removing portions of the non-channel layers 205 without removing, or substantially removing, portions of the channel layers 206 to form inner spacer recesses (not depicted). The non-channel layers 205 may be etched by a dry etching process. Subsequently, one or more dielectric layers are deposited in the inner spacer recesses by any suitable method, such as ALD, CVD, physical vapor deposition (PVD), other suitable methods, or combinations thereof, followed by one or more etching processes to remove (i.e., etch back) excess dielectric layer(s) deposited on surfaces of the channel layers 206 that are exposed in the S/D recesses, thereby forming the inner spacers 226 as depicted in FIGS. 16B and 16D. In the present embodiments, a thickness t of the inner spacer layer is about the same as that of the sum of the thickness $t_2$ and the thickness $t_3$. In the present embodiments, a material of the inner spacer layer is different from that of the spacer layer 215.

Referring to FIGS. 17 and 17A-17D, the method 100 forms epitaxial S/D features (hereafter referred to as S/D features) 224 in the S/D recesses 221 at operation 126. For example, a semiconductor material is epitaxially grown from the recessed fins 204 in the S/D recesses 221, thereby forming the S/D features 224. An epitaxy process can use CVD deposition techniques (for example, VPE and/or UHV-CVD), molecular beam epitaxy, other suitable epitaxial growth processes, or combinations thereof. The epitaxy process can use gaseous and/or liquid precursors, which interact with the composition of recessed fins 204 and/or channel layers 206. The S/D features 224 are doped with n-type dopants and/or p-type dopants. In some embodiments, for n-type GAA transistors, S/D features 224 include silicon and are doped with carbon, phosphorous, arsenic, other n-type dopant, or combinations thereof (for example, forming Si: C S/D features, Si: P S/D features, or Si: C: P S/D features). In some embodiments, for p-type GAA transistors, S/D features include silicon germanium or germanium, and are doped with boron, other p-type dopant, or combinations thereof (for example, forming Si: Ge: B S/D features). In some embodiments, S/D features 224 include more than one epitaxial semiconductor layer, where the epitaxial semiconductor layers can include the same or different materials and/or dopant concentrations. In some embodiments, S/D features 224 include materials and/or dopants that achieve desired tensile stress and/or compressive stress in respective channel regions. In some embodiments, S/D features 224 are doped during deposition by adding impurities to a source material of the epitaxy process (i.e., in-situ). In some embodiments, S/D features 224 are doped by an ion implantation process subsequent to a deposition process. In some embodiments, annealing processes (e.g., rapid thermal annealing (RTA) and/or laser annealing) are performed to activate dopants in S/D features 224 and/or other S/D regions (for example, heavily doped S/D regions and/or lightly doped S/D (LDD) regions).

Thereafter, referring to FIGS. 18 and 18A-18D, the method 100 forms a contact etch-stop layer (CESL) 240 and an inter-layer dielectric (ILD) layer 242 over the device 200 at operation 128 to protect the underlying components (e.g., the S/D features 224) during subsequent fabrication processes. The CESL 240 may include any suitable dielectric material, such as SiN, SiCN, other suitable materials, or combinations thereof, and may be formed by CVD, ALD, PVD, other suitable methods, or combinations thereof. In the present embodiments, the CESL 240 provides etching selectivity with respect to its surrounding dielectric components to ensure protection against inadvertent damage to these components. Subsequently, still referring to FIGS. 18 and 18A-18D, the method 100 forms the ILD layer 242 over the CESL 240, thereby filling the space between adjacent dummy gate stacks 220. The ILD layer 242 may include silicon oxide, a low-k dielectric material, TEOS, doped silicon oxide (e.g., BPSG, FSG, PSG, BSG, etc.), other suitable dielectric materials, or combinations thereof, and may be formed by any suitable method, such as CVD, FCVD, SOG, other suitable methods, or combinations thereof. The method 100 subsequently performs one or more CMP process to expose top surfaces of the dummy gate stacks 220.

Figure 19D:
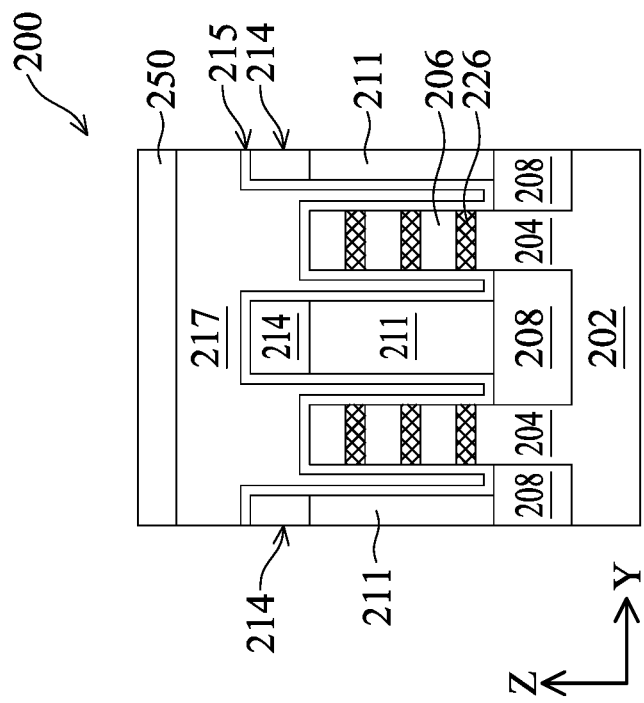
Figure 19C:
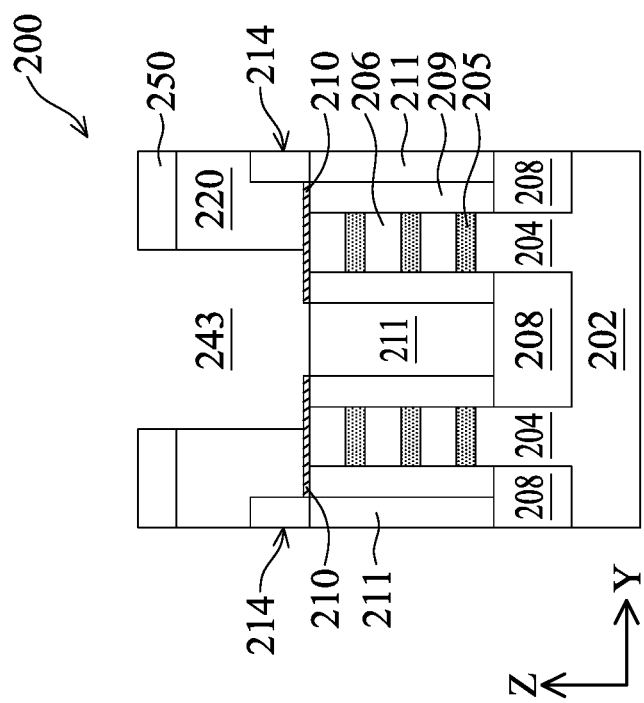
Figure 20D:
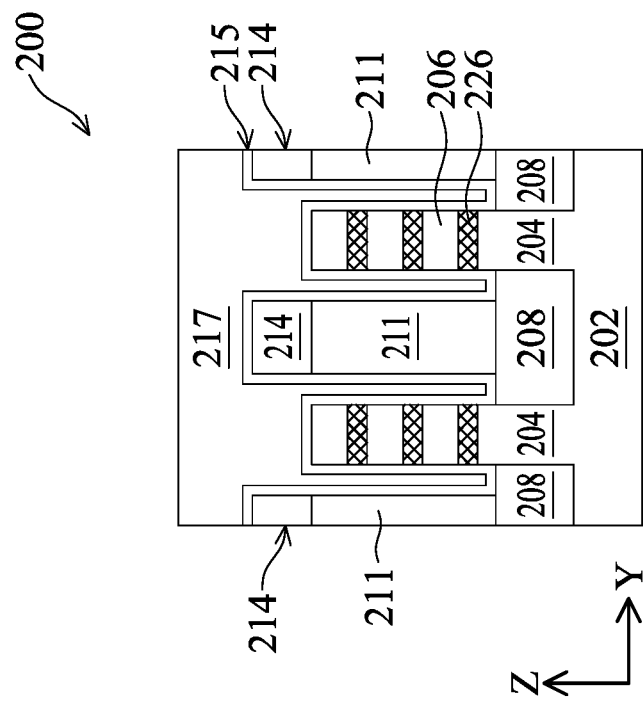
Figure 20C:
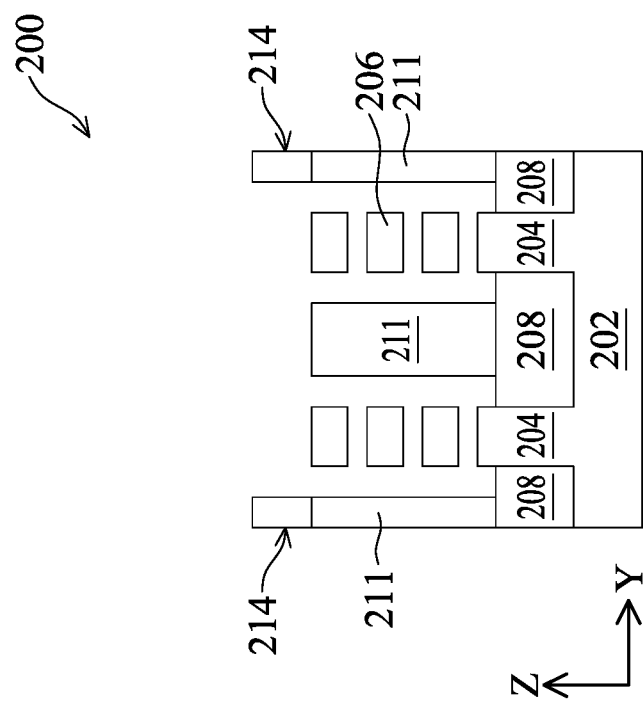

Referring to FIGS. 19, 19A to 19D, the method 100 patterns the dielectric helmets 214 to form gate isolation features at operation 130. The patterning of the dielectric helmets 214 includes performing a photolithography process to form a patterned masking element 250 over the dummy gate stacks 220, where portions of the dummy gate stacks 220 over portions of the dielectric helmets 214 to be removed are exposed in openings 243 of the patterned masking element 250. It is noted that the dielectric helmets 214 may have a dimension smaller than the line width limit of the photolithography process. In this regard, each of the openings 243 of the patterned masking element 250 is wider than each of the dielectric helmets 214 to accommodate the dimensions of the dielectric helmets 214. The patterning of the dielectric helmets 214 then proceeds to removing the portions of the dummy gate stacks 220 exposed in the openings 243 and thereby extending the openings 243 to expose the portions of the dielectric helmets 214 to be removed. Remaining portions of the dummy gate stacks 220 are subsequently used as a mask for removing the portions of the dielectric helmets 214 exposed in the extended openings 243. The patterned dielectric helmets 214 (e.g., the dielectric helmets 214 as depicted in FIG. 19C) may then serve as the gate isolation features (or gate cut features) in subsequent metal gate formation process. After patterning the dielectric helmets 214, the patterned masking element 250 is removed from the device 200 by any suitable method, such as plasma ashing and/or resist stripping.

Figure 21D:
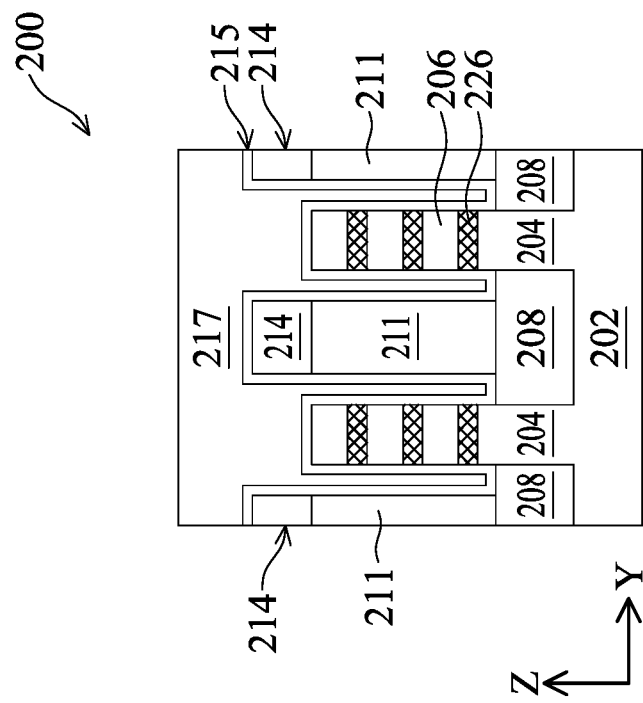
Figure 21C:
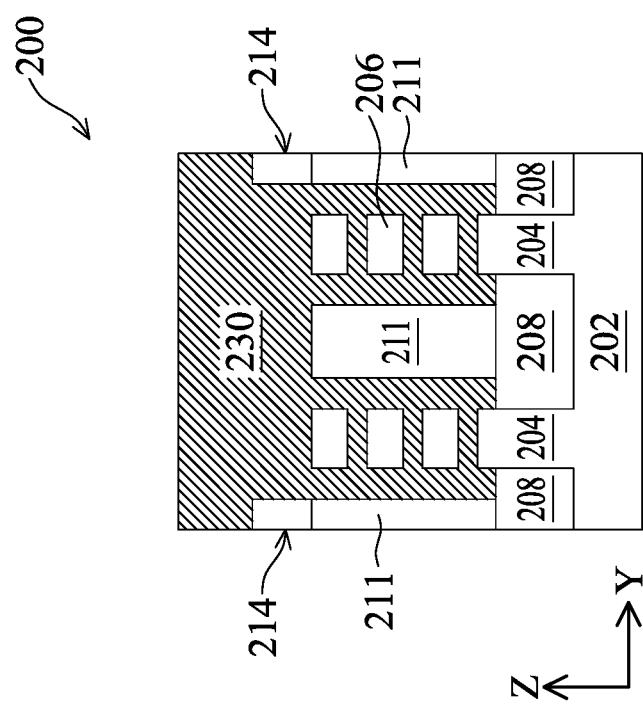
Figure 22C:
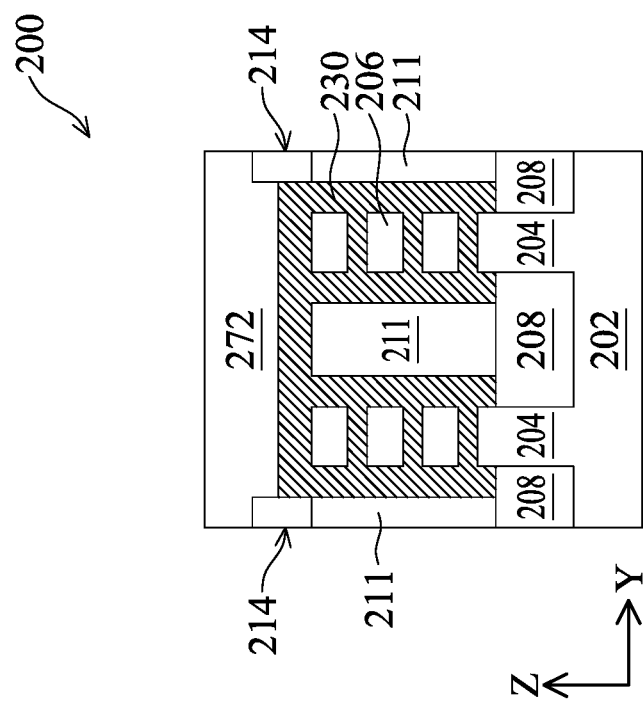
Figure 22D:
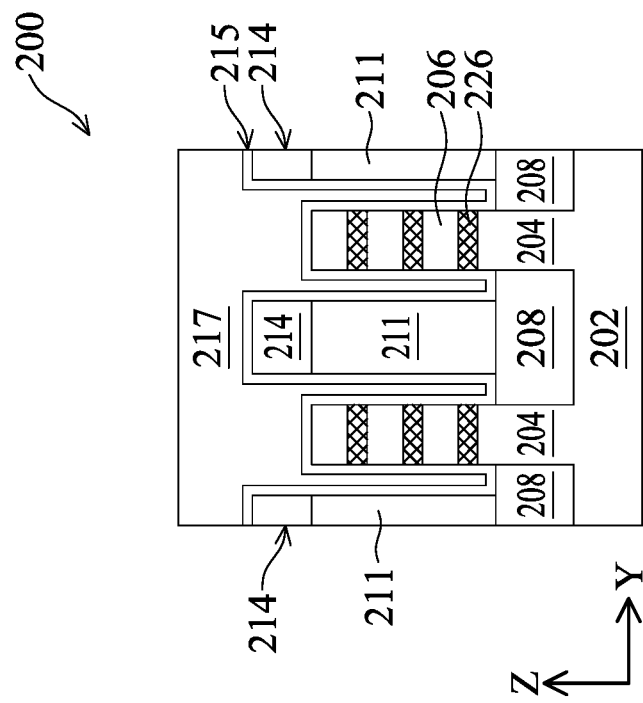
Figure 23D:
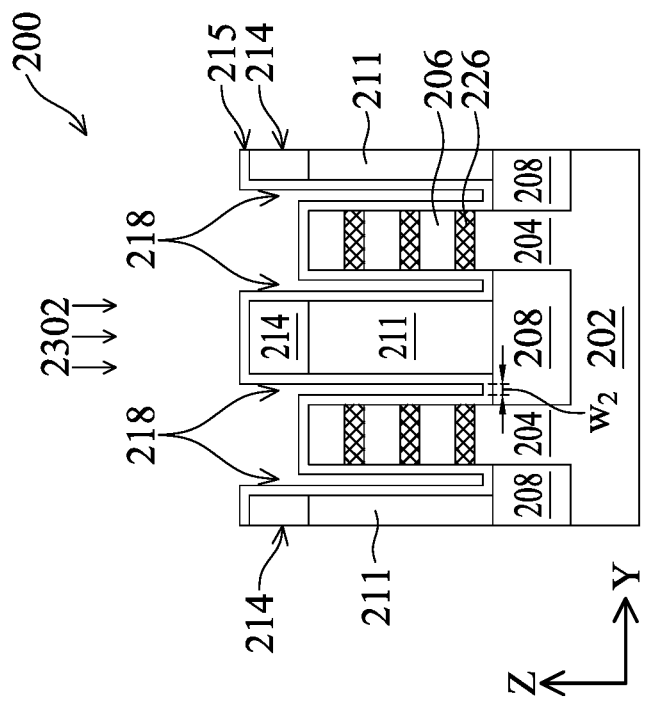
Figure 23C:
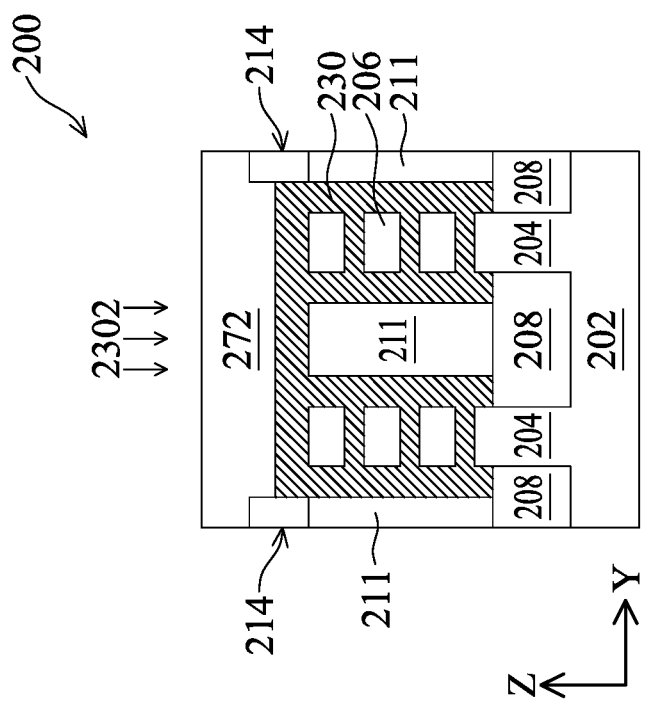

Referring to FIGS. 20-21D, the method 100 replaces the dummy gate stacks 220 and the non-channel layers 205 with metal gate stacks 230 at operation 132, where the metal gate stacks 230 are separated by the patterned dielectric helmets (or gate isolation features) 214. In some embodiments, the top oxide layer 210 under the dummy gate stacks 220 is removed in an etching process prior to the gate replacement process. The operation 132 includes removing the remaining portions of the dummy gate stacks 220 to form gate trenches; removing the non-channel layers 205 from the multi-layer stacks 201 to form openings between the channel layers 206 in a sheet formation, or sheet release, process, where the cladding layer 209 (e.g., having the same elements as the non-channel layers 205 as explained above) on sidewalls of the multi-layer stacks 201 may be removed together with the non-channel layers 205 using an etchant different from that used in the operation 114; and forming metal gate stacks 230 in the gate trenches and the openings (as depicted in FIGS. 21 and 21A-21D), such that each metal gate stack 230 wraps around (or is interleaved with) each channel layer 206 as depicted in FIGS. 21B and 21C.

In the present embodiments, the metal gate stack 230 includes a gate dielectric layer (not depicted separately) and a metal gate electrode (not depicted separately) over the gate dielectric layer (not depicted separately). The gate dielectric layer may include a high-k dielectric material, such as $HfO_2$, $La_2O_3$, other suitable materials, or combinations thereof. The metal gate electrode includes at least one work function metal layer and a bulk conductive layer disposed thereover. The work function metal layer may be a p-type or an n-type work function metal layer. Example work function metals include titanium nitride (TiN), tantalum nitride (TaN), ruthenium (Ru), molybdenum (Mo), tungsten (W), platinum (Pt), titanium (Ti), aluminum (Al), tantalum carbide (TaC), tantalum carbide nitride (TaCN), tantalum silicon nitride (TaSiN), titanium silicon nitride (TiSiN), other suitable work function metals, or combinations thereof. The bulk conductive layer may include Cu, W, Al, Co, Ru, other suitable materials, or combinations thereof. The metal gate stack 230 may further include other material layers (not depicted), such as an interfacial layer disposed on surfaces of the channel layers 206, a capping layer, a barrier layer, other suitable layers, or combinations thereof. Various layers of the metal gate stack 230 may be formed by various methods, including ALD, CVD, PVD, plating, other suitable methods, or combinations thereof. After forming the bulk conductive layer, one or more CMP processes are performed to remove excessive material formed on top surface of the ILD layer 242, thereby planarizing the device 200.

Thereafter, referring to FIGS. 22 and 22A-22D, the method 100 recesses the metal gate stack 230, such that a top surface of the recessed metal gate stack 230 is below a top surface of the remaining dielectric helmets 214. The remaining dielectric helmets 214 (e.g., the dielectric helmets 214 in FIG. 22C) truncate (or separate) the recessed metal gate stacks 230 into suitable lengths. In some embodiments, the etching process includes any suitable method, such as ALD, CVD, PVD, other suitable methods, or combinations thereof. The method 100 subsequently forms a self-aligned cap (SAC) 272 over the device 200, thereby filling the gaps between the spacer layer 215. In some embodiments, the SAC 272 is configured to provide etching selectivity during subsequent fabrication processes including, for example, patterning the ILD layer 242 to form S/D contact openings over the S/D features 224. Accordingly, the SAC 272 has a composition different from that of the ILD layer 242. In some embodiments, the SAC 272 includes SiN, SiCN, SiOC, SiON, SiOCN, other suitable materials, or combinations thereof. The SAC 272 may be deposited by any suitable method, such as ALD, CVD, PVD, other suitable methods, or combinations thereof. Subsequently, the method 100 removes portions of the SAC 272 formed over the ILD layer 242 in one or more CMP process, thereby planarizing the top surface of the device 200.

Referring to FIGS. 23 and 23A-23D, the method 100 removes the sacrificial spacer layer 217 at operation 134 utilizing an etching process 2302, thereby re-exposing the trenches 218 and forming trenches 281 between the spacer layer 215 and the CESL 240. Each of the trenches 281 carries the thickness $t_3$ of the sacrificial spacer layer 217 between the spacer layer 215 and the CESL 240. The trenches 281 extends downwards and connects with the trenches 218 to wrap around the fins 204, the dielectric fins 211, and the dielectric helmets 214. The trench 218 carries the width $w_2$ between a portion of the spacer layer 215 on a sidewall of the fins 204 and a portion of the spacer layer 215 on an adjacent sidewall of the dielectric fins 211. A selectivity in the etching process 2302 between the sacrificial spacer layer 217 with respect to the spacer layer 215 (and other surrounding components, such as the dielectric helmets 214 or the CESL 240) is about 5 to about 10. In some embodiments, the process 2302 includes dry etching, wet etching, RIE, and/or other suitable processes.

Figure 24D:
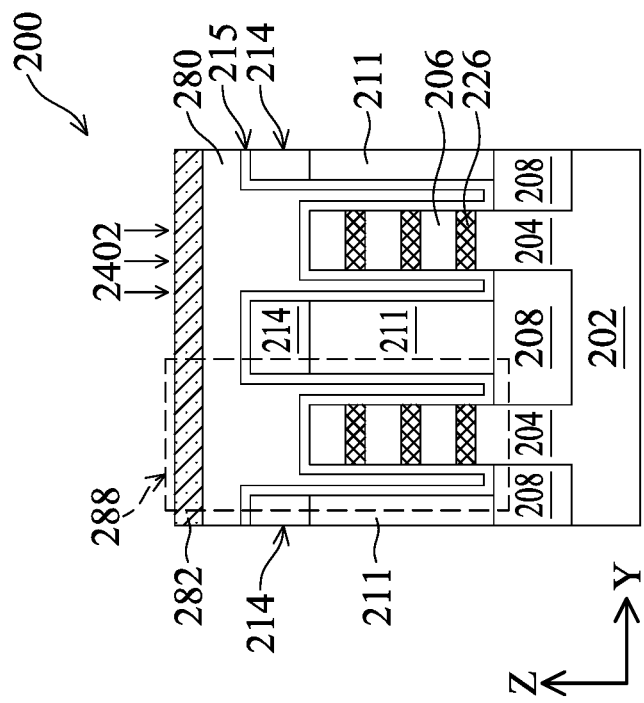
Figure 24C:
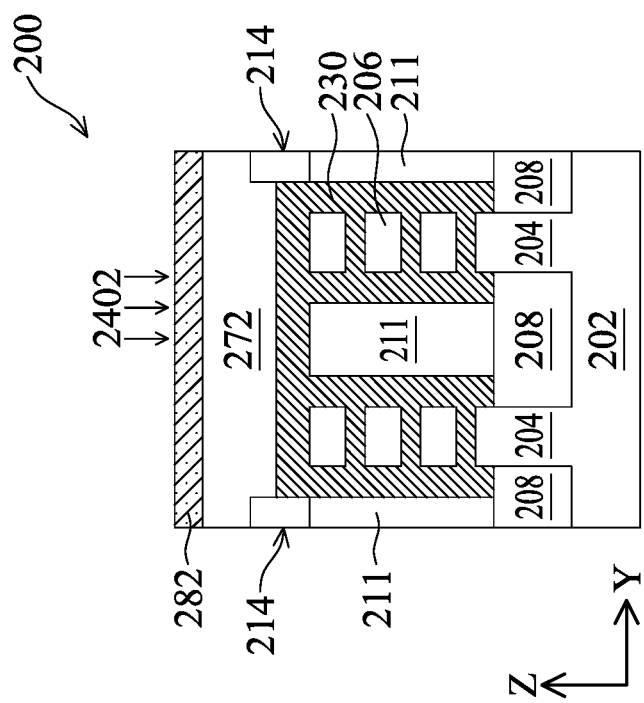

Referring to FIGS. 24 and 24A-24D, the method 100 forms a sealing layer 282 in process 2402 over the ILD layer 242 and the SAC 272 at operation 136, thereby sealing the top of the trenches 281 to form air gap 280. The air gap 280 includes the trenches 281 between the CESL 240 and the spacer layer 215 along sidewalls of the dummy gate stacks 220, the trenches 218 between the fins 204 and the dielectric fins 211, and the spaces over the fins 204 and the dielectric helmets 214 where the trenches 281 connects the trenches 218 as depicted in FIG. 24D. The sealing layer 282 is disposed over and supported by the ILD layer 242, the CESL 240, and the spacer layer 215. In the present embodiments, the sealing layer includes materials that are different from the materials included in the inner spacers 226 and the spacer layer 215. In some embodiments, the sealing layer includes SiN, $SiO_2$, and $Al_2O_3$. In some embodiments, the scaling layer is formed in the process 2402 by any suitable method, such as CVD, ALD, PVD, and/or other suitable processes. In some embodiments, the deposition rate of the process 2402 can be controlled by selecting different method applicated. In some embodiments, the parameters of the process 2402, such as process temperature, chemical concentrations, and/or chemical flow rates can be controlled to adjust the deposition rate of the sealing layer 282. A CMP process may be performed to remove excess portions of the sealing layer 282 to form a flat top surface for further processing.

Figures 1, 24B:
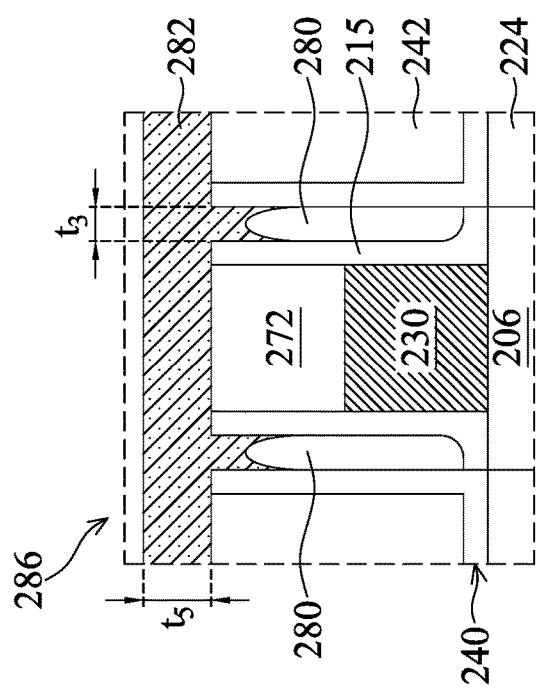
Figures 3, 24B:
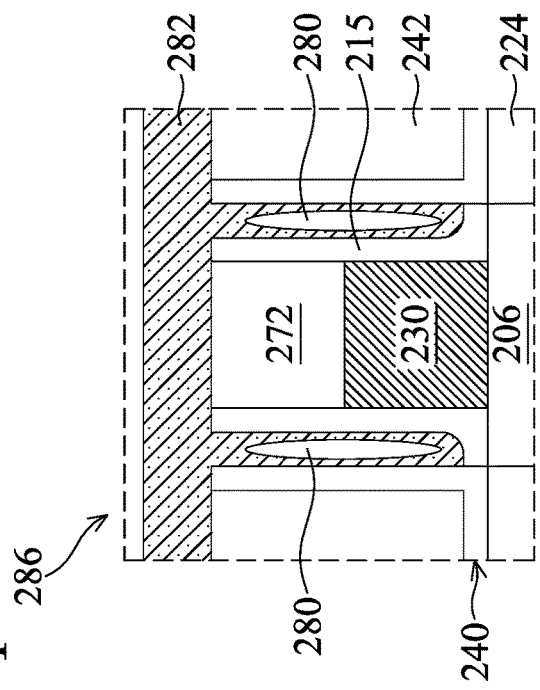

A portion of the sealing layer 282 may be formed inside the trenches 281, thereby filling a top portion of trenches 281 as depicted in FIG. 24B. A portion 286 of the device 200 as shown in FIG. 24B is enlarged in FIGS. 24B-1, 24B-2, and 24B-3 to illustrate alternative embodiments of the device 200 during intermittent steps of the method 100. In some embodiments, a thickness $t_5$ of the sealing layer 282 is greater than or equal to the thickness $t_3$. In one such embodiment, the thickness $t_5$ is about 1 to about 3.5 times of the thickness $t_3$. For example, the thickness $t_5$ is about 5 nm to about 10 nm, while the thickness $t_3$ is about 3 nm to about 5 nm. If the thickness $t_5$ is less than the thickness $t_3$, the sealing layer may not be able to bridge the spacer layer 215 and the CESL 240 and fail to seal the air gap 280.

In the example depicted in FIG. 24B-1, only a small amount of the sealing layer 282 is formed at the top portion of the trenches 281 by selecting suitable methods and/or controlling the parameters of the process 2402. For example, the process 2402 of the embodiments depicted in 24B-1 includes a fast deposition process by CVD or PVD using a higher temperature, higher chemical concentrations, and/or higher flow rates compare to the examples depicted in FIGS. 24B-2 and 24B-3. In the present embodiments, the portion of the sealing layer 282 in the trenches 281 is connected to the portion of the sealing layer 282 over the ILD layer 242, such that the air gap 280 is enclosed by and in direct contact with the spacer layer 215, the CESL 240, and the scaling layer 282. Such configuration provides the greatest air gap volume (or area) compared to the configurations depicted in FIGS. 24B-2 and 24B-3.

Figures 2, 24B:
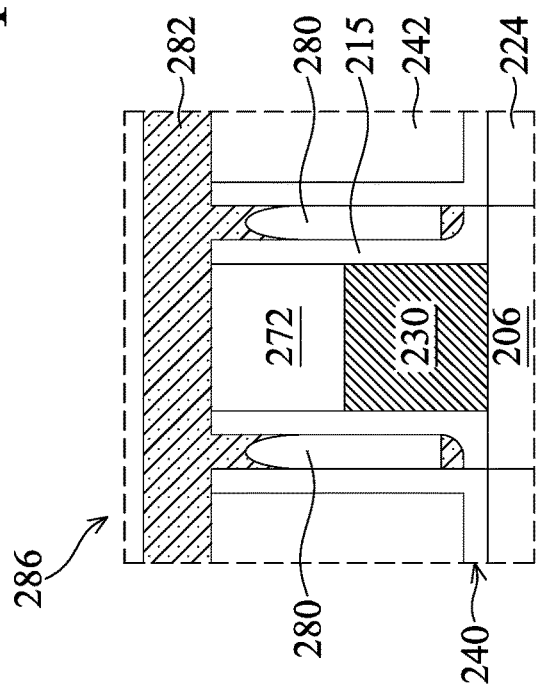
Figures 2, 24D:
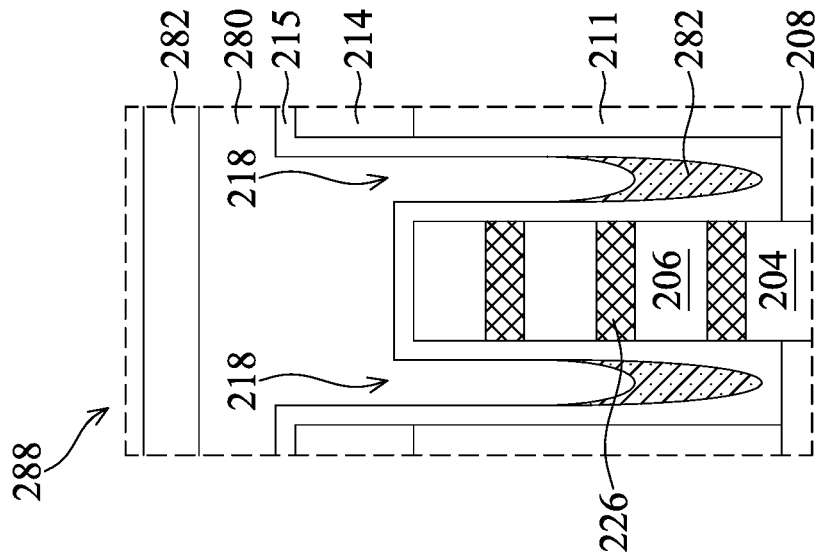
Figures 1, 24D:
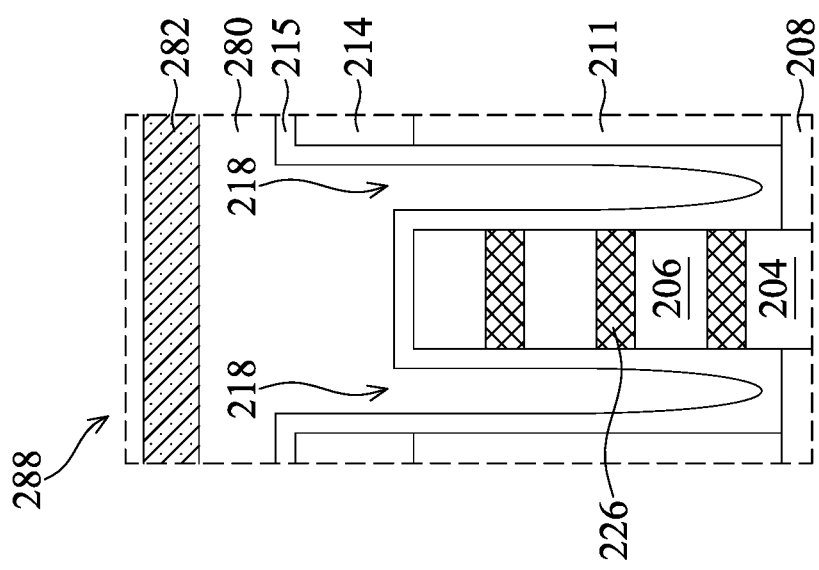
Figures 4, 24D:
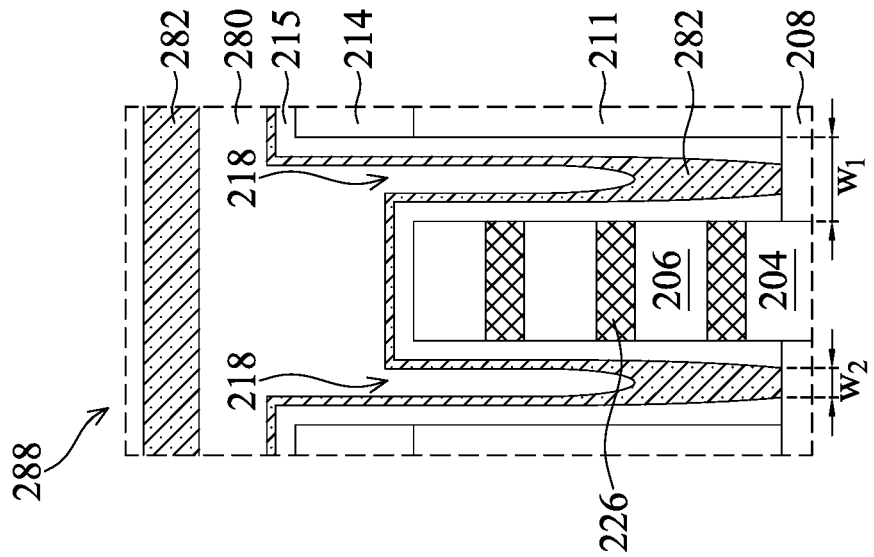
Figures 3, 24D:
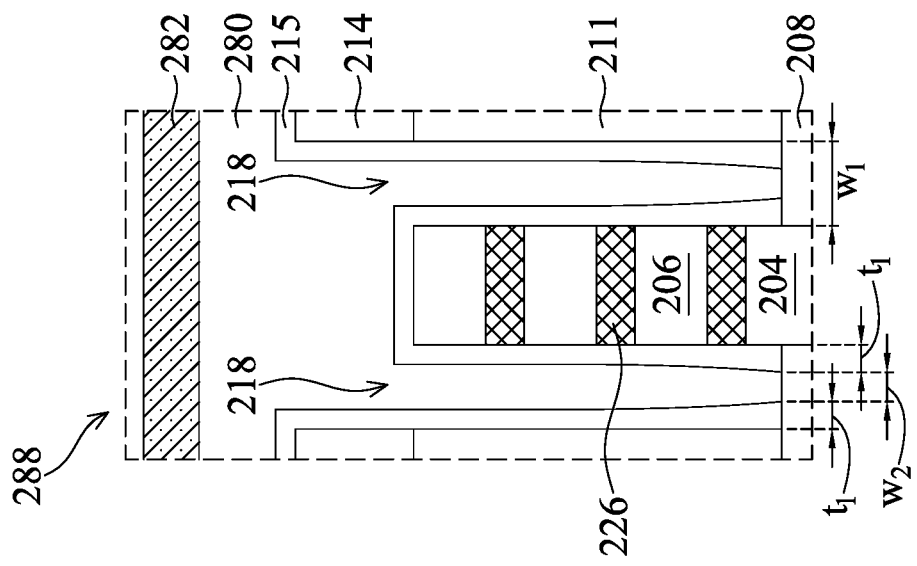
Figure 25D:
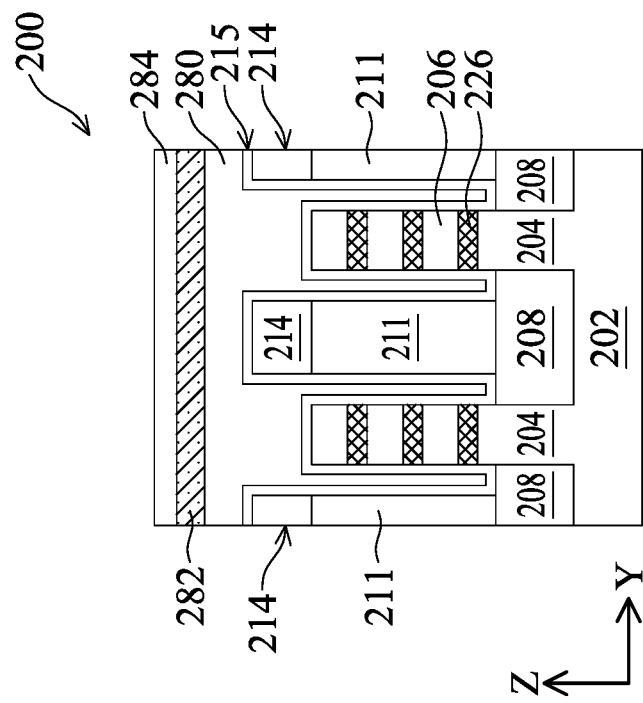
Figure 25C:
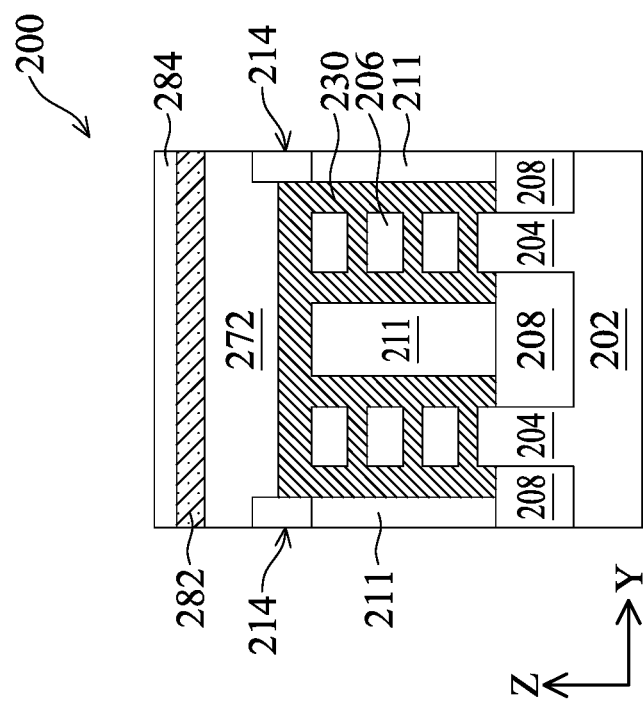
Figure 26D:
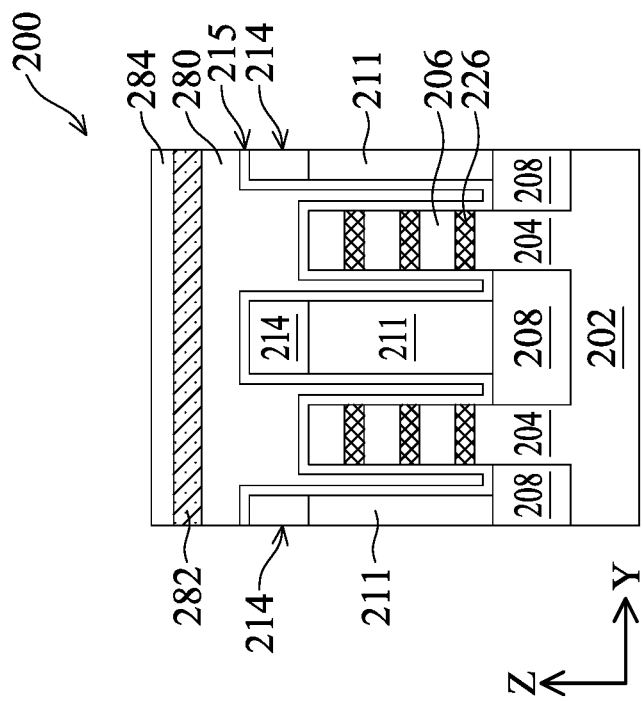
Figure 26C:
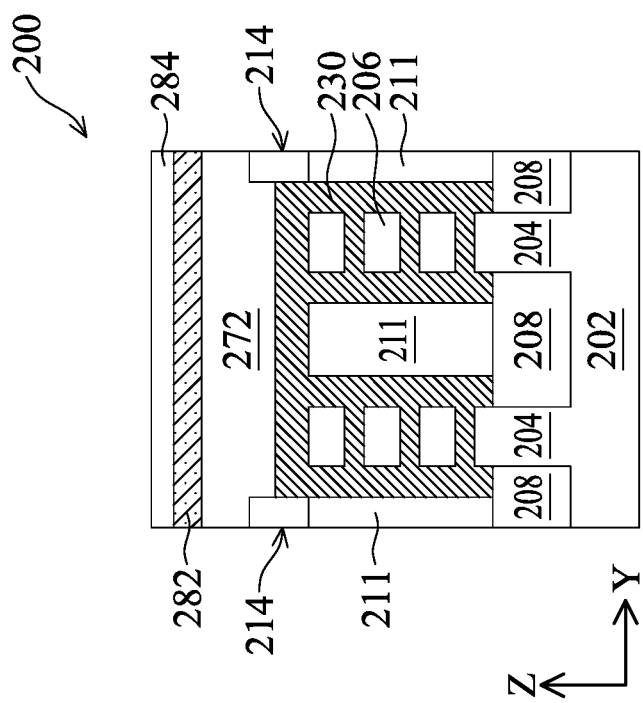

In the example depicted in FIG. 24B-2, by controlling the method and/or parameters of the process 2402 (e.g., flow rates or concentrations of the chemicals and/or operation temperatures), the sealing layer is not only formed at the top portions of the trenches 281, but also at the bottom portions of the trenches 281. For example, the parameters of the process 2402 is controlled such that a slower deposition (compare to the embodiments depicted in FIG. 24B-1) is performed to form the portion of the sealing layer 282 at the bottom of the trenches 281 without sealing the trenches 281, a fast deposition is followed to seal the trenches 281. In some embodiments, a first method with a slower deposition rate is used to deposit the portion at the bottom of the trenches 281, and a second method different from the first method is followed to seal the trenches 281. In one example, the first method is ALD and the second method is CVD or PVD. In the present embodiments, the portions of the scaling layer 282 at the bottom of the trenches 281 are separated from the portion at the top of the trenches 281. The portions at the bottom of the trenches 281 serve as an extra padding layer to prevent current leakage between the S/D features 224 and the metal gate stack 230 in case of misalignments.

In the example depicted in FIG. 24B-3, the method and/or parameters of the operation 2402 is controlled such that the scaling layer 282 covers the CESL 240 and the spacer layer 215 in the trenches 281. For example, the process 2402 utilizes a first method to slowly deposit the scaling layer 282 over the sidewalls of the trenches 281 followed by a second method different from the first method to quickly seal the trenches 281. In some embodiments, the first method is ALD and the second method is CVD or PVD. In some embodiments, the process 2402 utilizes one deposition method (e.g., CVD or PVD) including a prolonged slow deposition followed by a fast deposition to seal the trenches 281. In some embodiments, the prolonged slow deposition deposits portions of the sealing layer over the sidewalls of the trenches 281, thereby covering the CESL 240 and the spacer layer 215 to enclose the air gap 280 in the sealing layer 282. The rate of the prolonged slow deposition is slower than that used to deposit the sealing layer 282 at the bottom of the trenches 281 in the embodiments depicted in FIG. 24B-2. The subsequent fast deposition has a similar rate as the embodiments depicted in FIG. 24B-1 to seal the trenches 281. Such configuration as depicted in FIG. 24B-3 provides more reliable isolation between the metal gate stacks 230, the S/D feature 224, and the later formed S/D contact 290 due to the additional scaling layer 282 in the trenches 281. In the present embodiments, the air gap 280 is enclosed by the sealing layer 282 as depicted in the FIG. 24B-3 in the trenches 281.

A portion 288 of the device 200 as shown in FIG. 24D is enlarged and depicted in FIGS. 24D-1, 24D-2, 24D-3, and 24D-4 to illustrate example embodiments of the device 200 during intermittent steps of the method 100. In the example depicted in FIG. 24D-1, the portion of the spacer layer 215 over the fins 204 and the dielectric fins 211 may be free of the sealing layer 282 by controlling the method and/or process parameters of the process 2402, such that the air gap 280 is scaled at the top of the trenches 281 without depositing any of the sealing layer 282 in the trenches 218. In the present embodiments, the air gap 280 contacts the spacer layer 215 in the trenches 218. In some embodiments, the method and operation parameters of the process 2402 used in the embodiments depicted in FIG. 24D-1 is the same as or similar to that used in the embodiments depicted in FIG. 24B-1. It is noted that in the present embodiments, the spacer layer 215 covers the isolation feature 208 by controlling the end point of the etching process 1502 as depicted in FIGS. 15, and 15A-15D.

Alternatively, as depicted in FIG. 24D-2, a portion of the sealing layer 282 may be deposited over the spacer layer 215 in trenches 218. In the present embodiments, the air gap 280 contacts the sealing layer 282 and the spacer layer 215 in the trenches 218. In the present embodiments, the method and/or operation parameters of the process 2402 used in the embodiments depicted in FIG. 24D-2 are the same as or similar to that used in the embodiments depicted in FIG. 24B-2.

Figure 4:
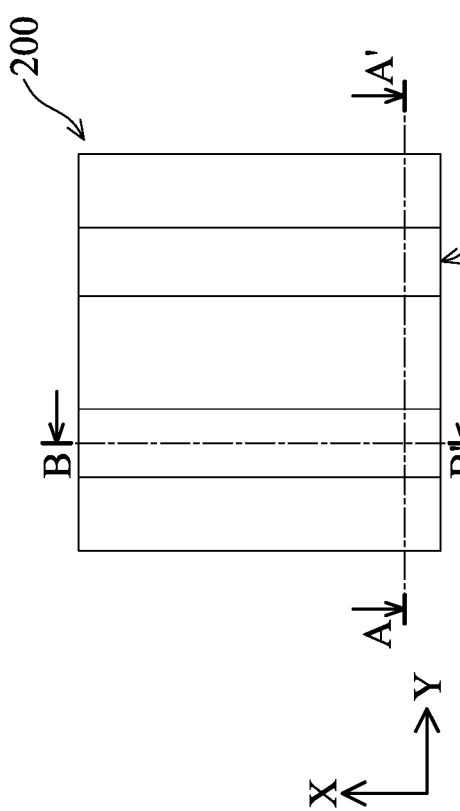
Figure 4B:
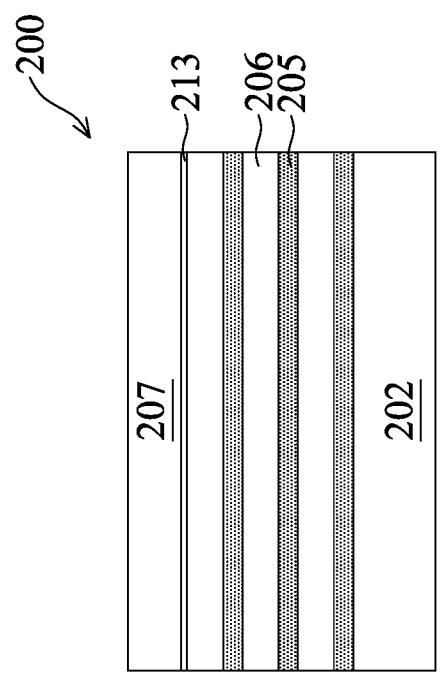

Referring to FIGS. 24D-3 and 24D-4, the portion of the spacer layer 215 over the isolation feature 208 in the trenches 218 may be removed in etching process 1502, thereby expanding the trenches 218 to the isolation feature 208 to further reduce parasitic capacitance. In other words, the isolation feature 208 exposes in the air gap 280. The portions of the isolation feature 208 exposed in the air gap 280 carries the width $w_2$. In some embodiments, the width $w_2$ is about 10% to about 90% of the width $w_1$. In one such embodiment, the width $w_2$ is about 1 nm to about 8 nm. In an alternative embodiment, the width $w_1$ is about 10 nm to about 15 nm. If the width $w_2$ is too big (e.g., over 90% of the wide $w_1$), the spacer layer 215 might be too thin to sufficiently protect the metal gate 230 from shorting with surrounding components (e.g., the S/D features 224). On the other hand, if the width $w_2$ is too small (e.g., less than about 10% of the width $w_1$), the effectiveness of the air gap 280 may not be obvious. In the example depicted in FIG. 24D-3, the trenches 218 may be free of the sealing layer 282 by controlling the method and parameters of the process 2402 (the same as or similar to the embodiments depicted in FIG. 24D-1). In the present embodiments, the air gap 280 is enclosed by the spacer layer 215 and the isolation feature 208 in the trenches 218.

Alternatively, as depicted in FIG. 24D-4, a portion of the sealing layer 282 may be deposited over the spacer layer 215 and the isolation feature 208 by controlling the method and the parameters of the process 2402. In some embodiments, the sealing layer 282 fills portions of the trenches 218, leaving remaining portions of the trenches 218 as portions of the air gap 280. In some embodiments, the sealing layer 282 covers the spacer layers 215 wrapping around the fins 204, the dielectric fins 211, and the dielectric helmets 214, therefore the air gap 280 is enclosed by the sealing layer 282 only and without contacting the spacer layer 215 and the isolation features 208 in the trenches 218. In the present embodiments, the sealing layer 282 shared a common surface with the isolation feature 208, where the shared common surface carries the width $w_2$. In the present embodiments, the method and operation parameters of the process 2402 used in the embodiments depicted in FIG. 24D-4 is the same as or similar to that used in the embodiments depicted in FIG. 24B-3.

It is noted that embodiments depicted in FIGS. 24B-1 to 24B-3 and FIGS. 24D-1 to 24D-4 are mere examples and are not intended to be limiting. For example, the method and parameters of the process 2402 used in the embodiments depicted in FIG. 24B-1 may be different from that utilized in the embodiments depicted in FIG. 24D-1. In other words, the deposition of the sealing layer 282 in the trenches 281 and the trenches 218 can be controlled separately through controlling the method and parameters of the process 2402, therefore any of the embodiments selected from FIG. 24B-1 to 24B-3 can be matched with any of the embodiments selected from FIGS. 24D-1 to 24D-4.

Thereafter, at operation 138, the method 100 performs additional processing steps to the device 200. For example, the method 100 may form a dielectric layer 284 over the sealing layer 282 as depicted in FIGS. 25 and 25A-25D. In the present embodiments, the dielectric layer 284 includes SiN, $SiO_2$, and $Al_2O_3$. In some embodiments, the dielectric layer 284 may include the same material as that of the sealing layer 282. The dielectric layer 284 may be formed by any suitable method, such as CVD, ALD, PVD, and/or other suitable processes. In some embodiments, the dielectric layer 284 may be formed using the same method as that of the sealing layer 282 but with different process parameters. For example, the dielectric layer 284 may be formed at a lower rate compared to that of the sealing layer 282. The dielectric layer serves as a protection layer for the sealing layer 282 in the subsequent processes (e.g., CMP) to keep the integrity of the air gap 280.

The method 100 may subsequently form S/D contact 290 over the S/D features 224 as depicted in FIGS. 26 and 26A-26D. The S/D contact 290 may include any suitable conductive material, such as Co, W, Ru, Cu, Al, Ti, Ni, Au, Pt, Pd, and/or other suitable conductive materials. The method 100 may form an S/D contact opening (or trench) in the ILD layer 242 via a series of patterning and etching processes. For example, the dielectric layer 284 and the sealing layer 282 are patterned using a patterned photoresist mask (not shown), the patterned dielectric layer 284 and the sealing layer 282 are used as masks to pattern the underlying ILD layer 242 to expose the S/D feature 224 in a contact opening. A conductive material is subsequently deposit in the S/D contact opening using any suitable method, such as CVD, ALD, PVD, plating, and/or other suitable processes. In some embodiments, a silicide layer 292 is formed between the S/D features 224 and the S/D contact 290. The silicide layer 292 may include nickel silicide, cobalt silicide, tungsten silicide, tantalum silicide, titanium silicide, platinum silicide, erbium silicide, palladium silicide, other suitable silicide, or combinations thereof. The silicide layer 292 may be formed over the S/D feature 224 by a series of deposition, thermal, and etching processes.

The additional fabrication steps of the operation 138 to the device 200 may also include forming a multi-layer interconnect (MLI) structure (not depicted) thereover. The MLI may include various interconnect features, such as vias and conductive lines, disposed in dielectric layers, such as ESLs and ILD layers. In some embodiments, the vias are vertical interconnect features configured to interconnect a device-level contact, such as a gate contact (not depicted), a conductive line, or interconnect different conductive lines, which are horizontal interconnect features. The ESLs and the ILD layers of the MLI may have substantially the same compositions as those discussed above with respect to the CESL 240 and the ILD layer 242, respectively. The vias and the conductive lines may each include any suitable conductive material, such as Co, W, Ru, Cu, Al, Ti, Ni, Au, Pt, Pd, a metal silicide, other suitable conductive materials, or combinations thereof, and be formed by a series of patterning and deposition processes. Additionally, each via and conductive line may additionally include a barrier layer that comprises TiN and/or TaN.

Figure 27:
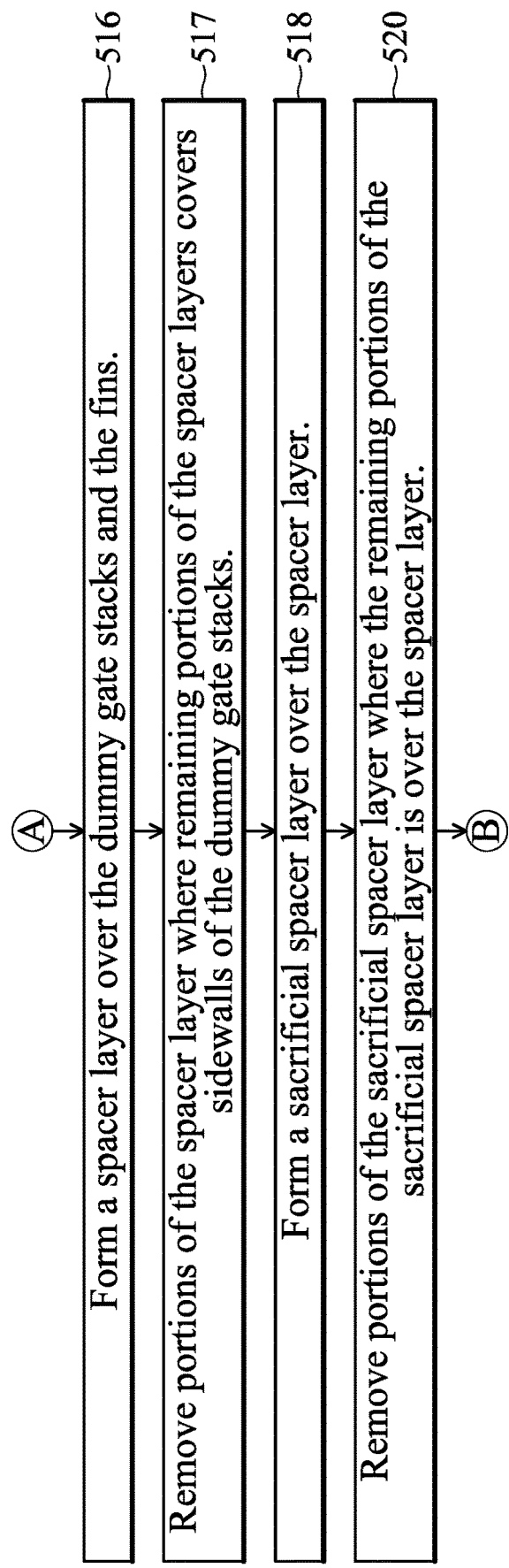
Figure 28A:
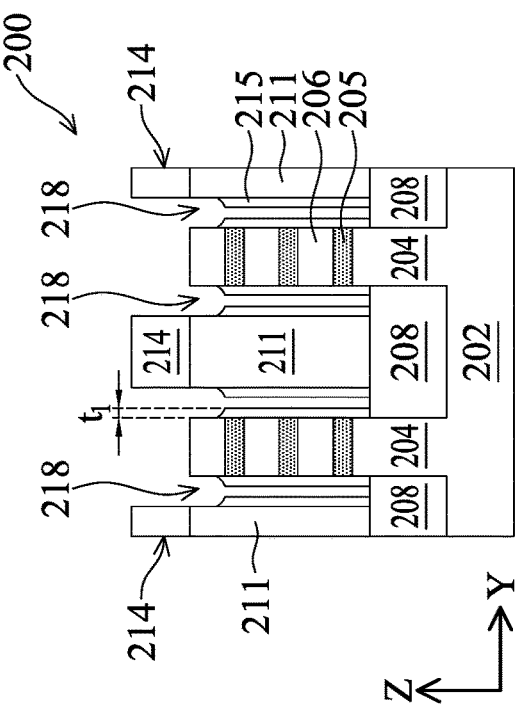
Figure 28C:
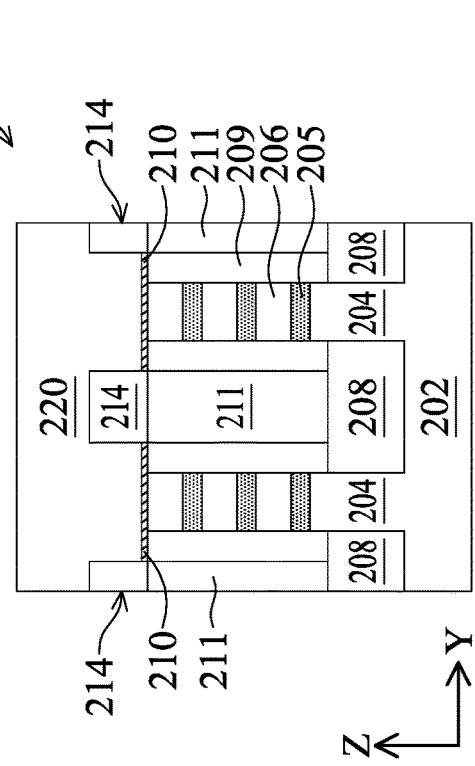
Figure 28:
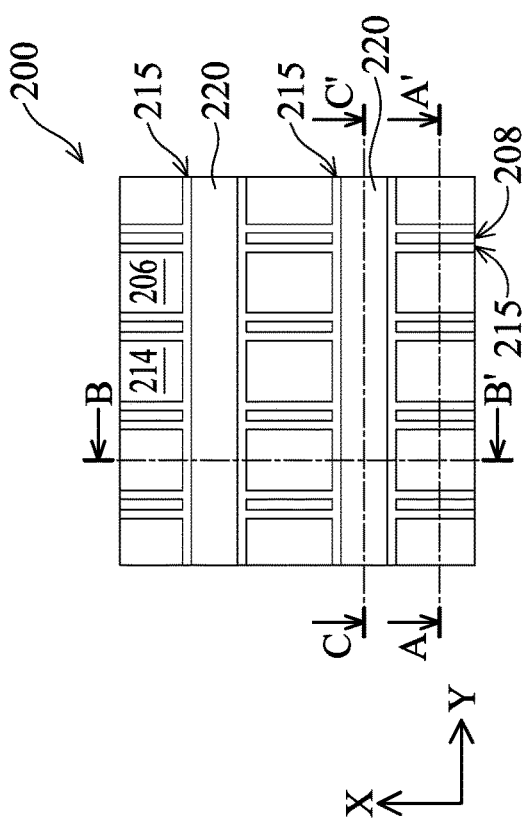
Figure 28B:
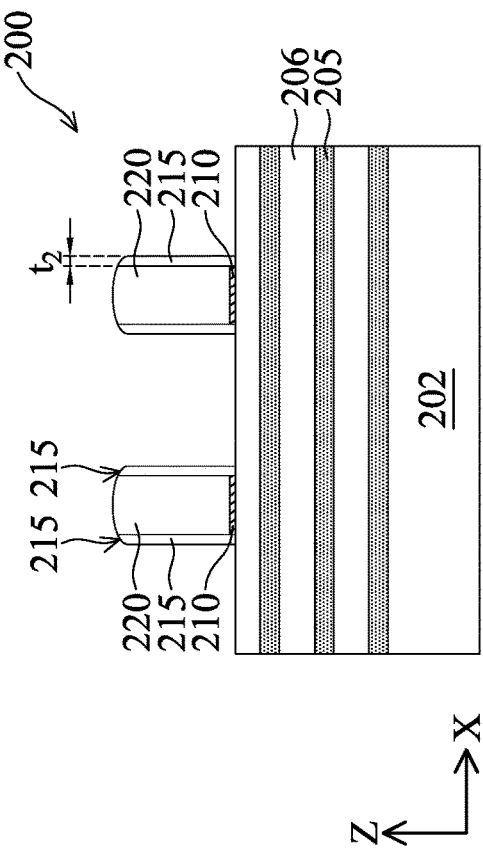

Now referring to FIG. 27, after removing portions of the cladding layers between the dummy gate stacks at operation 114 as depicted in FIG. 1A, instead of proceeding to the operation 116-120 to form the spacer layers 215 and the sacrificial spacer layer 217 from point A and point B, the method 100 depicted in FIG. 27 forms the spacer layers 215 and the sacrificial spacer layer 217 from point A and point B by alternative operations 516-520. The operations 116-120 forms the spacer layer 215, subsequently forms the sacrificial spacer layer 217, and then removing portions of the spacer layer 215 and portions of the sacrificial spacer layer 217 together; while the operation 516-520, as explained in detail below, forms the spacer layer 215, followed by removing portions of the spacer layer 215, and subsequently forms the sacrificial spacer layer 217 and removing portions of the sacrificial spacer layer 217.

At operation 516, similar to the operation 116, the method 100 forms a spacer layer 215 over the dummy gate stacks and the fins. The operation 516 may use a method the same as or similar to that used in the operation 120. Subsequently, the method 100 removes portions of the spacer layer 215 to expose the dummy gate stack 220, the fins 204, and the dielectric helmet 214 at operation 517 as shown in FIGS. 28 and 28A-28C. Remaining portions of the spacer layer 215 are over sidewalls of dummy gate stacks 220, the fins 204, and the dielectric fins 211. In the present embodiments, operation 517 removes the portion of the spacer layer 215 over the isolation feature 208, thereby exposing the isolation feature 208 in the trenches 218. In the present embodiments, the thickness $t_1$ is the same as, or substantially the same as, the thickness $t_2$.

Figure 30A:
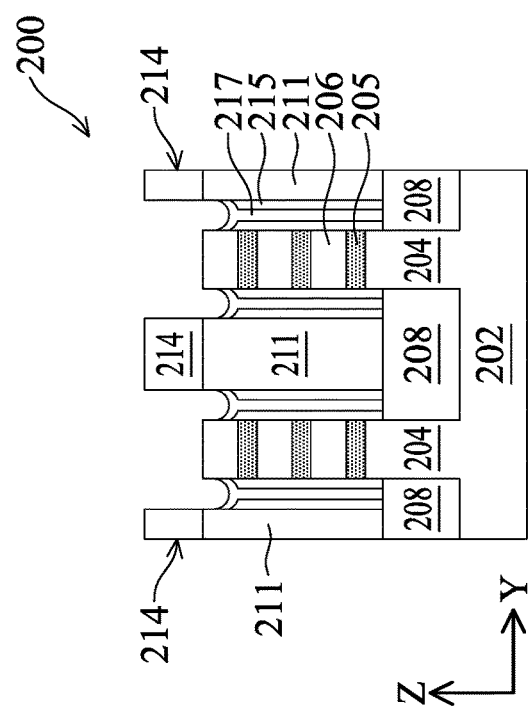
Figure 30C:
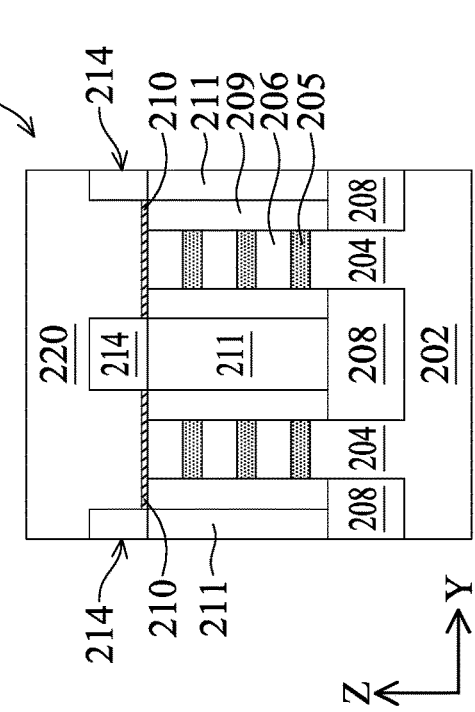
Figure 30:
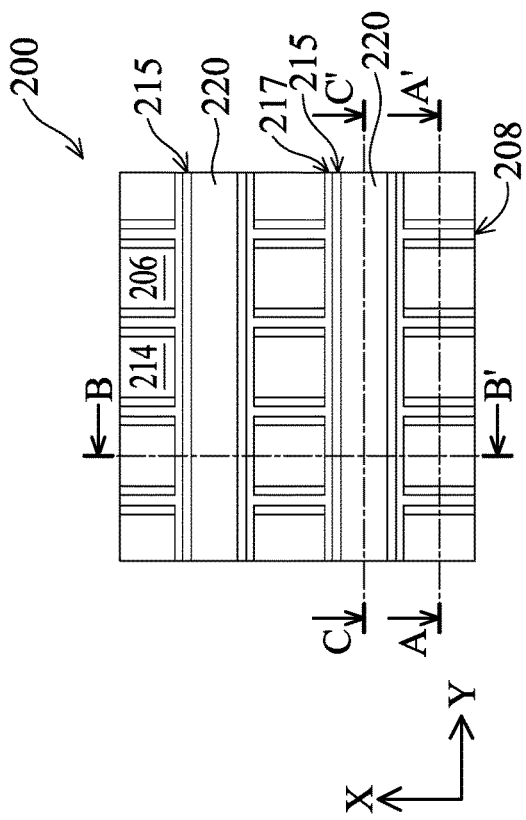
Figure 30B:
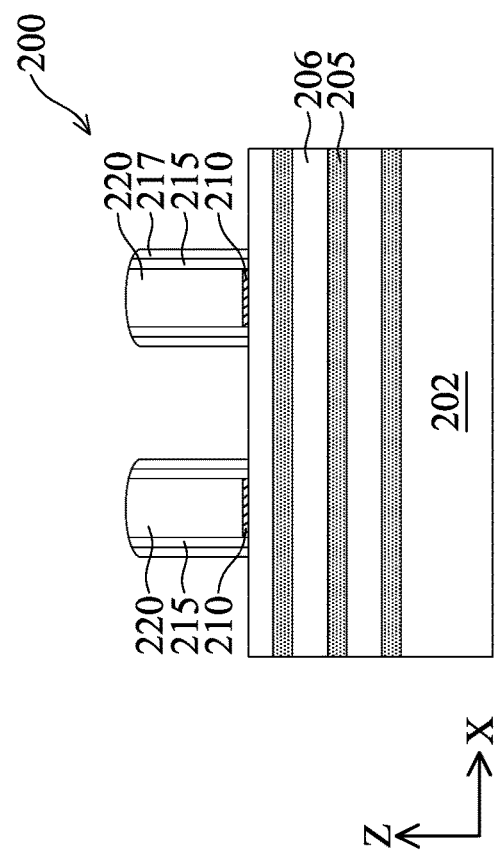

Referring to FIGS. 29 and 29A-29D, the method 100 forms the sacrificial spacer layer 217 over the spacer layer 215 and the exposed dummy gate stacks 220 at the operation 518, the exposed fins 204, and the exposed dielectric helmets 214. The operation 518 utilized methods that is the same as or similar to these utilized in the operation 118 explained in detail above. Subsequently, the method 100 removes portions of the sacrificial spacer layer 217 over the dummy gate stacks 220, the fins 204, and the dielectric helmets 214 at operation 520, such that remaining portions of the sacrificial spacer layer 217 are over the spacer layers 215 as depicted in FIGS. 30 and 30A-30D. In the present embodiments, the sacrificial spacer layer 217 contacts the isolation feature 208 as depicted in FIG. 30A and the fins 204 as depicted in FIG. 30B.

Figure 31:
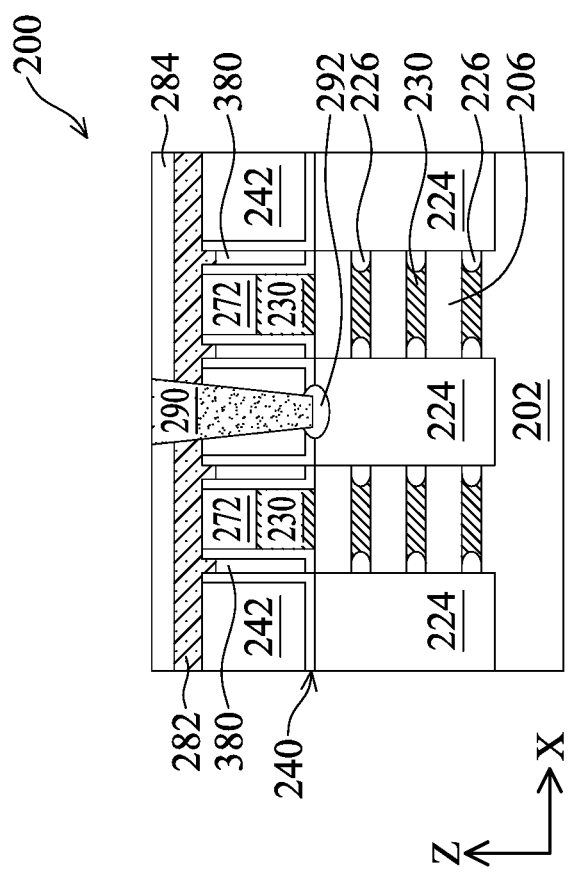

Thereafter, the method 100 as depicted in FIG. 27 proceed from point B to the operation 122 as shown in FIG. 1B and follow the same steps thereafter as shown in FIG. 1B. The alternative operations of 516-520 depicted in FIG. 27 forms an air gap 380 similar to but different from the air gap 280 due to the differences process flow. For example, the air gap 380 is enclosed by the spacer layer 215, the fins 204, the CESL 240, and the sealing layer 282 as depicted in FIG. 31. Specifically, the air gap 380 contacts the fins 204.

Figure 32:
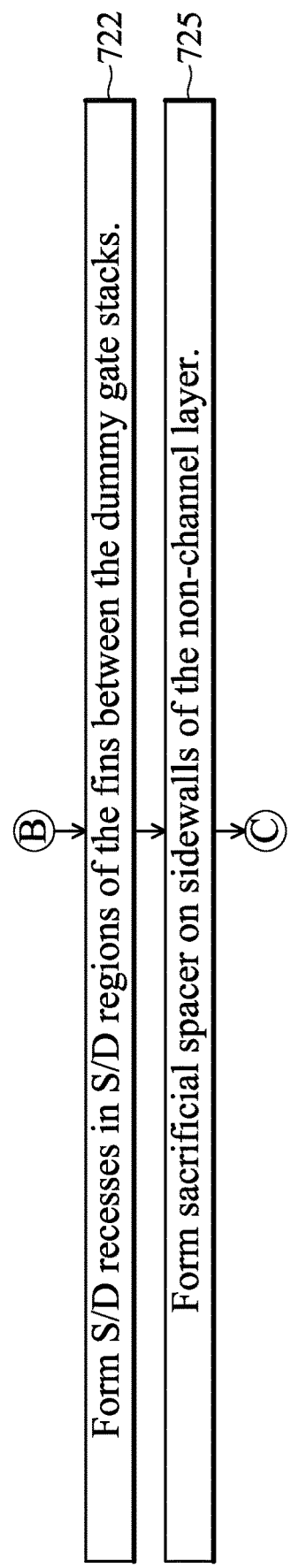

Now referring to FIG. 32, instead of proceeding to the operations 122 and 124 between point B and point C as shown in FIG. 1B, the method 100 forms the S/D recesses 221 and the sacrificial spacer layer 217 by alternative operations of 722 and 725 as shown in FIG. 32. At operation 722, the method 100 forms the S/D recesses 221 in the S/D regions of the fins 204 as depicted in FIG. 33 by a method the same as or similar to that used in the operation 122. The method 100 then forms inner spacer recesses 325 by a method the same as or similar to the process explained with respect to FIGS. 16 and 16A-16D. The inner spacer recesses 325 each has a width $w_3$, where $w_3$ is about 1 to about 1.5 times of the sum of the thickness $t_2$ and the thickness $t_3$. As depicted in FIG. 34, the method 100 then fills the inner spacer recesses 325 with the sacrificial spacer layer 217 at operation 725 by a method similar to or the same as that explained in detail with respect to the operation 124.

Figure 37:
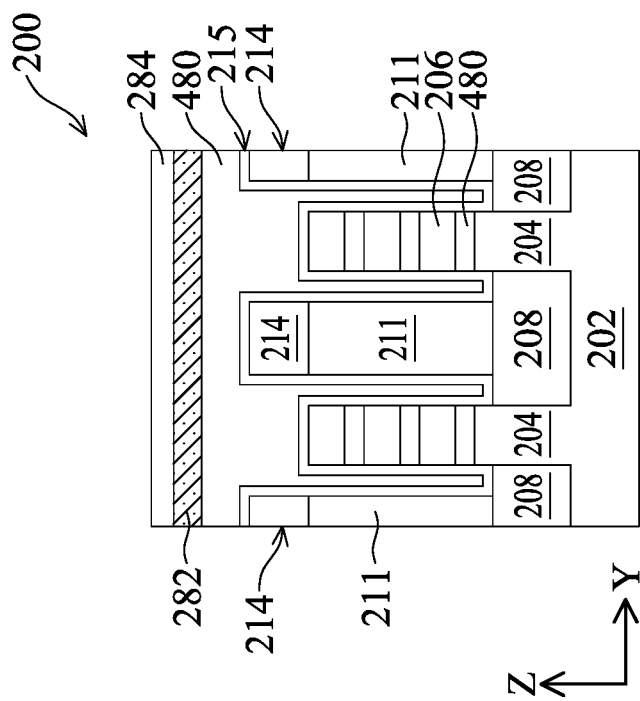
Figure 36:
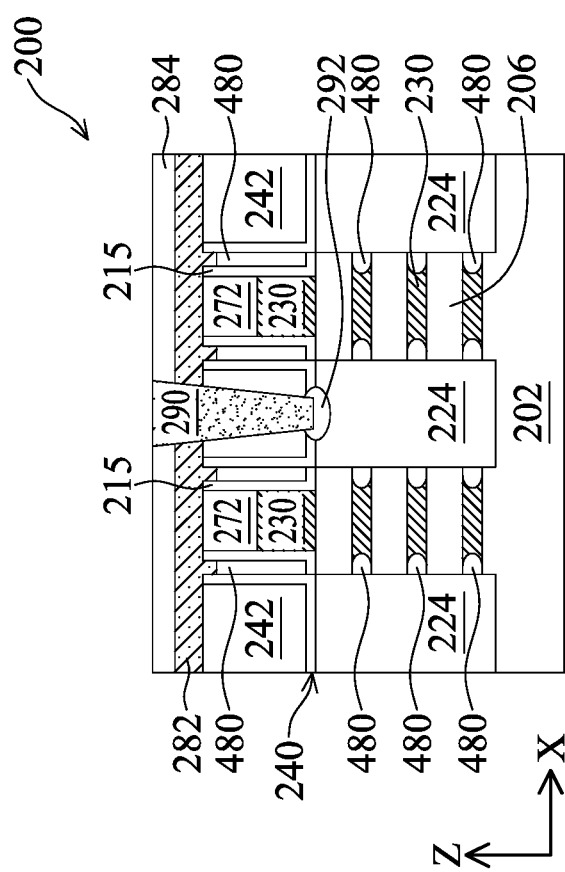

Thereafter, referring to FIG. 35, the method 100 proceeds to the operation 126 of FIG. 1B from point C, where the method 100 forms S/D features 224 in the S/D recesses 221 adjacent to the sacrificial spacer layer 217 in the S/D recesses 221. In the present embodiments, the sacrificial spacer layer 217 in the S/D recesses 221 contact the S/D features 224, the channel layers 206, and the non-channel layers 205. The sacrificial spacer layer 217 in the S/D recesses is later removed together with the sacrificial spacer layer 217 over sidewalls of the dummy gate stacks 220 in operation 134, thereby forming air gap 480 as depicted in FIGS. 36 and 37. The air gap 480 is along the dummy gate stacks and wraps around the fins 204, the dielectric fins 211, and the dielectric helmets 214. In the present embodiments, the air gap 480 wraps around and directly contact each of the channel layers 206. The air gap 480 fills the inner spacer recesses 325 and contacts the portions of the metal gate stack 230 disposed between the channel layers 206 and the S/D features 224 as depicted in FIGS. 36 and 37. The portions of the air gap 480 in the inner spacer recesses 325 further reduce the parasitic capacitance of the device 200.

Figure 38:
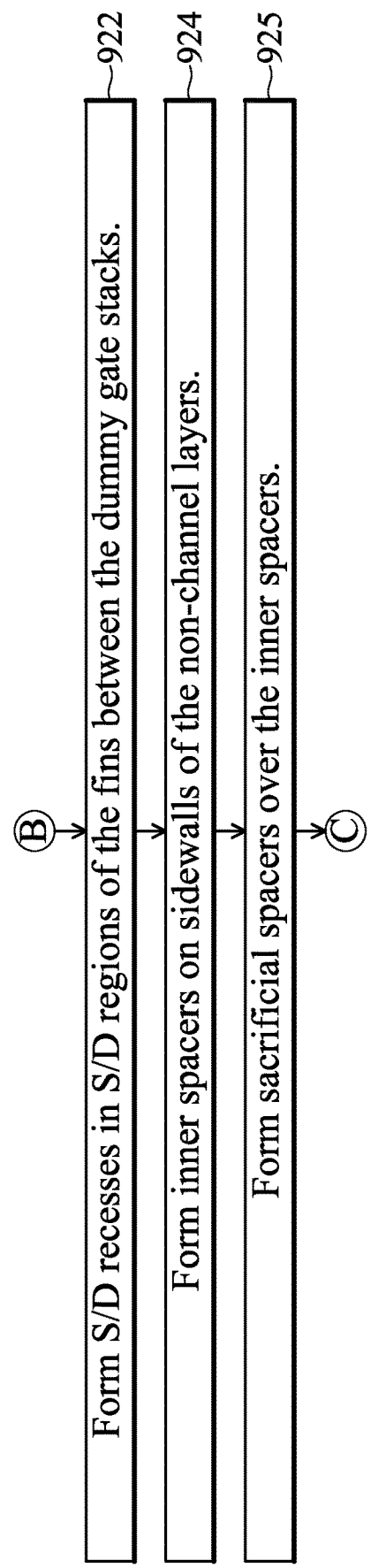
Figure 39:
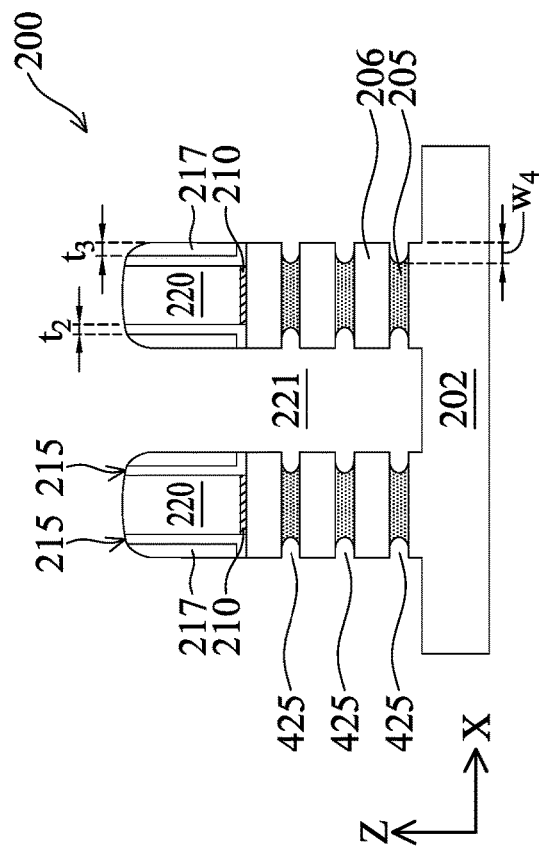

Now referring to FIG. 38, instead of proceeding to the operation 122-124 between point B and point C as shown in FIG. 1B, the method 100 alternatively proceed to the operations 922-925 as shown in FIG. 38. At operation 922, referring to FIG. 39, the method 100 forms S/D recesses 221 by a method similar to or the same as that explained in detail with respect to FIG. 16B. The method 100 then forms inner spacer recesses 425 in the S/D recesses 221 by a method similar to or the same as that explained in detail with respect to the operation 124. In the present embodiments, the S/D recesses 425 has a width $w_4$ that is wider than the width $w_3$. In some examples, the width $w_4$ is about 1.0 to about 2 times greater than the sum of the thickness $t_2$ and $t_3$.

Figure 40:
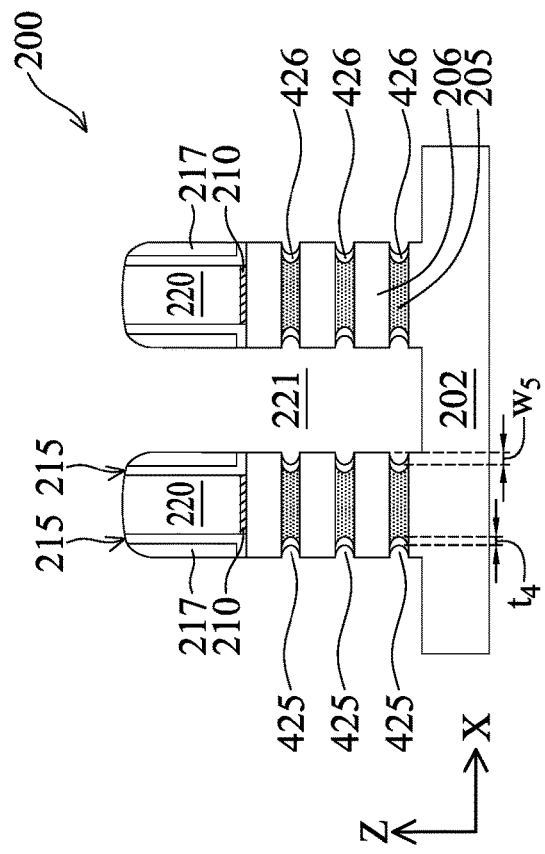

Thereafter, referring to FIG. 40, the method 100 proceed to operation 924 to form inner spacers 426 in the inner spacer recesses 425, thereby filling portions of the inner spacer recesses 425. The method and materials utilized in the operation 924 is the same as or similar to the forming of the inner spacers 226 explained in detail above with respect to the FIGS. 16 and 16A-16D. In the present embodiments, a thickness $t_4$ of the inner spacer layer is about 0.5 to about 1.0 times greater than the sum of the thickness $t_2$ and $t_3$. Remaining portions of the inner spacer recesses has a thickness $w_5$ about 1.0 to about 1.5 times of the sum of the thickness $t_2$ and $t_3$.

Figure 41:
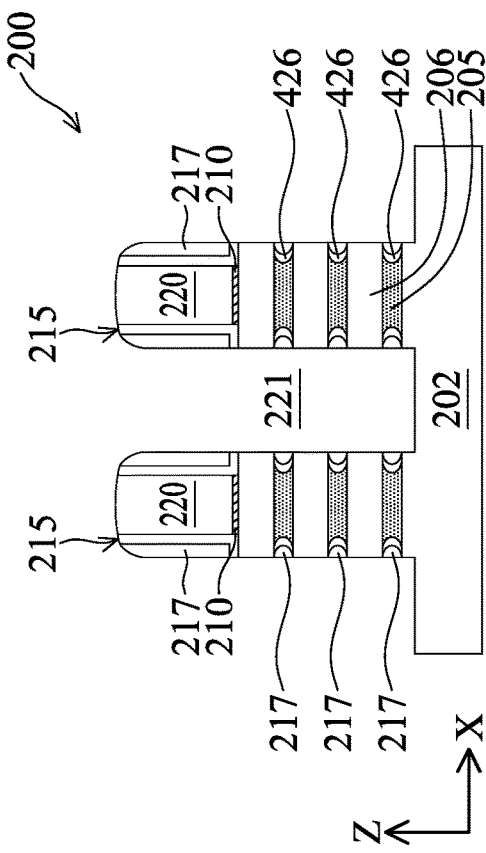
Figure 42:
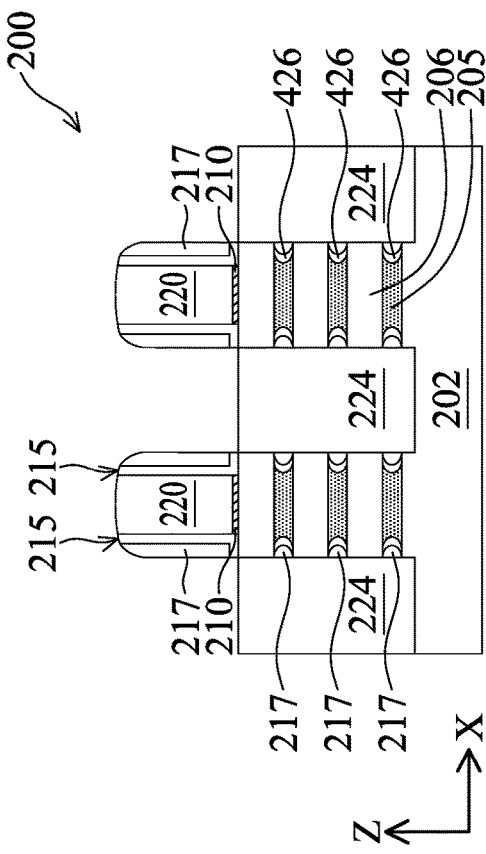

Referring to FIG. 41, the method 100 then proceed to operation 925 to form sacrificial spacer layer 217 in the remaining portions of the inner spacer recesses 425. Thereafter, the method 100 proceed to the operation 126 of FIG. 1B from point C to form S/D features 224, where the S/D features 224 contact the sacrificial spacer layer 217 disposed in the inner spacer recesses 425 as shown in FIG. 42. The sacrificial spacer layer 217 is later removed at operation 134, thereby forming air gaps 580 as shown in FIGS. 43 and 44. In the present embodiments, the air gap 580 is along the metal gate stack 230 and wraps around the fins 204, the dielectric fins 211, and the dielectric helmets 214. In addition, the air gap 580 extends to and connect with the inner spacer recesses 425, thereby wrapping around and contact each of the channel layers 206. In the present embodiments, the portion of the air gap 580 in the inner spacer recesses 425 contact the inner spacers 426 and the S/D feature 224. The portions of the air gap 580 in the inner spacer recesses 425 further reduce the parasitic capacity, while the inner spacers 426 reduce the possibility of shorting between the metal gate stacks 230 and the S/D features 224.

Although not intended to be limiting, one or more embodiments of the present disclosure provide many benefits to a semiconductor device and the formation thereof. For example, embodiments of the present disclosure provide a method of forming an air gap to reduce the parasitic capacitance of the semiconductor device. The air gap is disposed between the CESL and the gate spacer over sidewalls of the dummy gate stacks. The air gap extends to wrap around the fins, the dielectric fins interposing the fins, and the dielectric helmets disposed over the fins. In some embodiments, the air gap extends between the inner spacer and the S/D features. In some embodiments, the inner spacer is omitted, and the air gap extends to the inner spacer recesses instead.

In one aspect, the present disclosure provides a method that includes providing a semiconductor structure including a device fin protruding from a substrate, forming a dummy gate stack over the device fin, forming a first spacer over the device fin and the dummy gate stack, forming a second spacer over the first spacer, where the second spacer is different from the first spacer in composition, forming a dielectric feature adjacent to the second spacer, and replacing the dummy gate stack with a metal gate stack. Thereafter, the method removes the second spacer, thereby forming an air gap between the first spacer and the dielectric feature and wrapping around the device fin. The method then forms a sealing layer over the first spacer and the dielectric feature, thereby sealing the air gap.

In another aspect, the present disclosure provides a method that includes forming a device fin protruding from a substrate, where the device fin includes alternating first semiconductor layers and second semiconductor layers, forming a cladding layer over the substrate and along sidewalls of the device fin, forming a dielectric fin along sidewalls of the cladding layer, forming a dummy gate stack over the device fin, the cladding layer and the dielectric fin, removing a portion of the cladding layer adjacent to a source/drain (S/D) region of the device fin, forming a gate spacer over the dummy gate stack and wraps around the device fin and the dielectric fin, forming a sacrificial spacer over the gate spacer, forming an S/D feature in the device fin, forming an interlayer dielectric (ILD) feature over the S/D feature and adjacent to the gate spacer and the sacrificial spacer, replacing the dummy gate stack and the second semiconductor layers with a metal gate stack, removing the sacrificial spacer to form an air gap, where the air gap is disposed along the gate spacer and between the device fin and the dielectric fin, and forming a sealing layer over the gate spacer and the ILD feature, thereby sealing the air gap.

In yet another aspect, the present disclosure provides a semiconductor structure that includes a semiconductor substrate, a device fin including a stack of semiconductor layers disposed over the semiconductor substrate, a metal gate stack disposed over and interleaved with the stack of semiconductor layers, a gate spacer disposed over a sidewall of the metal gate stack and a sidewall of the device fin, a source/drain (S/D) feature disposed in the device fin and adjacent to the metal gate stack, a dielectric feature over the S/D feature, a sealing layer over the gate spacer and the dielectric feature, and an air gap enclosed by the gate spacer, the dielectric feature, and the sealing layer, where the air gap extends along the gate spacer on the sidewall of the metal gate stack, and where the air gap extends below the metal gate stack and wraps around the device fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   providing a semiconductor structure including a device fin protruding from a substrate;
   forming a dummy gate stack over the device fin;
   forming a first spacer over the device fin and the dummy gate stack;
   forming a second spacer over the first spacer, wherein the second spacer is different from the first spacer in composition;
   forming a dielectric feature adjacent to the second spacer;
   replacing the dummy gate stack with a metal gate stack;
   after the replacing of the dummy gate stack, removing the second spacer and a bottom portion of the first spacer, thereby forming an air gap between the first spacer and the dielectric feature and wrapping around the device fin; and
   depositing a sealing layer of a dielectric material over the first spacer and the dielectric feature, thereby sealing the air gap.

2. The method of claim 1, further comprising:
   prior to the forming of the dummy gate stack, forming cladding layers along sidewalls of the device fin; and
   after the forming of the dummy gate stack and prior to the forming of the first spacer, removing a portion of the cladding layers adjacent to a source/drain (S/D) region of the device fin.

3. The method of claim 2, wherein the sealing layer has a thickness greater than a dimension of the air gap between the first spacer and the dielectric feature.

4. The method of claim 3, wherein the forming of the dielectric feature includes:
   forming a contact etch-stop layer (CESL) over a S/D feature, the first spacer, and the second spacer; and
   forming an interlayer dielectric layer over the CESL.

5. The method of claim 2, further comprising:
   forming a dielectric fin in the cladding layers and parallel to the device fin before the forming of the dummy gate stack,
   wherein the removing of the second spacer and the bottom portion of the first spacer forms the air gap disposed between the device fin and the dielectric fin, and
   wherein the removing of the portion of the cladding layers forms a trench spanning between the device fin and the dielectric fin.

6. The method of claim 5, further comprising:
   prior to the forming of the dummy gate stack, forming a dielectric helmet over the dielectric fin, wherein the dielectric helmet is patterned to truncate the metal gate stack, and wherein the air gap is disposed over the dielectric helmet.

7. The method of claim 1, wherein the forming of the first spacer and the second spacer includes:
   conformally depositing a first spacer material over the substrate;
   depositing a second spacer material over the first spacer material; and
   anisotropically etching the first spacer material and the second spacer material to leave the first spacer and the second spacer over a sidewall of the dummy gate stack.

8. The method of claim 1, further comprising:
   prior to the forming of the first spacer and the second spacer, forming a lightly doped S/D region in the device fin utilizing the dummy gate stack as a mask,
   performing a chemical-mechanical planarization (CMP) process to the sealing layer, and
   depositing a dielectric protection layer of the dielectric material on the sealing layer,
   wherein the depositing of the sealing layer is at a first rate and the depositing of the dielectric protection layer is at a second rate lower than the first rate.

9. A method, comprising:
   forming a device fin protruding from a substrate, wherein the device fin includes a bottom portion and alternating first semiconductor layers and second semiconductor layers over the bottom portion;
   forming an isolation feature over the substrate and adjacent to the bottom portion of the device fin;
   forming a cladding layer over the isolation feature and along sidewalls of the alternating first semiconductor layers and second semiconductor layers;
   forming a dielectric fin along sidewalls of the cladding layer and over a top surface of the isolation feature;
   removing a first portion of the cladding layer;
   after removing the first portion of the cladding layer, forming a dummy gate stack over the device fin, the cladding layer and the dielectric fin;
   removing a second portion of the cladding layer adjacent to a source/drain (S/D) region of the device fin, thereby forming a trench spanning between the device fin and the dielectric fin;
   forming a gate spacer over the dummy gate stack and wraps around the device fin and the dielectric fin;
   forming a sacrificial spacer over the gate spacer;

forming an S/D feature in the device fin;
forming an interlayer dielectric (ILD) feature over the S/D feature and adjacent to the gate spacer and the sacrificial spacer;
replacing the dummy gate stack and the second semiconductor layers with a metal gate stack;
removing the sacrificial spacer to form an air gap, wherein the air gap is disposed along the gate spacer and between the device fin and the dielectric fin; and
depositing a sealing layer over the gate spacer and the ILD feature, thereby sealing the air gap.

10. The method of claim 9, wherein the forming of the S/D feature includes:
recessing a portion of the device fin in the S/D region of the device fin to form an S/D recess;
recessing the second semiconductor layers to form inner spacer recesses between the first semiconductor layers;
forming inner spacers in the inner spacer recesses; and
forming the S/D feature in the S/D recess and adjacent to the inner spacers,
wherein after the forming of the dummy gate stack, a top surface of the dielectric fin is above a top surface of the first semiconductor layers, and wherein the cladding layer extends from the dielectric fin to the first semiconductor layers.

11. The method of claim 10, further comprising forming the sacrificial spacer in the inner spacer recesses and over the inner spacers prior to the forming of the S/D feature; and
removing the sacrificial spacer in the inner spacer recesses and over the inner spacers after the replacing of the dummy gate stack, thereby forming inner air gaps between the inner spacers and the S/D feature, wherein the inner air gaps connect with the air gap.

12. The method of claim 9, wherein the forming of the S/D feature includes:
recessing a portion of the device fin in the S/D region of the device fin to form an S/D recess;
recessing the second semiconductor layers to form inner spacer recesses between the first semiconductor layers;
forming the sacrificial spacer in the inner spacer recesses;
forming the S/D feature in the S/D recess and adjacent to the sacrificial spacer in the inner spacer recesses; and
removing the sacrificial spacer in the inner spacer recesses after the replacing of the dummy gate stack.

13. The method of claim 9, further comprising:
forming a dielectric helmet over the dielectric fin; and
patterning the dielectric helmet, wherein the patterned dielectric helmet is disposed at an end of the metal gate stack, and wherein the air gap is disposed between the patterned dielectric helmet and the device fin.

14. A method, comprising:
forming a device fin protruding from a substrate, wherein the device fin includes a bottom portion and alternating first semiconductor layers and second semiconductor layers over the bottom portion;
forming a cladding layer over the substrate and along sidewalls of the device fin;
forming a dielectric fin along sidewalls of the cladding layer;
forming a dummy gate stack over the device fin, the cladding layer and the dielectric fin, wherein after the forming of the dummy gate stack, a top surface of the dielectric fin is above a top surface of the first semiconductor layers, and wherein after the forming of the dummy gate stack the cladding layer laterally extends from the dielectric fin to the first semiconductor layers;
forming a gate spacer over the dummy gate stack and wraps around the device fin and the dielectric fin;
forming a sacrificial spacer over the gate spacer;
recessing a portion of the device fin in a S/D region of the device fin to form an S/D recess;
laterally recessing the second semiconductor layers to form inner spacer recesses between the first semiconductor layers;
forming inner spacers in the inner spacer recesses;
forming an S/D feature in the S/D recess;
forming an interlayer dielectric (ILD) feature over the S/D feature and adjacent to the gate spacer and the sacrificial spacer;
replacing the dummy gate stack and the second semiconductor layers with a metal gate stack; and
removing the sacrificial spacer to form an air gap, wherein the air gap is disposed along the gate spacer and between the device fin and the dielectric fin.

15. The method of claim 14, further comprising:
depositing a sealing layer over the gate spacer and the ILD feature, thereby sealing the air gap;
performing a first chemical-mechanical planarization (CMP) process to the sealing layer;
depositing a dielectric protection layer directly contacting the sealing layer; and
performing a second CMP process.

16. The method of claim 14, wherein the forming of the sacrificial spacer further includes forming the sacrificial spacer in the inner spacer recesses and over the inner spacers prior to the forming of the S/D feature.

17. The method of claim 16, further comprising removing the sacrificial spacer in the inner spacer recesses and over the inner spacers after the replacing of the dummy gate stack, thereby forming inner air gaps between the inner spacers and the S/D feature, wherein the inner air gaps connect with the air gap.

18. The method of claim 14, further comprising:
forming a dielectric helmet over the dielectric fin; and
patterning the dielectric helmet, wherein the patterned dielectric helmet is disposed at an end of the metal gate stack, and wherein the air gap is disposed between the patterned dielectric helmet and the device fin.

19. The method of claim 14, further comprising:
after the forming of the dummy gate stack, removing a portion of the cladding layers adjacent to the S/D region of the device fin, thereby forming a trench spanning between the device fin and the dielectric fin.

20. The method of claim 9, further comprising:
performing a first chemical-mechanical planarization (CMP) process to the sealing layer;
depositing a dielectric protection layer directly contacting the sealing layer; and
performing a second CMP process,
wherein the depositing of the sealing layer is at a first rate and the depositing of the dielectric protection layer is at a second rate lower than the first rate, and
wherein the sealing layer extends into the air gap.

* * * * *